US012720818B2

(12) United States Patent
Hu et al.

(10) Patent No.: US 12,720,818 B2
(45) Date of Patent: Aug. 25, 2026

(54) BONDING AND ISOLATION TECHNIQUES FOR STACKED TRANSISTOR STRUCTURES

(71) Applicant: Taiwan Semiconductor Manufacturing Company, Ltd., Hsin-Chu (TW)

(72) Inventors: Kuan-Kan Hu, Hsinchu (TW); Han-De Chen, Hsinchu City (TW); Ku-Feng Yang, Hsinchu County (TW); Chen-Fong Tsai, Hsinchu City (TW); Chi On Chui, Hsinchu City (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 438 days.

(21) Appl. No.: 18/519,737

(22) Filed: Nov. 27, 2023

(65) Prior Publication Data

US 2024/0282815 A1 Aug. 22, 2024

Related U.S. Application Data

(60) Provisional application No. 63/485,757, filed on Feb. 17, 2023.

(51) Int. Cl.

*H10D 62/10* (2025.01)
*H10D 30/01* (2025.01)
*H10D 30/43* (2025.01)
*H10D 30/67* (2025.01)
*H10D 64/01* (2025.01)

(Continued)

(52) U.S. Cl.

CPC ......... *H10D 62/116* (2025.01); *H10D 30/014* (2025.01); *H10D 30/43* (2025.01);

(Continued)

(58) Field of Classification Search

CPC ............... H10D 62/121; H10D 64/017; H10D 30/6735; H10D 30/143; H10D 84/0188;

(Continued)

(56) References Cited

U.S. PATENT DOCUMENTS 10,090,193 B1 * 10/2018 Chanemougame .... H10D 64/01
2020/0105751 A1 * 4/2020 Dewey ................ H10D 62/235

(Continued)

FOREIGN PATENT DOCUMENTS

TW 202303704 A 1/2023
TW 202306090 A 2/2023

*Primary Examiner* — Alonzo Chambliss
(74) *Attorney, Agent, or Firm* — HAYNES AND BOONE, LLP

(57) ABSTRACT

Bonding and isolation techniques for stacked device structures are disclosed herein. An exemplary method includes forming a first insulation layer on a first device component, forming a second insulation layer on a second device component, and bonding the first insulation layer and the second insulation layer. The bonding provides a stacked structure that includes the first device component over the second device component, and an isolation structure (formed by the first insulation layer bonded to the second insulation layer) therebetween. The isolation structure includes a first portion having a first composition and a second portion having a second composition different than the first composition. The method further includes processing the stacked structure to form a first device disposed over a second device, where the isolation structure separates the first device and the second device. The first insulation layer and the second insulation layer may include the same or different materials.

20 Claims, 42 Drawing Sheets

(51) Int. Cl.
*H10D 84/01* (2026.01)
*H10D 84/03* (2025.01)
*H10D 84/85* (2025.01)
*H10W 90/00* (2026.01)

(52) U.S. Cl.
CPC ..... *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0188* (2025.01); *H10D 84/038* (2025.01); *H10D 84/85* (2025.01); *H10W 90/00* (2026.01)

(58) Field of Classification Search
CPC ............. H10D 84/0167; H10D 84/017; H10D 84/038; H10W 90/00
See application file for complete search history.

(56) References Cited

U.S. PATENT DOCUMENTS

2021/0366907 A1 11/2021 Liao
2022/0013523 A1 1/2022 Cheng
2022/0037528 A1 2/2022 Chuang
2022/0123023 A1 4/2022 Peng et al.
2022/0157936 A1* 5/2022 Khaderbad ............ H10D 30/43
2022/0216340 A1 7/2022 Lin
2022/0344376 A1 10/2022 Lilak et al.
2022/0352032 A1 11/2022 Lilak et al.
2023/0090092 A1 3/2023 Lilak et al.
2023/0101760 A1 3/2023 O'Brien et al.
2023/0170352 A1 6/2023 Boa et al.
2024/0021586 A1 1/2024 Li et al.

* cited by examiner

90 { 90U { 80U, 78U }; 90L { 80L, 78L } }

18 { 72L, 70L }

16A { 17A, 18 }

10A

90 { 90U { 80U, 78U }; 90L { 80L, 78L } }

16B { 17B 12U
16A
12L
26
315
326
310U
320U
320U'
320L
320L
310L
14'
14
X
Y
Z

16A { 18 { 72L, 70L }; 17A { 325 { 320U, 320U', 320L, 320L } }

12L

90 { 90U { 80U, 78U }, 90L { 80L, 78L } }

18 { 72L, 70L }

16A { 17A, 18 }

10A

12U

90 { 90U { 80U, 78U }; 90L { 80L, 78L } }

16B { 17B

90L { 80L, 78L }

725 { 720U, 720L }

90L { 80L, 78L

17B { 725 { 720U, 720L

90L {80L, 78L}

17B {725 {720U, 720L}

90 { 90U { 80U, 78U }; 90L { 80L, 78L } }

16B { 17B

BONDING AND ISOLATION TECHNIQUES FOR STACKED TRANSISTOR STRUCTURES

This is a non-provisional application of and claims benefit of U.S. Provisional Patent Application Ser. No. 63/485,757, filed Feb. 17, 2023, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, by reducing minimum IC feature size), thereby improving production efficiency and lowering associated costs. However, such scaling has also increased complexity of IC manufacturing processes. Thus, realizing continued advances in IC devices and their performance requires similar advances in IC manufacturing processes and technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
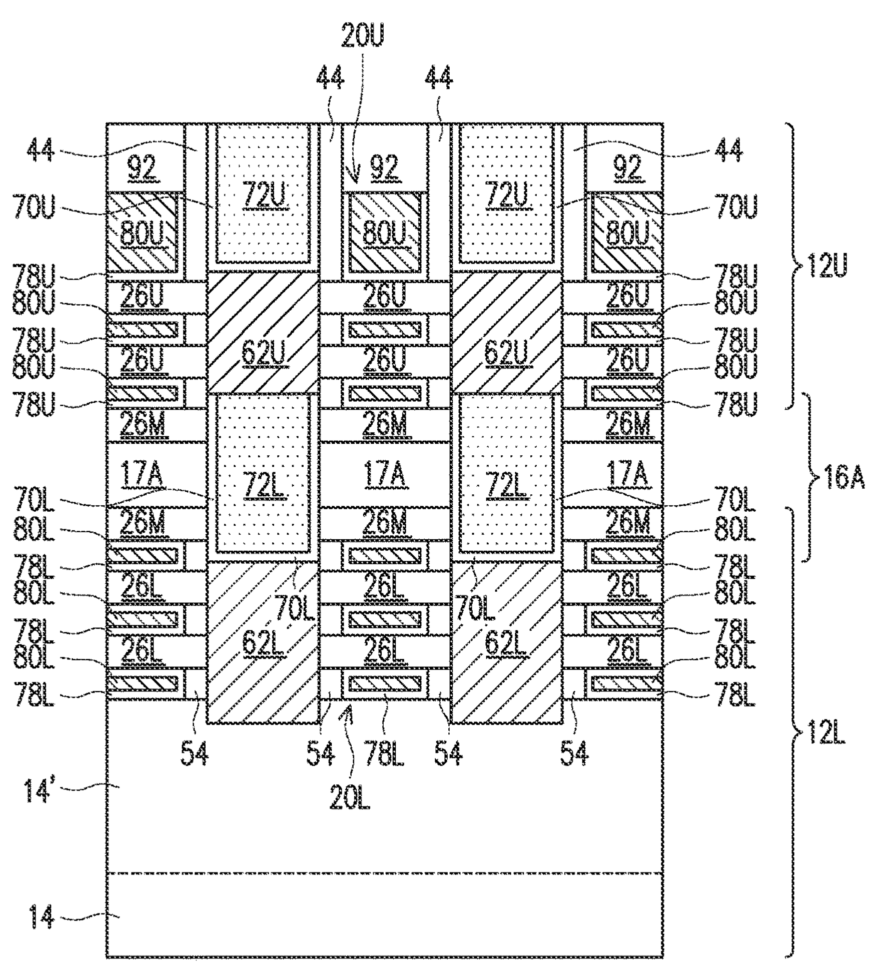
FIG. 1A is a fragmentary cross-sectional view of a stacked device structure, in portion or entirety, according to various aspects of the present disclosure.
Figure 1A:
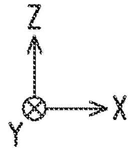

The present disclosure relates generally to bonding and isolation techniques for stacked device structures, such as a transistor stack having an n-type field effect transistor (NFET) and a p-type field effect transistor (PFET).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over." "below," "beneath," "up," "down," "top," "bottom," etc. as well as derivatives thereof (e.g., "horizontally." "downwardly." "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" may encompass a dimension range from 4.5 nm to 5.5 nm where manufacturing tolerances associated with depositing the material layer are known to be +/−10% by one of ordinary skill in the art.

Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Stacked transistor structures can provide needed density reduction for advanced integrated circuit (IC) technology nodes, particularly as they advance to 3 nm (N3) and below. A stacked transistor structure vertically stacks a first transistor (i.e., an upper/top transistor) over a second transistor (i.e., a lower/bottom transistor). The stacked transistor structure provides a complementary field effect transistor (CFET) when the first transistor and the second transistor have opposite conductivity types (i.e., an n-type transistor and a p-type transistor). The first transistor and the second transistor are separated by an insulation layer, which is typically formed by replacing a sacrificial layer of a semiconductor layer stack with a dielectric layer during processing of the semiconductor layer stack to form the first transistor and the second transistor. For example, a semiconductor layer stack may include a sacrificial layer between a first set of semiconductor layers and a second set of semiconductor layers, where the first set of semiconductor layers is processed to form the first transistor and the second set of semiconductor layers is processed to form the second transistor. After partially processing the semiconductor layer stack, forming the insulation layer may include removing the sacrificial layer to form a gap between the first set of semiconductor layers and the second set of semiconductor layers, and filling the gap with an insulation material, such as a dielectric material.

For advanced IC technology nodes, because the sacrificial layer is designed very thin, the resulting gap for filling is very small. Sometimes, it is difficult to adequately remove the sacrificial layer and/or to fill the gap with the dielectric material to form the insulation/dielectric layer. For example, seams may form within the dielectric layer during filling of the gap, such as when the dielectric material pinches off before filling portions of the gap. Seams in the insulation layer may degrade reliability and/or performance of the stacked transistor structure. Also, as the semiconductor layer stack is processed after forming the insulation layer, etchant may enter the seams and undesirably remove the insulation layer and even expose the first set of semiconductor layers, the second set of semiconductor layers, the first transistor, the second transistor, or a combination thereof to the etchant. Further, to ensure selective removal of the sacrificial layer without damaging the first set of semiconductor layers and/or the second set of semiconductor layers (which are processed to provide first channels and second channels, respectively, of the first transistor and the second transistor), the first set of semiconductor layers and the second set of semiconductor layers are typically confined to the same materials, resulting in the first transistor and the second transistor having homogenous channel materials.

The present disclosure provides bonding and isolation techniques for stacked transistor structures that provide an insulation layer between a first transistor and a second transistor without a gap fill step. For example, the disclosed bonding and isolation techniques eliminate the need to replace a sacrificial layer with a dielectric layer, which may eliminate seam formation in the insulation layer and reduce damage to the insulation layer and/or other device features that may occur via seams during processing. Further, because the disclosed bonding and isolation techniques do not implement a sacrificial layer that is selectively removed relative to the first set of semiconductor layers and the second set of semiconductor layers, the disclosed bonding and isolation techniques relax constraints on materials for the first set of semiconductor layers and the second set of semiconductor layers and enable heterogeneous channel materials (i.e., the first channels of the first transistor and the second channels of the second transistor may be formed from different materials). The disclosed bonding techniques also enable bonding with ultrathin bonding layers, such as those having a thickness that is less than about 10 nm. Details of the disclosed bonding and isolation techniques for stacked device structures, such as stacked transistor structures, are described herein. Different embodiments may have different advantages, and no particular advantage is required of any embodiment.

FIG. 1A is a fragmentary cross-sectional view of a stacked device structure 10A, in portion or entirety, according to various aspects of the present disclosure. Stacked device structure 10A is fabricated monolithically, and thus may be referred to as a monolithic stacked device structure. Stacked device structure 10A includes a device stack having an upper device 12U vertically stacked over a lower device 12L, a substrate 14, and an isolation structure 16A between and separating device 12U and device 12L. Isolation structure 16A includes isolation structures 17A and insolation structures 18. In some embodiments, device 12U and device 12L are stacked back-to-front. For example, as described further below, isolation structure 16A may bond and/or attach a backside of device 12U to a frontside of device 12L, and isolation structure 16A may be referred to as a bonding layer/structure. FIG. 1A has been simplified for the sake of clarity to better understand the inventive concepts of the present disclosure. Additional features may be added in stacked device structure 10A, and some of the features described below may be replaced, modified, or eliminated in other embodiments of stacked device structure 10A.

In FIG. 1A, device 12U and device 12L each include at least one electrically functional device, such as an upper transistor 20U and a lower transistor 20L, respectively. Stacked device structure 10A thus includes a transistor stack having a top transistor (e.g., transistor 20U) and a bottom transistor (e.g., transistor 20L) separated and/or electrically isolated from one another by isolation structure 16A. In some embodiments, transistor 20L and transistor 20U are transistors of an opposite conductivity type. For example, transistor 20L is a p-type transistor, and transistor 20U is an n-type transistor, or vice versa. In such embodiments, transistor 20L and transistor 20U form a CFET. In some embodiments, transistor 20L and transistor 20U are transistors of a same conductivity type. For example, transistor 20L and transistor 20U are both n-type transistors or both p-type transistors.

Device 12U includes various features and/or components, such as semiconductor layers 26U, semiconductor layers 26M, gate spacers 44, inner spacers 54, epitaxial source/drains 62U, a contact etch stop layer (CESL) 70U, an interlayer dielectric (ILD) layer 72U, gate dielectrics 78U and gate electrodes 80U (which collectively form gate stacks 90U), and hard masks 92. Device 12L also includes various features and/or components, such as mesas 14' (e.g., extensions of substrate 14), semiconductor layers 26L, semiconductor layers 26M, substrate isolation structures, inner spacers 54, epitaxial source/drains 62L, a CESL 70L, an ILD layer 72L, and gate dielectrics 78L and gate electrodes 80L (which collectively form gate stacks 90L). A respective gate stack 90U and a respective gate stack 90L are collectively referred to as a gate 90 of stacked device structure 10A, which may be a metal gate or a high-k/metal gate of a respective CFET. Gate stacks 90U are separated from gate stacks 90L by isolation structures 17A and semiconductor layers 26M, and epitaxial source/drains 62U are separated from epitaxial source/drains 62L by isolation structures 18. In stacked device structure 10B, isolation structures 17B may provide electrical isolation of channels and/or gates of stacked devices, and isolation structures 18 may provide electrical isolation of source/drains of stacked devices.

In the depicted embodiment, transistor 20L is a GAA transistor. For example, transistor 20L has two channels provided by semiconductor layers 26L (also referred to as channel layers or channels), which are suspended over substrate 14 and extend between respective source/drains (e.g., epitaxial source/drains 62L). In some embodiments, transistor 20L includes more or less channels (and thus more or less semiconductor layers 26L). Transistor 20L further has gate stack 90L disposed over its semiconductor layers 26L and between its epitaxial source/drains 62L, and inner spacers 54 are disposed between its gate stack 90L and its epitaxial source/drains 62L. Along a gate widthwise direction (e.g., in an X-Z plane), gate stack 90L is over top semiconductor layer 26L, between semiconductor layers 26L, and between bottom semiconductor layer 26L and substrate 14. Along a gate lengthwise direction (e.g., in a Y-Z plane), gate stack 90L wraps around semiconductor layers 26L. During operation of the GAA transistor, current can flow through semiconductor layers 26L and between epitaxial source/drains 62L. Semiconductor layers 26M (also referred to as dummy channel layers or dummy channels) are suspended over substrate 14 and extend between respective isolation structures 18, and isolation structures 17A are disposed between semiconductor layers 26M of device 12L/transistor 20L and semiconductor layers 26M of device 12U/transistor 20U.

In the depicted embodiment, transistor 20U is also a GAA transistor. For example, transistor 20U has two channels provided by semiconductor layers 26U (also referred to as channel layers or channels), which are suspended over substrate 14 and extend between respective source/drains (e.g., epitaxial source/drains 62U). In some embodiments, transistor 20U includes more or less channels/semiconductor layers 26U. Transistor 20U further has gate stack 90U disposed over its semiconductor layers 26U and between its epitaxial source/drains 62U, gate stack 90U disposed between respective gate spacers 44, inner spacers 54 disposed between its gate stack 90U and its epitaxial source/drains 62U, and hard mask 92 disposed over gate stack 90U. Along a gate widthwise direction, gate stack 90U is over top semiconductor layer 26U, between semiconductor layers 26U, and between bottom semiconductor layer 26U and semiconductor layer 26M. Along a gate lengthwise direction, gate stack 90U wraps around semiconductor layers 26U. During operation of the GAA transistor, current can flow through semiconductor layers 26U and between epitaxial source/drains 62U.

Fabricating stacked device structure 10A monolithically provides isolation structure 16A with isolation structures 17A and isolation structures 18 between channel regions and source/drain regions, respectively, of device 12L and device 12U. For example, a respective isolation structure 17A is between a channel region of transistor 20L and a channel region of transistor 20U (e.g., between channels and/or gates thereof), and isolation structures 18 are between source/drain regions of transistor 20L and source/drain regions of transistor 20U. In the depicted embodiment, the respective isolation structure 17A is between semiconductor layers 26M of transistor 20L and transistor 20U, and isolation structures 18 are between epitaxial source/drains 62L of transistor 20L and epitaxial source/drains 62U of transistor 20U. Accordingly, isolation structures 17A may function as channel isolation structures and/or gate isolation structures, and isolation structures 18 may function as source/drain isolation structures. Isolation structures 17A and isolation structures 18 may include a single layer or multiple layers. Isolation structures 17A and isolation structures 18 include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). As described below, implementing the bonding and isolation techniques described herein provides isolation structures 17A with a first portion having a first composition and a second portion having a second composition, where the second composition is different than the first composition. Isolation structures 17A and isolation structures 18 may include the same or different materials and/or configurations. In the depicted embodiment, a thickness of isolation structures 17A is less than a thickness of isolation structures 18, and a configuration of isolation structures 17A is different than a configuration of isolation structures 18. In some embodiments, isolation structures 18 are formed by a portion of CESL 70L and ILD layer 72L, such as depicted.

Substrate 14, semiconductor layers 26U, semiconductor layers 26M, and semiconductor layers 26L include an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 14 semiconductor layers 26U, semiconductor layers 26M, and semiconductor layers 26L include silicon. In some embodiments, semiconductor layers 26U and semiconductor layers 26L include different semiconductor materials, such as silicon and silicon germanium, respectively, or vice versa. In some embodiments, substrate 14 is a semiconductor-on-insulator substrate, such as a silicon-on-insulator substrate, a silicon germanium-on-insulator substrate, or a germanium-on-insulator substrate. Substrate 14 (including mesas 14' extending therefrom) may include various doped regions, such as p-wells and n-wells. The n-wells are doped with n-type dopants, such as phosphorus, arsenic, other n-type dopant, or a combination thereof. The p-wells are doped with p-type dopants, such as boron, indium, other p-type dopant, or a combination thereof.

Gate spacers 44 are disposed along sidewalls of upper portions of gate stacks 90U, inner spacers 54 are disposed under gate spacers 44 along sidewalls of gate stacks 90U and/or gate stacks 90L, and fin/mesa spacers may be disposed along sidewalls of mesas 14'. Inner spacers 54 are between semiconductor layers 26 and between bottom semiconductor layers 26 and mesas 14'. Gate spacers 44, inner spacers 54, and fin spacers include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). Gate spacers 44, inner spacers 44, and fin spacers may include different materials and/or different configurations (e.g., different numbers of layers). In some embodiments, gate spacers 44, inner spacers 54, fin spacers, or a combination thereof have a multilayer structure. In some embodiments, gate spacers 44 and/or fin spacers include more than one set of spacers, such as seal spacers, offset spacers, sacrificial spacers, dummy spacers, main spacers, or a combination thereof. The various sets of spacers may have different compositions.

Gate 90 is disposed between epitaxial source/drain stacks, where each epitaxial source/drain stack includes a respective epitaxial source/drain 62U, a respective epitaxial source/drain 62L, and a respective insulation structure 18 disposed therebetween. Epitaxial source/drains 62L and epitaxial source/drains 62U may have the same or different compositions and/or materials depending on configurations of their respective transistors. Epitaxial source/drains 62L and epitaxial source/drains 62U may be doped with n-type dopants and/or p-type dopants. In some embodiments, epitaxial source/drains 62L and/or epitaxial source/drains 62U include silicon that may be doped with carbon, phosphorous, arsenic, other n-type dopant, or a combination thereof (e.g., Si:C epitaxial source/drains, Si:P epitaxial source/drains, or Si:C:P epitaxial source/drains). In some embodiments, epitaxial source/drains 62L and/or epitaxial source/drains 62U include silicon germanium or germanium, which may be doped with boron, other p-type dopant, or a combination thereof (e.g., Si:Ge:B epitaxial source/drains). In the depicted embodiment, epitaxial source/drains 62L include silicon germanium doped with boron, and epitaxial source/drains 62U include silicon doped with phosphorous. In some embodiments, epitaxial source/drains 62L and/or epitaxial source/drains 62U include more than one epitaxial semiconductor layer, where the epitaxial semiconductor layers may include the same or different materials and/or the same or different dopant concentrations. In some embodiments, epitaxial source/drains 62L and/or epitaxial source/drains 62U include materials and/or dopants that achieve desired tensile stress and/or compressive stress in adjacent channel regions (e.g., formed by semiconductor layers 26U and semiconductor layers 26L). As used herein, source/drain region, epitaxial source/drain, epitaxial source/drain feature, etc. may refer to a source of a device (e.g., transistor 20U and/or transistor 20L), a drain of a device (e.g., transistor 20U and/or transistor 20L), or a source and/or a drain of multiple devices.

ILD layer 72U and ILD layer 72L includes a dielectric material, such as silicon oxide, carbon doped silicon oxide, silicon nitride, silicon oxynitride, tetraethyl orthosilicate (TEOS)-formed oxide, boron silicate glass (BSG), phosphosilicate glass (PSG), borophosphosilicate glass (BPSG), fluorosilicate glass (FSG), xerogel, aerogel, amorphous fluorinated carbon, parylene, benzocyclobutene-based (BCB) material, polyimide, other dielectric material, or a combination thereof. In some embodiments, ILD layer 72U and/or ILD layer 72L includes a dielectric material having a dielectric constant that is less than a dielectric constant of silicon dioxide. CESL 70L and CESL 70U include a material different than a material of ILD layer 72U and ILD layer 72L, respectively. For example, where ILD layer 72U and ILD layer 72L include a low-k dielectric material that includes silicon and oxygen, CESL 70L and CESL 70U may include silicon and nitrogen and/or carbon. ILD layer 72U, ILD layer 72L CESL 70L, CESL 70U, or a combination thereof may have a multilayer structure.

Gate dielectrics 78U and gate dielectrics 78L each include at least one dielectric gate layer. In some embodiments, gate dielectrics 78U and/or gate dielectrics 78L include an interfacial layer that includes a dielectric material, such as $SiO_2$, $SiGeO_x$, HfSiO, SiON, other dielectric material, or a combination thereof. In some embodiments, gate dielectrics 78U and/or gate dielectrics 78L include a high-k dielectric layer, which includes a dielectric material having a dielectric constant that is greater than a dielectric constant of silicon dioxide ($k \approx 3.9$), such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $LaO_3$, $La_2O_3$, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, $HfO_2$—$Al_2O_3$, other high-k dielectric material, or a combination thereof. For example, gate dielectrics 78U and/or gate dielectrics 78L include a hafnium-based oxide (e.g., $HfO_2$) layer and/or a zirconium-based oxide (e.g., $ZrO_2$) layer. The interfacial layer and/or the high-k dielectric layer may have a multilayer structure.

Gate electrodes 80U and gate electrodes 80L are disposed over gate dielectrics 78U and gate dielectrics 78L, respectively. Gate electrodes 80U and gate electrodes 80L each include at least one electrically conductive gate layer. The electrically conductive gate layer includes an electrically conductive material, such as Al, Cu, Ti, Ta, W, Mo, Co, TaN, NiSi, CoSi, TiN, WN, TiAl, TiAlN, TaCN, TaC, TaSiN, other electrically conductive material, or a combination thereof. In some embodiments, gate electrodes 80U and/or gate electrodes 80L include a work function layer. The work function layer is an electrically conductive layer tuned to have a desired work function, such as an n-type work function or a p-type work function. The work function layer includes work function metal(s) and/or alloys thereof, such as Ti, Ta, Al, Ag, Mn, Zr, W, Ru, Mo, TiC, TiAl, TiAlC, TAlSiC, TaC, TaCN, TaSiN, TiSiN, TiN, TaN, TaSN, WN, WCN, $ZrSi_2$, MoSiz, $TaSi_2$, $NiSi_2$, TaAl, TaAlC, TaSiAlC, TiAlN, or a combination thereof. In some embodiments, gate electrodes 80U and/or gate electrodes 80L include an electrically conductive bulk layer over a respective gate dielectric and/or work function layer. The bulk layer includes an electrically conductive material, such as Al, W, Cu, Ti, Ta, TiN, TaN, polysilicon, other metal(s), alloys thereof, or a combination thereof. In some embodiments, gate electrodes 80U and/or gate electrodes 80L include a barrier (blocking) layer over a respective work function layer and/or gate dielectric. The barrier layer includes a material that prevents or eliminates diffusion and/or reaction of constituents between adjacent layers and/or promotes adhesion between adjacent layers, such as between the work function layer and the bulk layer. In some embodiments, the barrier layer includes metal and nitrogen, such as titanium nitride, tantalum nitride, tungsten nitride (e.g., $W_2N$), titanium silicon nitride (TiSiN), tantalum silicon nitride (TaSiN), other metal nitride, or a combination thereof.

Hard masks 92 include a material that is different than ILD layer 72U and/or subsequently formed ILD layers to achieve etch selectivity during subsequent etching processes. In some embodiments, hard masks 92 include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or a combination thereof. In some embodiments, hard masks 92 include metal and oxygen and/or nitrogen, such as aluminum oxide (e.g., AlO or $Al_2O_3$), aluminum nitride (e.g., AlN), aluminum oxynitride (e.g., AlON), zirconium oxide, zirconium nitride, hafnium oxide (e.g., HfO or $HFO_2$), zirconium aluminum oxide (e.g., ZrAlO), other metal oxide, other metal nitride, or a combination thereof.

Figure 1B:
FIG. 1B is a fragmentary cross-sectional view of another stacked device structure, in portion or entirety, according to various aspects of the present disclosure.
Figure 1B:
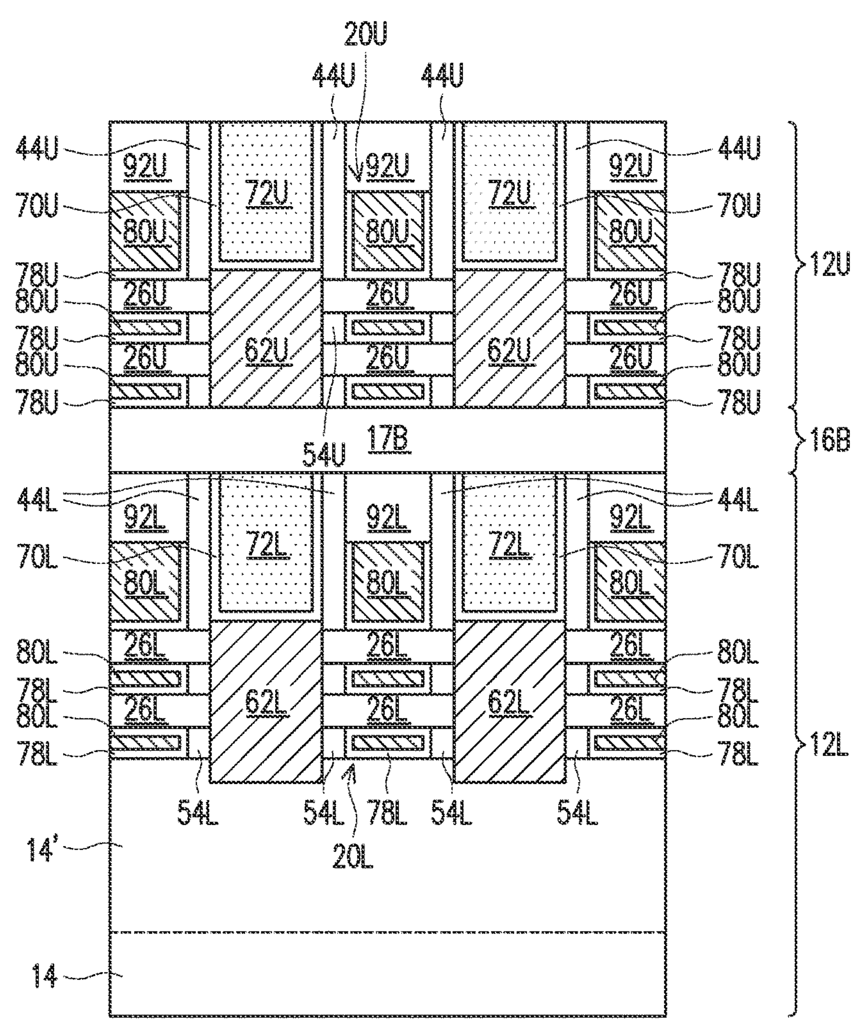
Figure 1B:
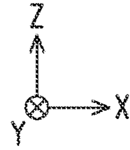

FIG. 1B is a fragmentary cross-sectional view of a stacked device structure 10B, in portion or entirety, according to various aspects of the present disclosure. Stacked device structure 10B is fabricated sequentially, and thus may be referred to as a sequential stacked device structure. Since stacked device structure 10B is similar in many respects to stacked device structure 10A, similar features of stacked device structure 10B and stacked device structure 10A are identified by the same reference numerals for clarity and simplicity. For example, stacked device structure 10B includes device stack (e.g., upper device 12U vertically stacked over lower device 12L) disposed over substrate 14. Stacked device structure 10B includes an isolation structure 16B, instead of isolation structure 16A, between and separating device 12U and device 12L. In some embodiments, device 12U and device 12L are stacked back-to-front. For example, as described further below, isolation structure 16B may bond and/or attach a backside of device 12U to a frontside of device 12L, and isolation structure 16B may be referred to as a bonding layer/structure. FIG. 1B has been simplified for the sake of clarity to better understand the inventive concepts of the present disclosure. Additional features may be added in stacked device structure 10B, and some of the features described below may be replaced, modified, or eliminated in other embodiments of stacked device structure 10B.

In stacked device structure 10B, device 12L and device 12U include at least one electrically functional device, such as transistor 20L and transistor 20U, respectively (which are configured as GAA transistors). Device 12U includes various features and/or components, such as semiconductor layers 26U, semiconductor layers 26M, gate spacers 44U, inner spacers 54U, epitaxial source/drains 62U, CESL 70U, ILD layer 72U, gate dielectrics 78U and gate electrodes 80U (which collectively form gate stacks 90U), and hard masks 92U. Device 12L also includes various features and/or components, such as mesas 14' (e.g., extensions of substrate 14), semiconductor layers 26L, semiconductor layers 26M, substrate isolation structures, gate spacers 44L, inner spacers 54L, epitaxial source/drains 62L, CESL 70L, ILD layer 72L, and gate dielectrics 78L and gate electrodes 80L (which collectively form gate stacks 90L). Stacked device structure 10B may further include source/drain contacts, such as upper source/drain contacts disposed in ILD layer 72U and on epitaxial source/drains 62U and lower source/drain contacts disposed in ILD layer 72L and on epitaxial source/drains 62L.

Because stacked device structure 10B is fabricated sequentially, isolation structure 16B is provided with an isolation structure 17B. Gate stacks 90U are separated from gate stacks 90L by isolation structure 17B, device 12U and/or device 12L may not have semiconductor layers 26M, and epitaxial source/drains 62U are separated from epitaxial source/drains 62L by isolation structure 17B. Isolation structure 17B is thus between channel regions and source/drain regions, respectively, of device 12L and device 12U, and isolation structure 17B may provide electrical isolation of both channels/gates and source/drains of stacked devices. For example, isolation structure 17B extends continuously, without interruption between channel regions and source/drain regions of transistor 20L and transistor 20U. Isolation structure 17B may include a single layer or multiple layers. Isolation structure 17B includes a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). As described below, implementing the bonding and isolation techniques described herein provides isolation structure 17B with a first portion having a first composition and a second portion having a second composition, where the second composition is different than the first composition.

Figure 2A:
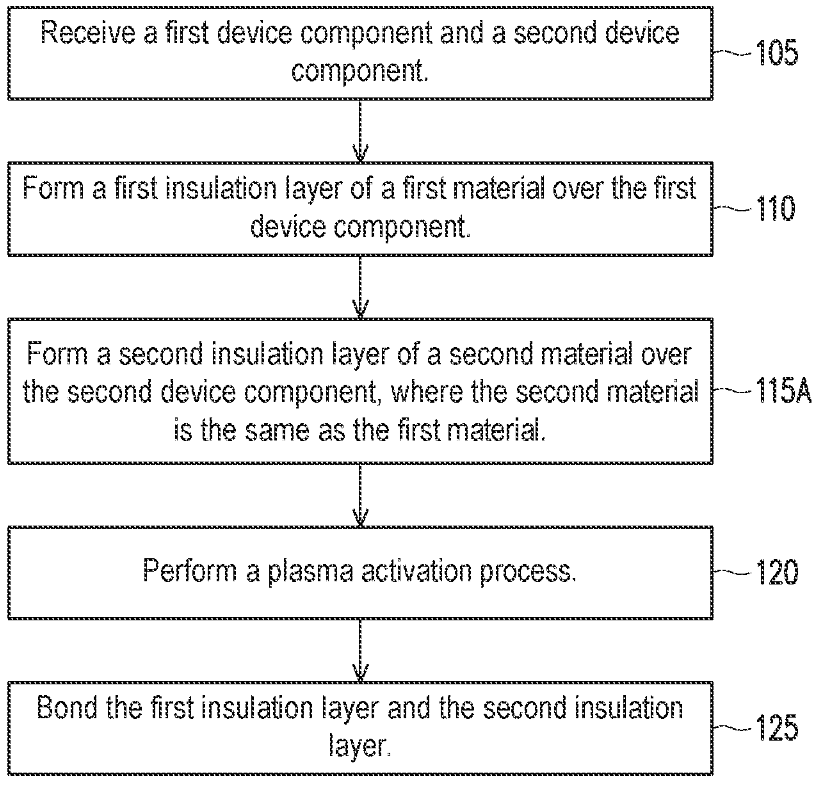
FIG. 2A is a flow chart of a method, in portion or entirety, for homogenously bonding components of a stacked device structure, such as the stacked device structures of FIG. 1A and FIG. 1B, according to various aspects of the present disclosure.
Figure 2B:
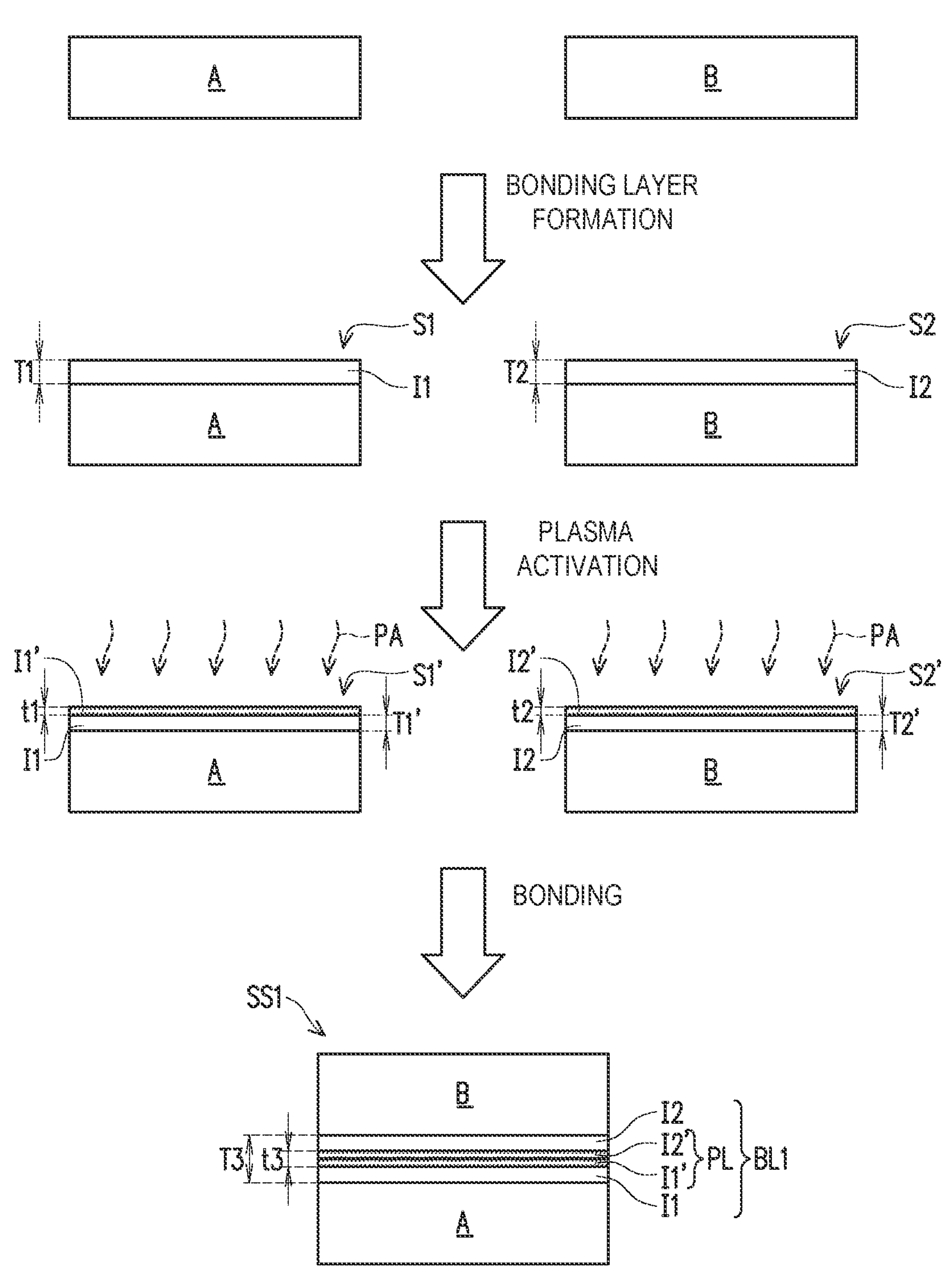
FIG. 2B is a homogenous bonding process flow, in portion or entirety, corresponding with the method of FIG. 2A according to various aspects of the present disclosure.

FIG. 2A is a flow chart of a method 100A, in portion or entirety, for homogenously bonding components of a stacked device structure according to various aspects of the present disclosure. FIG. 2B illustrates a homogenous bonding process flow, in portion or entirety, that may correspond with method 100A of FIG. 2A according to various aspects of the present disclosure. FIG. 2A and FIG. 2B are discussed concurrently herein for ease of description and understanding. In FIG. 2A and FIG. 2B, method 100A at block 105 includes receiving a first device component (e.g., A) and a second device component (e.g., B). Method 100A may proceed to bonding layer formation, for example, by forming a first insulation layer (e.g., I1) of a first material over the first device component at block 110 and forming a second insulation layer (e.g., I2) of a second material over the second device component at block 115A. The first insulation layer and the second insulation layer may be formed by chemical vapor deposition (CVD), plasma-enhanced CVD (PECVD), atomic layer deposition (ALD), plasma-enhanced ALD (PEALD), other deposition process, or a combination thereof. The second material is the same as the first material. Method 100A further includes performing a plasma activation process (e.g., PA), for example, on a bonding surface of the first insulation layer (e.g., S1) and a bonding surface of the second insulation layer (e.g., S2) at block 120. The plasma activation process provides the first insulation layer with a first plasma activated surface (e.g., S1') and the second insulation layer with a second plasma activated surface (e.g., S2'). Method 100A at block 125 may proceed with bonding the first insulation layer and the second insulation layer, such that a bonding/insulation layer (e.g., BL1) is provided between the first device component and the second device component. For example, bonding is achieved by bringing the first plasma activated surface of the first insulation layer and the second plasma activated surface of the second insulation layer (i.e., homogenous surfaces) into contact with each other. In the depicted embodiment, the bonding/insulation layer includes the first insulation layer, the second insulation layer, and a plasma-activated layer (e.g. PL). FIG. 2A and FIG. 2B have been simplified for the sake of clarity to better understand the inventive concepts of the present disclosure. Additional steps may be provided before, during, and after method 100A, and some of the steps described may be moved, replaced, or eliminated for additional embodiments of method 100A. Additional features may be added in FIG. 2B, and some of the features described below may be replaced, modified, or eliminated in other embodiments of FIG. 2B.

At block 110, the first insulation layer has a first thickness (e.g., T1), and the second insulation layer has a second thickness (e.g., T2). In some embodiments, the first thickness is about 5 nm to about 25 nm. In some embodiments, the second thickness is about 5 nm to about 25 nm. In some embodiments, to facilitate ultrathin bonding of the first device component and the second device component, the first thickness and the second thickness are each about 5 nm to about 10 nm. In some embodiments, the first thickness and the second thickness are the same. In some embodiments, the first thickness and the second thickness are different.

At block 115A, the first material and the second material are the same. The first material and the second material are configured to facilitate dielectric-to-dielectric bonding, facilitate surface silanolating of the bonding surfaces of the first insulation layer and the second insulation layer during the plasma activation process (i.e., facilitate generation and/or addition of silanol (Si—O—H groups) at the bonding surfaces upon activation to enhance adhesion and/or bonding therebetween), and electrically isolate the first device component and the second device component. In some embodiments, the first material and the second material are dielectric materials that include silicon and oxygen, nitrogen, carbon, or a combination thereof (e.g., silicon nitride (SiN), silicon oxynitride (SiON), silicon carbonitride (SiCN), silicon oxycarbide (SiOC), silicon oxycarbonitride (SiOCN), etc.). In some embodiments, the first material and the second material are dielectric materials that include boron and oxygen, nitrogen, carbon, or a combination thereof (e.g., boron nitride (BN), boron carbonitride (BCN), etc.).

At block 120, the plasma activation process exposes the first insulation layer and the second insulation layer to a plasma to modify surface conditions of the first insulation layer and the second insulation layer. After the plasma activation process, surface conditions of the first insulation layer's plasma activated surface (e.g., S1') are different than surface conditions of the first insulation layer's bonding surface (e.g., S1), and surface conditions of the second insulation layer's plasma activated surface (e.g., S2') are different than surface conditions of the second insulation layer's bonding surface (e.g., S2). For example, the plasma activated surfaces (e.g., S1' and S2') promote and/or enhance chemical bonding therebetween compared to the bonding surfaces (e.g., S1 and S2) before the plasma activation process. In some embodiments, surface energies of the plasma activated surfaces are greater than surface energies of the bonding surfaces. In some embodiments, a concentration of silanol groups of the plasma activated surfaces is greater than a concentration of silanol groups of the bonding surfaces. In some embodiments, the plasma activated surfaces are silanol surfaces, and the bonding surfaces are silicon-and-nitrogen containing surfaces (e.g., SiCN surfaces or SiN surfaces) or boron-and-nitrogen containing surfaces (e.g., BN surfaces or BCN surfaces). In some embodiments, the plasma activated surfaces are oxygen-rich surfaces, and the bonding surfaces are oxygen-poor surfaces. For example, the plasma activated surfaces have an atomic concentration of oxygen that is greater than an atomic concentration of nitrogen and/or an atomic concentration of carbon, and the bonding surfaces have an atomic concentration of oxygen that is less than an atomic concentration of nitrogen and/or an atomic concentration of carbon. The bonding surfaces may be substantially free of oxygen (i.e., negligible amounts thereof), in some embodiments.

The plasma activation process may transform (e.g., oxidize) portions of the first insulation layer and the second insulation layer into plasma-activated portions/layers (e.g., I1' and I2', respectively). As a result, the first insulation layer may have a reduced first thickness (e.g., T1'<T1), the second insulation layer may have a reduced second thickness (e.g., T2'<T2), the plasma-activated portion of the first insulation layer (e.g., I1') may have a third thickness (e.g., t1), and the plasma-activated portion of the second insulation layer may have a fourth thickness (e.g., t2). In some embodiments, the third thickness and the fourth thickness of the plasma-activated portions are each less than about 5 nm. In some embodiments, the third thickness and the fourth thickness of the plasma-activated portions are the same. In some embodiments, the third thickness and the fourth thickness of the plasma-activated portions are different. In some embodiments, the reduced first thickness is less than about 20 nm. In some embodiments, the reduced second thickness is less than about 20 nm. In some embodiments, the reduced first thickness and the reduced second thickness are the same. In some embodiments, the reduced first thickness is different than the reduced second thickness.

In some embodiments, the plasma activation process is an oxygen plasma treatment that oxidizes the bonding surfaces and/or portions of the first insulation layer and the second insulation layer. In some embodiments, the oxygen plasma treatment includes flowing an oxygen-containing precursor gas (e.g., $O_2$) and a carrier gas (e.g., He) into a process chamber, generating an oxygen-containing plasma therefrom, and bombarding an insulation layer (e.g., the first insulation layer and/or the second insulation layer) with plasma-excited oxygen-containing species (i.e., reactive species) of the oxygen-containing plasma. The reactive species may include radicals, ions, neutrals, electrons, photons, or a combination thereof. The reactive species may react with the insulation layer, for example, by adsorbing on the surfaces thereof and triggering chemical reactions that change a composition of bonding surfaces and/or portions of the first insulation layer and/or the second insulation layer and/or producing by-products that desorb from the surfaces thereof. In some embodiments, the oxygen-containing plasma includes excited neutral atoms and/or molecules (e.g., oxygen radicals, such as $O^*$, $O_2^*$, etc.), ionized atoms and/or molecules (e.g., oxygen ions, such as $O_2^+$, $O_2^-$, $O^+$, $O^-$, etc.), atoms and/or molecules (e.g., $O_2$, O, etc.), or a combination thereof. The oxygen-containing gas may include $O_2$ and/or other suitable oxygen-containing precursor (e.g., the plasma activation process is an $O_2$ plasma treatment). The carrier gas may be a noble gas and/or an inert gas, such as argon, helium, xenon, neon, krypton, other suitable gas, or a combination thereof. In some embodiments, the oxygen plasma treatment further includes flowing a hydrogen-containing precursor gas (e.g., $H_2$) into the process chamber, generating an oxygen-and-hydrogen-containing plasma, and bombarding the insulation layer with plasma-excited oxygen-containing species and plasma-excited hydrogen-containing species of the oxygen-and-hydrogen-containing plasma.

Parameters of the plasma activation process are tuned to cause silanol groups to form on bonding surfaces (e.g., S1 and S2) and/or to provide desired oxidation of the first insulation layer and/or the second insulation layer, such as a flow rate and/or a concentration of an oxygen-containing precursor gas, a flow rate and/or a concentration of a carrier gas, a ratio of the oxygen-containing precursor gas to the carrier gas, a process temperature, a process pressure, a process time, a process power, a process bias (voltage) for exciting the plasma and/or accelerating the plasma, a tilt angle, other suitable parameters, or a combination thereof. In some embodiments, the plasma activation process is performed with one or more of the following process parameters: a process temperature of about 0 degrees Celsius (C) to about 100° C., a process pressure of about 0.01 Torr to about 1 Torr, a process time of about 1 second to about 50 seconds, a power of about 20 Watts (W) to about 200 W, a flow rate of a reactant gas (e.g., $O_2$ and/or $N_2$) of about 10 standard cubic centimeters per minute (sccm) to about 100 sccm, and a flow rate of a noble gas and/or an inert gas (e.g., He, Ne, Ar, or a combination thereof) of about 50 sccm to about 2,000 sccm, or a combination thereof. In some embodiments, the plasma is a capacitively coupled plasma (CCP) (i.e., the plasma is generated by a CCP plasma source). In some embodiments, the plasma is an inductively capacitively coupled plasma (ICP) (i.e., the plasma is generated by an ICP plasma source). In some embodiments, the plasma is a microwave plasma (i.e., the plasma is generated by a microwave plasma source). In some embodiments, after the plasma activation process, the plasma activated surfaces of the first insulation layer and/or the second insulation layer are cleaned, for example, with deionized (DI) water (i.e., a DI rinse is performed after plasma activation). In some embodiments, to improve silanization of the bonding surfaces (e.g., S1 and/or S2) of the first insulation layer and/or the second insulation layer, the bonding surfaces may be pre-treated by a suitable process before the plasma activation process. In some embodiments, a pre-treatment process may include increasing and/or forming hydroxyl (—OH) groups at the bonding surfaces.

At block 125, the bonding may include flipping over the second device component (e.g., B), aligning the second device component with the first device component (e.g., A), and attaching the second device component to the first device component, thereby providing a stacked device structure (e.g., SS1). For example, the bonding includes bringing the second insulation layer of the second device component into contact with the first insulation layer of the first device component (or vice versa). In FIG. 2B, the plasma activated surface of the first insulation layer and the plasma activated surface of the second insulation layer are brought into contact under a temperature, a pressure, an atmosphere, or a combination thereof for a time that effectuates bonding of the plasma activated surfaces and/or the plasma activated portions of the first insulation layer and the second insulation layer. For example, a given bonding pressure and/or a given bonding temperature may be applied to the second device component, the second insulation layer thereof, the first device component, the first insulation layer thereof, or a combination thereof for a given bonding time to effectuate chemical bonding/adhesion of the plasma activated surfaces and/or the plasma activated portions. In some embodiments, Si—O—Si bonds are formed between the plasma activated portions of the first insulation layer and the second insulation layer. In such embodiments, OH bonds of silanol groups at the plasma activated surfaces may be broken to facilitate Si—O—Si bond formation.

After bonding, the bonding/insulation layer (e.g., BL1) includes the first insulation layer (having reduced thickness T1'), the second insulation layer (having reduced thickness T2'), and the plasma-activated layer (e.g., PL) between the first insulation layer and the second insulation layer. The plasma activated layer includes the plasma activated portion (e.g., I1') of the first insulation layer, the plasma activated portion (e.g., I2') of the second insulation layer, and any combined portion of the plasma activated portions. In some embodiments, an atomic concentration of oxygen in the plasma activated layer is greater than an atomic concentration of oxygen in the first insulation layer and an atomic concentration of oxygen in the second insulation layer (i.e., the plasma activated layer is an oxygen-rich insulation layer).

In some embodiments, the plasma activated layer is a silicon-and-oxygen containing layer disposed between silicon-and-nitrogen containing insulation layers (e.g., the first insulation layer and the second insulation layer may be SiN layers or SiCN layers). The silicon-and-oxygen containing layer may further include hydrogen. In some embodiments, the silicon-and-oxygen containing layer further includes nitrogen and/or carbon. In such embodiments, the silicon-and-oxygen containing layer has an atomic concentration of oxygen that is greater than an atomic concentration of nitrogen and/or an atomic concentration of carbon. In some embodiments, the silicon-and-nitrogen containing insulation layers further include oxygen, and an atomic concentration of oxygen in the silicon-and-nitrogen containing insulation layers is less than an atomic concentration of oxygen in the plasma activated layer.

In some embodiments, the plasma activated layer is an oxygen-containing layer disposed between boron-and-nitrogen containing insulation layers (e.g., the first insulation layer and the second insulation layer are BN layers or BCN layers). The oxygen-containing layer may further include boron, silicon, hydrogen, or a combination thereof. In some embodiments, the oxygen-containing layer further includes nitrogen and/or carbon. In such embodiments, the oxygen-containing layer has an atomic concentration of oxygen that is greater than an atomic concentration of nitrogen and/or an atomic concentration of carbon. In some embodiments, the boron-and-nitrogen containing insulation layers further includes oxygen, and an atomic concentration of oxygen in the boron-and-nitrogen containing insulation layers is less than an atomic concentration of oxygen in the plasma activated layer.

The plasma-activated layer has a thickness t3, and the bonding/insulation layer has a thickness T3. Thickness t3 is less than or equal to a sum of a thickness of the plasma activated portion of the first insulation layer (e.g., t1) and a thickness of the plasma activated portion of the second insulation layer (e.g., t2). Thickness T3 is a sum of a thickness of the first insulation layer (e.g., the first thickness (e.g., T1) or the reduced first thickness (e.g., T1')), a thickness of the second insulation layer (e.g., the second thickness (e.g., T2) or the reduced second thickness (e.g., T2')), and the thickness of the plasma activated layer (e.g., t3). In some embodiments, thickness T3 is about 10 nm to about 50 nm. In some embodiments, thickness t3 is about 5 nm to about 10 nm. In some embodiments, the thickness of the first insulation layer in the bonding/insulation layer BL1 is less than 20 nm. In some embodiments, the thickness of the second insulation layer in the bonding/insulation layer BL1 is less than 20 nm.

Method 100A provides a stacked device structure (e.g., SS1) that includes the first device component (e.g., A), the second device component (e.g., B), and the bonding/insulation layer (e.g., BL1) between the first device component and the second device component. The bonding/insulation layer includes the first insulation layer (e.g., I1), the second insulation layer (e.g., I2), and the plasma-activated layer (e.g., PL) therebetween. In embodiments where the stacked device structure is provided for monolithically fabricating a stacked transistor, the first device component is a first precursor for fabricating a first transistor, and the second device component is a second precursor for fabricating a second transistor. After bonding, the second precursor and the first precursor may be processed to form the first transistor over the second transistor, respectively, and the bonding/insulation layer will provide an isolation structure, such as isolation structure 17A of isolation structure 16A, between the first transistor and the second transistor. In embodiments where the stacked device structure is provided for sequentially fabricating a stacked transistor, the first device component is a first transistor, and the second device component is a precursor for fabricating a second transistor. After bonding, the second precursor may be processed to form the second transistor over the first transistor, and the bonding/insulation layer will provide an isolation structure, such as isolation structure 17B of isolation structure 16B, between the first transistor and the second transistor.

Figure 3A:
FIG. 3A is a flow chart of a method, in portion or entirety, for heterogeneously bonding components of a stacked device structure, such as the stacked device structures of FIG. 1A and FIG. 1B, according to various aspects of the present disclosure.
Figure 3A:
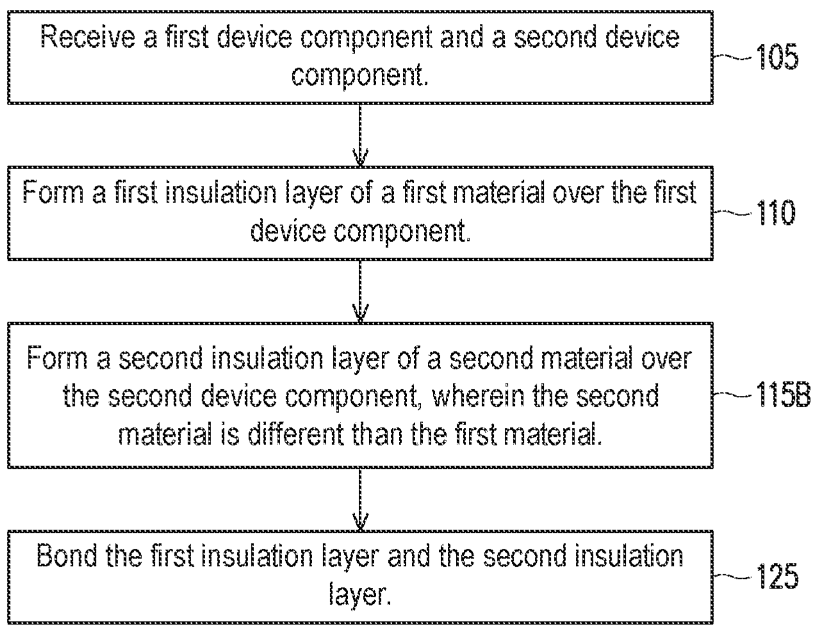
Figure 3B:
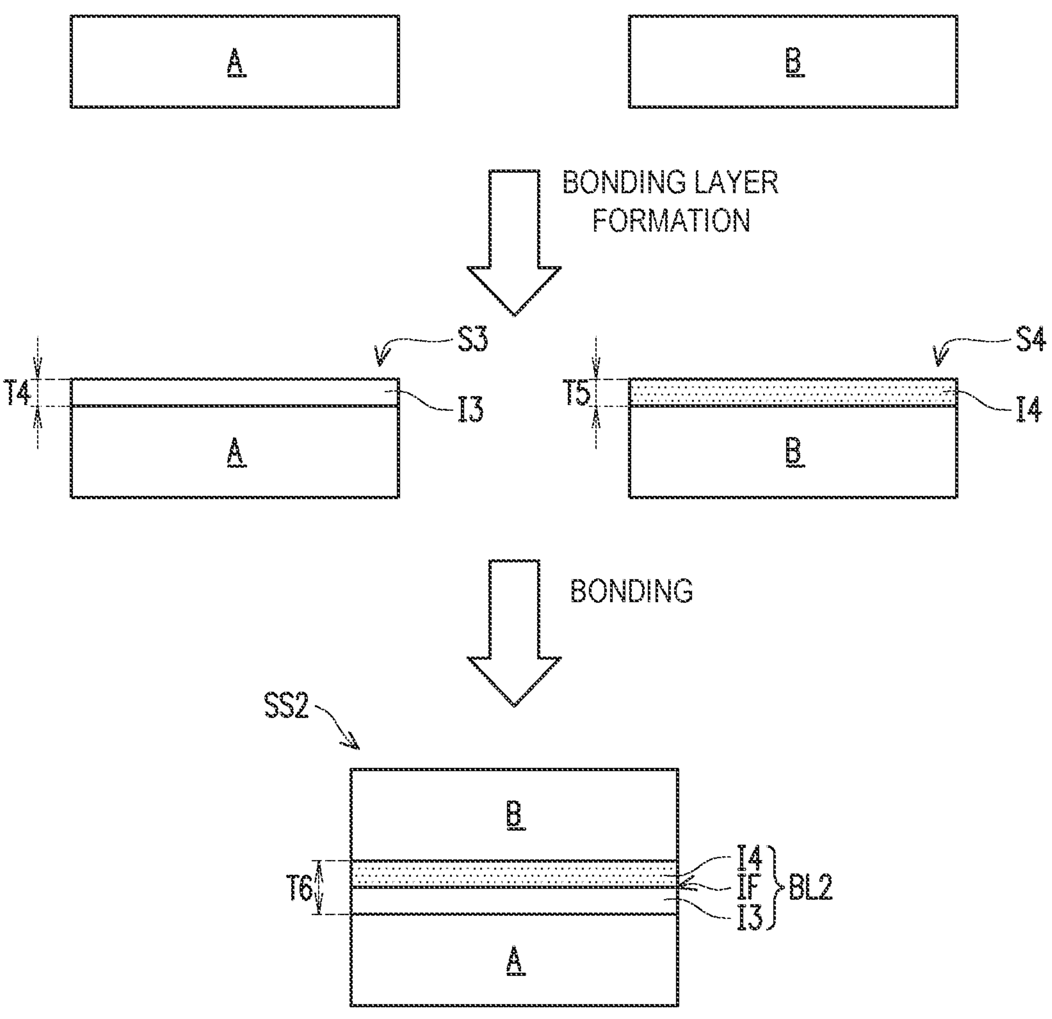
FIG. 3B is a heterogeneous bonding process flow, in portion or entirety, corresponding with the method of FIG. 2B according to various aspects of the present disclosure.

FIG. 3A is a flow chart of a method 100B, in portion or entirety, for heterogeneously bonding components of a stacked device structure according to various aspects of the present disclosure. FIG. 3B illustrates a heterogeneous bonding process flow, in portion or entirety, that may correspond with method 100B of FIG. 3A according to various aspects of the present disclosure. FIG. 3A and FIG. 3B are discussed concurrently herein for ease of description and understanding. In FIG. 3A and FIG. 3B, method 100B at block 105 includes receiving the first device component (e.g., A) and the second device component (e.g., B). Method 100B may proceed to bonding layer formation, for example, by forming a first insulation layer (e.g., 13) of a first material over the first device component at block 110 and forming a second insulation layer (e.g., 14) of a second material over the second device component at block 115B. In contrast to method 100A, in method 100B, the second material is different than the first material, and bonding may be achieved without performing a plasma activation process on bonding surfaces. Method 100B may thus proceed with bonding the first insulation layer and the second insulation layer at block 125. A bonding/insulation layer (e.g., BL2) is provided between the first device component and the second device component. For example, a first bonding surface of the first insulation layer (e.g., S3) is bonded to a second bonding surface of the second insulation layer (e.g., S4), and the bonding/insulation layer includes the first insulation layer and the second insulation layer having an interface therebetween (e.g., IF). FIG. 3A and FIG. 3B have been simplified for the sake of clarity to better understand the inventive concepts of the present disclosure. Additional steps may be provided before, during, and after method 100B, and some of the steps described may be moved, replaced, or eliminated for additional embodiments of method 100B. Additional features may be added in FIG. 3B, and some of the features described below may be replaced, modified, or eliminated in other embodiments of FIG. 3B.

When formed by method 100B, the first insulation layer has a first thickness (e.g., T4), and the second insulation layer has a second thickness (e.g., T5). In some embodiments, the first thickness is about 5 nm to about 25 nm. In some embodiments, the second thickness is about 5 nm to about 25 nm. In some embodiments, to facilitate ultrathin bonding, the first thickness is about 5 nm to about 10 nm, and the second thickness is about 5 nm to about 10 nm. In some embodiments, the first thickness and the second thickness are the same. In some embodiments, the first thickness and the second thickness are different.

In method 100B at block 115B, as noted, the first material and the second material are different. The first material and the second material are configured to facilitate dielectric-to-dielectric bonding without plasma activation and electrically isolate the first device component and the second device component. In some embodiments, the first material is an oxygen-containing dielectric material, and the first insulation layer is an oxide layer. In some embodiments, the oxide layer has a high silanol content. For example, the oxide layer has a surface silanol density that is greater than or equal to about $10^{14}$ atoms/cm$^2$. In some embodiments, the second material is a dielectric material that includes silicon and nitrogen, and the dielectric material may further include oxygen and/or carbon. For example, the second insulation layer is a silicon-and-nitrogen containing layer, such as a silicon nitride layer, a silicon oxynitride layer, or a silicon carbon nitride layer. In some embodiments, the silicon-and-nitrogen containing layer has high porosity. For example, the silicon-and-nitrogen containing layer has a film density that greater than or equal to about 2.8 g/cm$^3$. In some embodiments, the second material is a dielectric material that includes boron and nitrogen. For example, the second insulation layer is a boron-and-nitrogen containing layer (e.g., a BN layer or a BCN layer). In some embodiments, the boron-and-nitrogen containing layer has high porosity.

At block 125, the bonding may include flipping over the second device component (e.g., B), aligning the second device component with the first device component (e.g., A), and attaching the second device component to the first device component, thereby providing a stacked device structure (e.g., SS2). For example, the bonding includes bringing the second insulation layer of the second device component into contact with the first insulation layer of the first device component (or vice versa). In FIG. 3B, the bonding surface of the first insulation layer (e.g., S3) and the bonding surface of the second insulation layer (e.g., S4) are brought into contact under a temperature, a pressure, an atmosphere, or a combination thereof for a time that effectuates bonding of the bonding surfaces of the first insulation layer and the second insulation layer. For example, a given bonding pressure and/or a given bonding temperature may be applied to the second device component, the second insulation layer thereof, the first device component, the first insulation layer thereof, or a combination thereof for a given bonding time to effectuate chemical bonding/adhesion of the bonding surfaces. In some embodiments, Si—O—Si bonds are formed between the bonding portions of the first insulation layer and the second insulation layer. In such embodiments, OH bonds of silanol groups at the bonding surface of the first insulation layer may be broken to facilitate Si—O—Si bond formation.

After bonding, the bonding/insulation layer (e.g., BL2) includes the first insulation layer (having thickness T4) and the second insulation layer (having thickness T5) having the interface (IF) therebetween. The bonding/insulation layer has a thickness T6, which is a sum of a thickness of the first insulation layer (e.g., the first thickness (e.g., T4)) and a thickness of the second insulation layer (e.g., the second thickness (e.g., T5). In some embodiments, thickness T6 is about 10 nm to about 50 nm. In some embodiments, the bonding/insulation layer has an oxygen-rich side (e.g., the first insulation layer) and a nitrogen-rich side (e.g., the second insulation layer). For example, an atomic concentration of oxygen in the first insulation layer is greater than an atomic concentration of oxygen in the second insulation layer and an atomic concentration of nitrogen in the second insulation layer is greater than an atomic concentration of nitrogen in the first insulation layer. In such embodiments, the first insulation layer may be a silicon-and-oxygen containing layer, and the second insulation layer may be a silicon-and-nitrogen containing layer. The silicon-and-oxygen containing layer may further include hydrogen, nitrogen, carbon, or a combination thereof, and the silicon-and-nitrogen containing layer may further include oxygen, hydrogen, carbon, or a combination thereof.

Method 100B provides a stacked device structure (e.g., SS2) that includes the first device component (e.g., A), the second device component (e.g., B), and the bonding/insulation layer (e.g., BL2) between the first device component and the second device component. The bonding/insulation layer includes the first insulation layer (e.g., I1) and the second insulation layer (e.g., I2) having the interface (e.g., IF) therebetween. In embodiments where the stacked device structure is provided for monolithically fabricating a stacked transistor, the first device component is a first precursor for fabricating a first transistor, and the second device component is a second precursor for fabricating a second transistor. After bonding, the second precursor and the first precursor may be processed to form the first transistor over the second transistor, respectively, and the bonding/insulation layer will provide an isolation structure, such as isolation structure 17A of isolation structure 16A, between the first transistor and the second transistor. In embodiments where the stacked device structure is provided for sequentially fabricating a stacked transistor, the first device component is a first transistor, and the second device component is a precursor for fabricating a second transistor. After bonding, the second precursor may be processed to form the second transistor over the first transistor, and the bonding/insulation layer will provide an isolation structure, such as isolation structure 17B of isolation structure 16B, between the first transistor and the second transistor.

Figure 4:
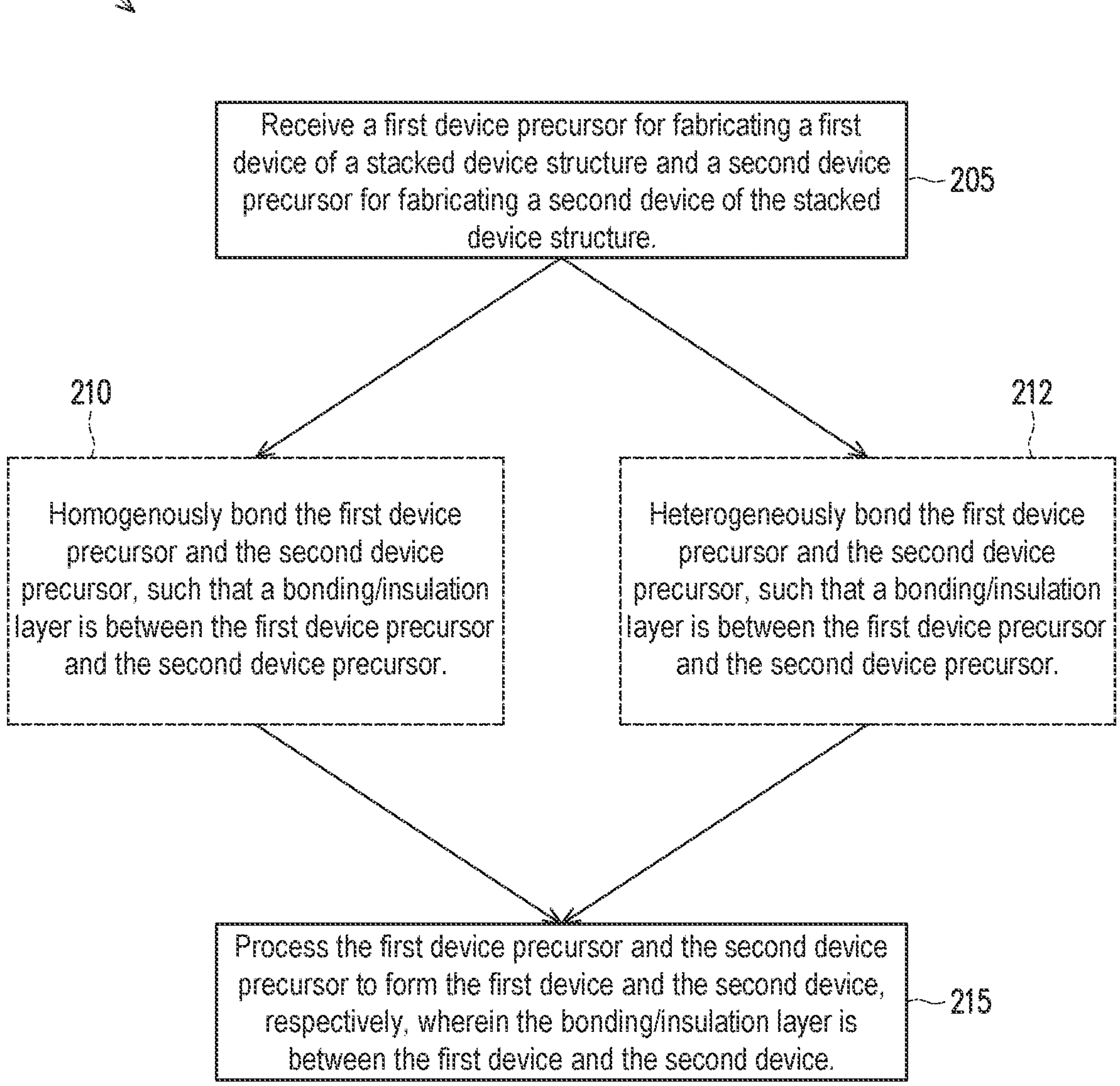
FIG. 4 is a flow chart of a method for monolithically fabricating a stacked device structure, such as the stacked device structure of FIG. 1A, that implements the bonding methods of FIG. 2A and FIG. 3A, according to various aspects of the present disclosure.

FIG. 4 is a flow chart of a method 200 for monolithically fabricating a stacked device structure, such as stacked device structure 10A of FIG. 1A, that implements the bonding techniques of FIG. 2A or FIG. 3A, according to various aspects of the present disclosure. In FIG. 4, method 200 at block 205 includes receiving a first device precursor for fabricating a first device (e.g., device 12L) of a stacked device structure and receiving a second device precursor for fabricating a second device (e.g., device 12U) of the stacked device structure. Method 200 may proceed to block 210 or block 212. At block 210, method 200 includes homogenously bonding the first device precursor and the second device precursor. For example, method 100A of FIG. 2A is implemented at block 210 to homogenously bond the first device precursor and the second device precursor. At block 212, method 200 includes heterogeneously bonding the first device precursor and the second device precursor. For example, method 100B of FIG. 3A is implemented at block 212 to heterogeneously bond the first device precursor and the second device precursor. After bonding at block 210 and block 212, a bonding/insulation layer is between the first device precursor and the second device precursor. A configuration and/or a composition of the bonding/insulation layer provided at block 212 is different than a configuration and/or a composition of the bonding/insulation layer provided at block 210. From block 210 or block 212, method 200 proceeds to processing the first device precursor and the second device precursor to form the first device and the second device, respectively. The second device is over the first device. After processing, the bonding/insulation layer is between the first device and the second device and may provide isolation structure 17A or isolation structure 17B therebetween depending on which bonding technique (e.g., block 210 or block 212) is implemented when fabricating the stacked device structure. FIG. 4 has been simplified for the sake of clarity to better understand the inventive concepts of the present disclosure. Additional steps may be provided before, during, and after method 200, and some of the steps described may be moved, replaced, or eliminated for additional embodiments of method 200.

FIGS. 5A-5J are cross-sectional views of stacked device structure 10A, in portion or entirety, at various monolithic fabrication stages, such as those associated with method 200 of FIG. 4 when implementing a homogenous bonding technique (e.g., block 210 of method 200), such as that described with reference to FIG. 2A and FIG. 2B, according to various aspects of the present disclosure. FIGS. 5A-5J have been simplified for the sake of clarity to better understand the inventive concepts of the present disclosure. Additional steps may be provided before, during, and after the monolithic fabrication steps of FIGS. 5A-5J, and some of the steps described may be moved, replaced, or eliminated for additional embodiments of the monolithic fabrication steps of FIGS. 5A-5J. Additional features may be added in stacked device structure 10A of FIGS. 5A-5J, and some of the features described below may be replaced, modified, or eliminated in other embodiments of stacked device structure 10A of FIGS. 5A-5J.

Figure 5A:
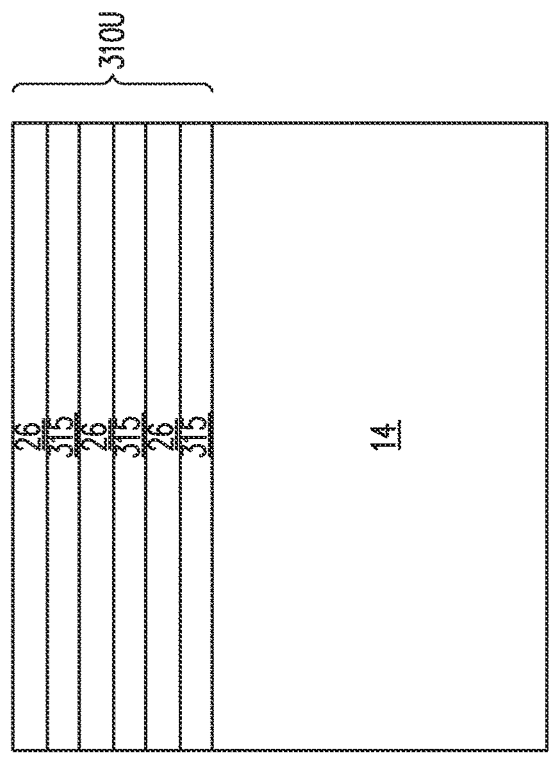
FIGS. 5A-5J are cross-sectional views of a stacked device structure, in portion or entirety, at various fabrication stages, such as those associated with the methods of FIG. 4, FIG. 2A, and FIG. 2B, according to various aspects of the present disclosure.
Figure 5A:
Figure 5A:
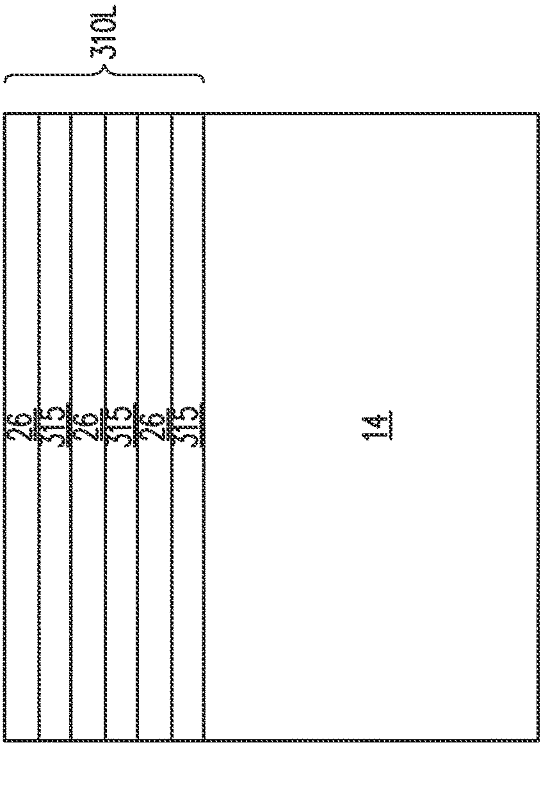
Figure 5A:

Referring to FIG. 5A, fabricating stacked device structure 10A includes receiving a device precursor for device 12L and a device precursor for device 12U. The device precursor for device 12L includes a semiconductor layer stack 310L disposed over a respective substrate 14, and the device precursor for device 12U includes a semiconductor layer stack 310U disposed over a respective substrate 14. Semiconductor layer stack 310L and semiconductor layer stack 310U each include respective semiconductor layers 26 and respective semiconductor layers 315. Semiconductor layers 315 and semiconductor layers 26 are stacked vertically (e.g., along the z-direction) in an interleaving and/or alternating configuration from a top surface of substrate 14. A composition of semiconductor layers 315 and a composition of semiconductor layers 26 are different to achieve etching selectivity and/or different oxidation rates during processing. For example, semiconductor layers 315 and semiconductor layers 26 include different materials, constituent atomic percentages, constituent weight percentages, thicknesses, other characteristics, or a combination thereof to achieve desired etching selectivity. In the depicted embodiment, semiconductor layers 26 include silicon, and semiconductor layers 315 include silicon germanium. With such compositions, semiconductor layers 315 may have a first etch rate to an etchant, semiconductor layers 26 may have a second etch rate to the etchant, and the first etch rate and the second etch rate are different. In some embodiments, semiconductor layers 315 and/or semiconductor layers 26 include n-type dopants and/or p-type dopants. The present disclosure contemplates semiconductor layers 315 and semiconductor layers 26 having any combination of semiconductor materials that provide desired etching selectivity and/or desired performance characteristics (e.g., materials that maximize current flow).

Figure 5B:
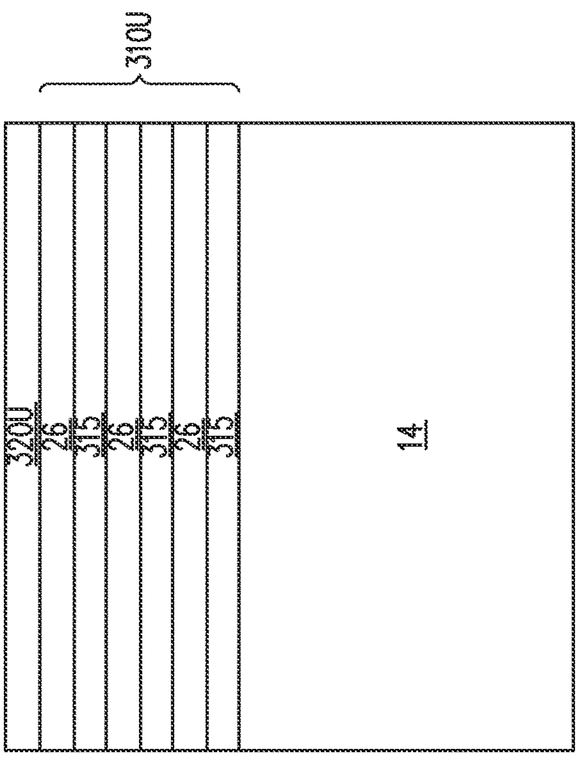
Figure 5B:
Figure 5B:
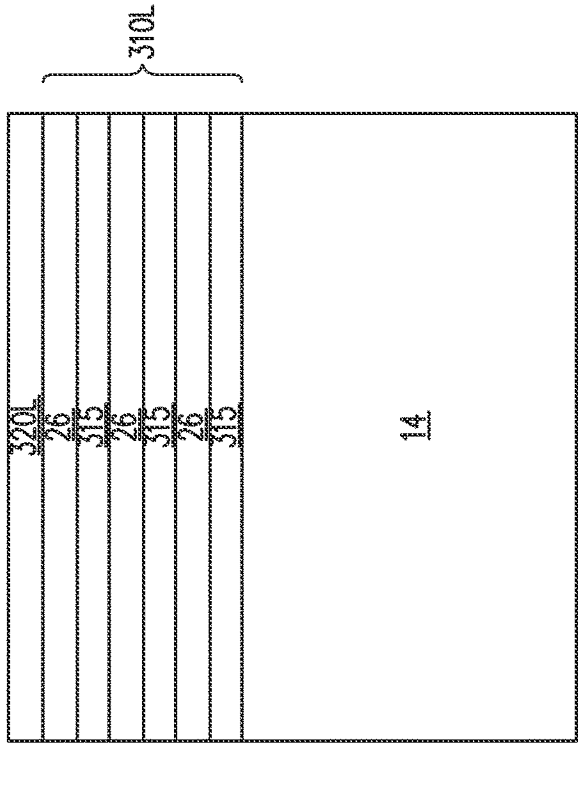
Figure 5B:
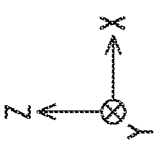
Figure 5C:
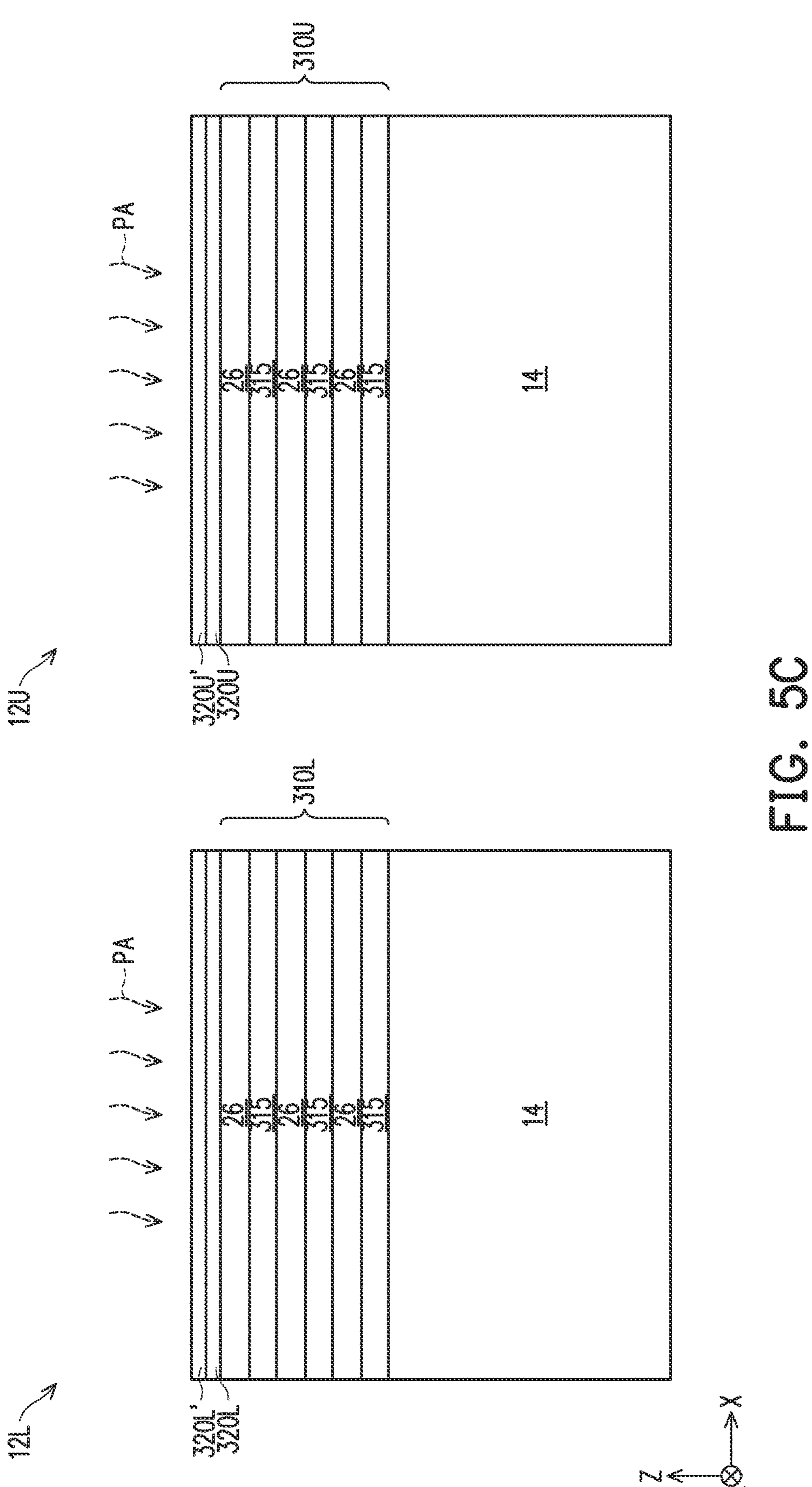
Figure 5D:
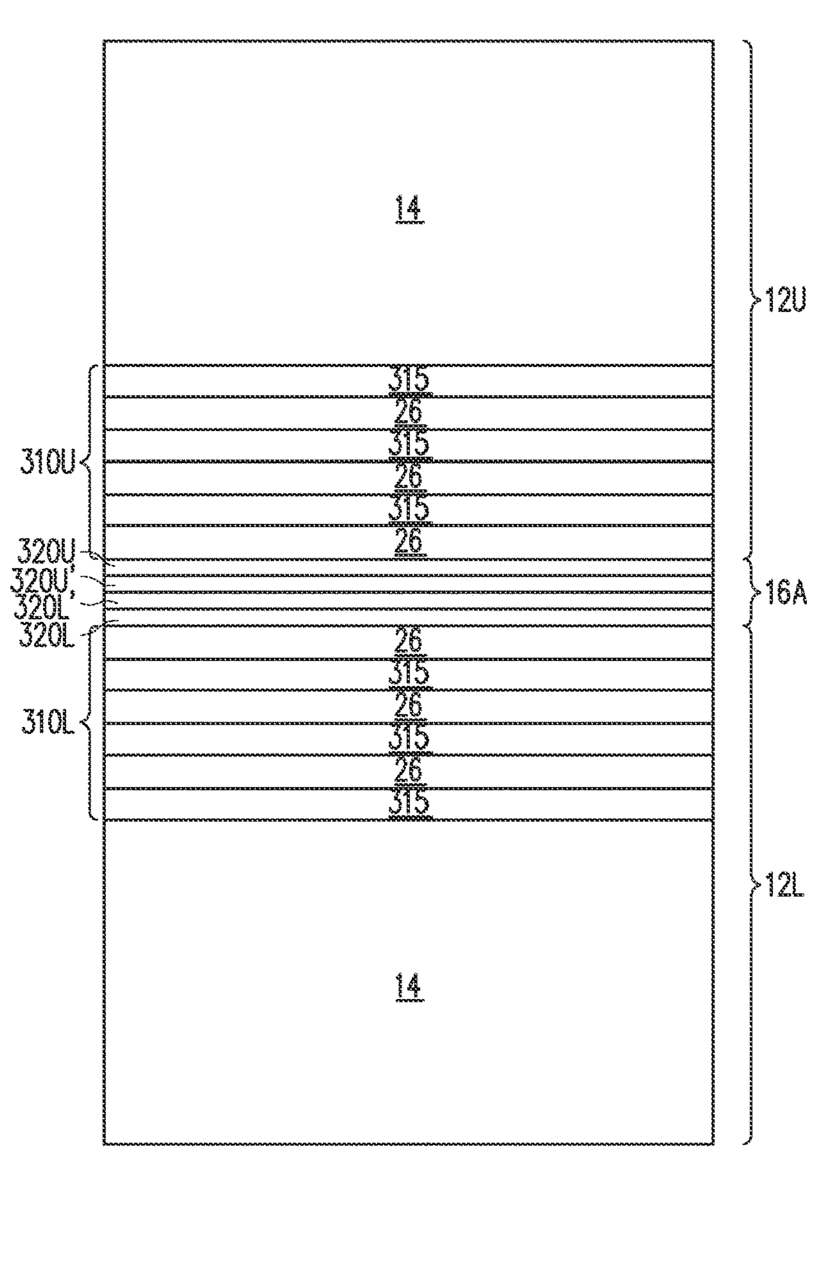

Referring to FIGS. 5B-5D, fabricating stacked device structure 10A includes homogenously bonding the device precursor for device 12L and the device precursor for device 12U. In FIG. 5B, an insulation/bonding layer 320L is formed over semiconductor layer stack 310L, and an insulation/bonding layer 320U is formed over semiconductor layer stack 310U. Insulation layer 320L and insulation layer 320U include a same material. Insulation layer 320L and insulation layer 320U may be similar to insulation layer I1 and insulation layer I2, respectively, described above with reference to FIG. 2A and FIG. 2B. For example, insulation layer 320L and insulation layer 320U may be silicon-and-nitrogen containing layers (e.g., SiN layers, SiON layers, SiCN layers, or SiOCN layers) or boron-and-nitrogen containing layers (e.g., BN layers or BCN layers). Insulation layer 320L and insulation layer 320U may have a thickness that is about 5 nm to about 25 nm. Insulation layer 320L and insulation layer 320U are formed by CVD, PECVD, ALD, PEALD, other suitable process, or a combination thereof.

In FIG. 5C, a shallow plasma activation process (PA) is performed on insulation layer 320L and insulation layer 320U. The shallow plasma activation process is similar to the plasma activation process described above with reference to FIG. 2A and FIG. 2B. For example, the shallow plasma activation process may modify characteristics of portions of insulation layer 320L and insulation layer 320U, thereby providing a plasma activated portion 320L' and a plasma activated portion 320U', respectively, each of which may have a thickness that is less than about 5 nm. Parameters of the shallow plasma activation process may be tuned to enhance promote and/or enhance bonding between insulation layer 320L and insulation layer 320U by causing silanol groups to form on top, bonding surfaces thereof. The shallow plasma activation process may thus be a silanization process. In some embodiments, the shallow plasma activation process increases a concentration and/or a density of silanol groups at top, bonding surfaces of insulation layer 320L and insulation layer 320U. In some embodiments, the shallow plasma activation process is an oxygen plasma treatment that oxidizes portions of insulation layer 320L and insulation layer 320U, and plasma activated portion 320L' and plasma activated portion 320U' are oxidized portions thereof. In some embodiments, an atomic concentration of oxygen of plasma activated portion 320L' and plasma activated portion 320U' is greater than an atomic concentration of oxygen of insulation layer 320L and insulation layer 320U. In some embodiments, insulation layer 320L and insulation layer 320U include silicon and nitrogen, and plasma activated portion 320L' and plasma activated portion 320U' include silicon, nitrogen, oxygen, and hydrogen. In such embodiments, insulation layer 320L and insulation layer 320U may further include carbon and/or oxygen, plasma activated portion 320L' and plasma activated portion 320U' may further include carbon, and an amount of oxygen in insulation layer 320L and insulation layer 320U is less than an amount of oxygen in plasma activated portion 320L' and plasma activated portion 320U', respectively. In some embodiments, insulation layer 320L and insulation layer 320U include boron and nitrogen, and plasma activated portion 320L' and plasma activated portion 320U' include boron, nitrogen, oxygen, and hydrogen. In such embodiments, insulation layer 320L and insulation layer 320U may further include carbon and/or oxygen, and plasma activated portion 320L' and plasma activated portion 320U' may further include carbon. In some embodiments, a cleaning process (e.g., a DI rinse) is applied to plasma activated portion 320L' and/or plasma activated portion 320U'. In some embodiments, to improve silanization, the top, bonding surfaces may be pre-treated by a suitable process before the shallow plasma activation process. In some embodiments, a pre-treatment process may include increasing and/or forming hydroxyl (—OH) groups at the top, bonding surfaces.

In FIG. 5D, the device precursor of device 12U (e.g., a backside thereof) is attached and/or bonded to the device precursor of device 12L (e.g., a frontside thereof). The attaching/bonding may include flipping over the device precursor of device 12U, aligning the device precursor of device 12U with the device precursor of device 12L, and attaching the device precursor of device 12U to the device precursor of device 12L. For example, plasma activated portion 320U' is brought into contact with plasma activated portion 320L' (or vice versa) under a temperature, a pressure, an atmosphere, or a combination thereof for a time that effectuates bonding of plasma activated portion 320U' and plasma activated portion 320L'. Surface silanol groups of plasma activated portion 320U' and plasma activated portion 320L' enhance and/or improve bonding therebetween. After bonding, the device precursor of device 12L is attached to and electrically isolated from the device precursor of device 12U by an insulation/bonding layer 325, which includes insulation layer 320L, plasma activated portion 320L', insulation layer 320U, and plasma activated portion 320U'. Accordingly, at this stage of processing, insulation/bonding layer 325 provides isolation structure 16A of stacked device structure 10A, which electrically isolates and separates device 12L and device 12U. In some embodiments, a thickness of insulation/bonding layer 325 is about 10 nm to about 50 nm. In some embodiments, plasma activated portion 320U' and plasma activated portion 320L' are bonded using dielectric-to-dielectric bonding, such as an oxide-to-oxide bonding process that includes bonding an oxide portion of insulation layer 320U (e.g., plasma activated portion 320U') with an oxide portion of insulation layer 320L (e.g., plasma activated portion 320L'). In some embodiments, the bonding includes performing an annealing process or other suitable process to effectuate bonding of plasma activated portion 320U' and plasma activated portion 320L'.

Figure 5E:
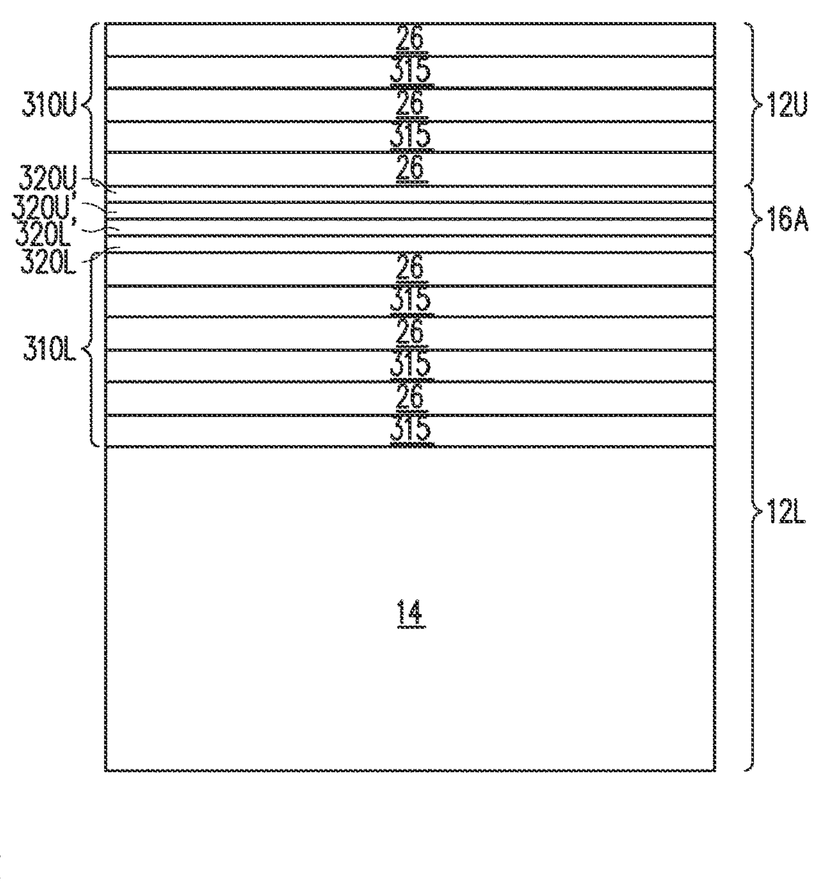

Referring to FIG. 5E, a thinning process may be performed to remove substrate 14 from the device precursor of device 12U. For example, a planarization process, such as CMP, or an etching process is performed to remove substrate 14. In some embodiments, top semiconductor layer 315 of semiconductor layers stack 310U functions as a planarization/CMP stop layer and/or an etch stop layer, and the planarization process and/or the etching process stops upon reaching top semiconductor layer 315. In such embodiments, thereafter, top semiconductor layer 315 may be removed, for example, by an etching process, to expose top semiconductor layer 26 of semiconductor layer stack 310U. Removing top semiconductor layer 315 provides device 12U with a top semiconductor layer 26, which will provide a top channel of device 12U as described herein. In some embodiments, top semiconductor layer 26 of semiconductor layer stack 310U functions as a planarization/CMP stop layer and/or an etch stop layer, and the planarization process and/or the etching process also removes substrate 14 and top semiconductor layer 315 of semiconductor layer stack 310U. In some embodiments, a combination of etching and polishing/planarization is implemented to remove substrate 14 and/or top semiconductor layer 315. Other methods and/or techniques for removing substrate 14 and/or top semiconductor layer 315 are contemplated. In some embodiments, a de-bonding process may be performed before or concurrently with the thinning process to remove a carrier wafer attached to substrate 14 of the device precursor of device 12U before bonding.

Figure 5F:
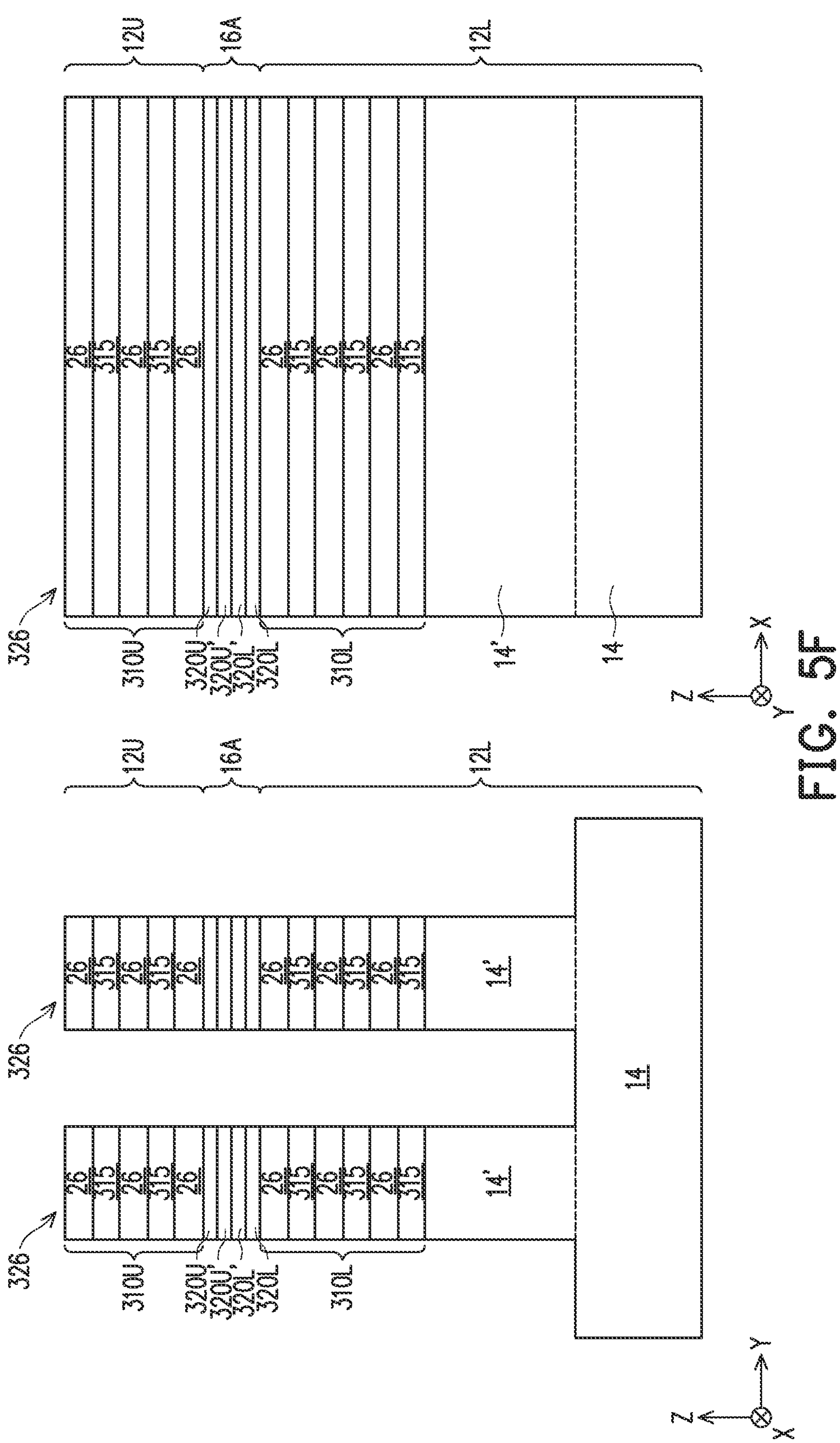

Referring to FIGS. 5F-5J, fabricating stacked device structure 10A includes processing the device precursors to form device 12L and device 12U. In FIG. 5F, a fin fabrication process is performed to form fins 326 (also referred to as fin structures, fin elements, etc.) extending from substrate 14. Fins 326 extend substantially parallel to one another along an x-direction, having a length in the x-direction, a width in a y-direction, and a height in a z-direction. Each of fins 326 include a substrate portion (e.g., a respective mesa 14'), a first semiconductor layer stack portion disposed over the substrate portion (e.g., a respective portion of semiconductor layer stack 310L), an isolation portion disposed over the first semiconductor layer stack portion (e.g., a respective portion of insulation/bonding layer 325), and a second semiconductor layer stack portion (e.g., a respective portion of semiconductor layer stack 310U) disposed over the isolation portion. Fabrication of fins 326 may include performing a lithography process and/or etching process to pattern a semiconductor layer stack precursor (e.g., semiconductor layer stack 310U and semiconductor layer stack 310L separated by insulation layer 325) and/or substrate 14. In some embodiments, fins 326 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or a combination thereof), a triple patterning process (for example, a lithography-etch-lithography-etch-lithography-etch (LELELE) process, a self-aligned triple patterning (SATP) process, other triple patterning process, or a combination thereof), other multiple patterning process (for example, a self-aligned quadruple patterning (SAQP) process), or a combination thereof.

Figure 5G:
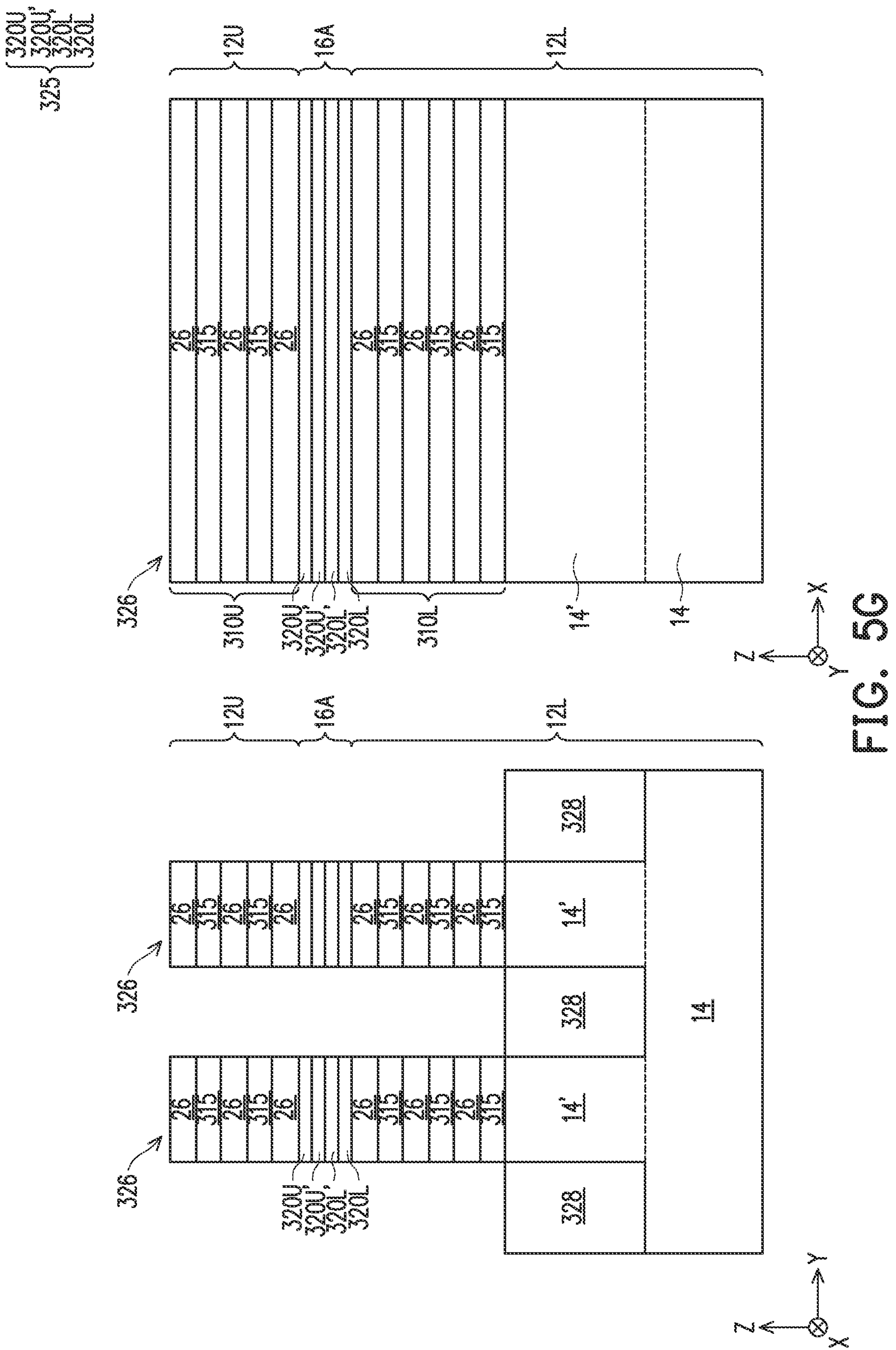

In FIG. 5G, fabricating stacked device structure 10A includes forming substrate isolation structures 328 in trenches between fins 326. Substrate isolation structures 328 fill lower portions of the trenches and surround portions of fins 326. Portions of fins 326 that extend from top surfaces of substrate isolation structures 328 may be referred to as fin active regions. Substrate isolation structures 328 electrically isolate active device regions and/or passive device regions. Substrate isolation structures 328 include silicon oxide, silicon nitride, silicon oxynitride, other suitable isolation material (for example, including silicon, oxygen, nitrogen, carbon, etc.), or a combination thereof. Substrate isolation structures 328 may have a multilayer structure. For example, substrate isolation structures 328 include a bulk dielectric (e.g., an oxide layer) over a dielectric liner (for example, silicon nitride, silicon oxide, silicon oxynitride, silicon oxycarbonitride, or a combination thereof). In another example, substrate isolation structures 328 include a bulk dielectric over a doped liner, such as a boron BSG liner and/or a PSG liner. Dimensions and/or characteristics of substrate isolation structures 328 are configured to provide shallow trench isolation (STI) structures, deep trench isolation (DTI) structures, local oxidation of silicon (LOCOS) structures, other suitable isolation structures, or a combination thereof. In the depicted embodiment, substrate isolation structures 328 may be STIs.

Substrate isolation structures 328 may be formed by depositing a liner layer (e.g., a dielectric layer) that partially fills the trenches, depositing an oxide material over the liner layer that fills remainders of the trenches, performing a planarization process, and recessing and/or etching back substrate isolation structures 328, such that fins 326 protrude therefrom. The planarization process (e.g., CMP) may be performed until reaching and exposing a planarization stop layer. In some embodiments, the planarization process removes mask layers, any of the liner layer, any of the oxide material, any of the liner layer, or a combination thereof that are above and/or over top surfaces of fins 326. Remainders of the liner layer and the oxide material may form liners and bulk dielectrics, respectively, of substrate isolation structures 328.

Figure 5H:
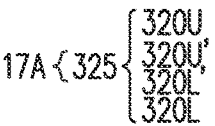
Figure 5H:
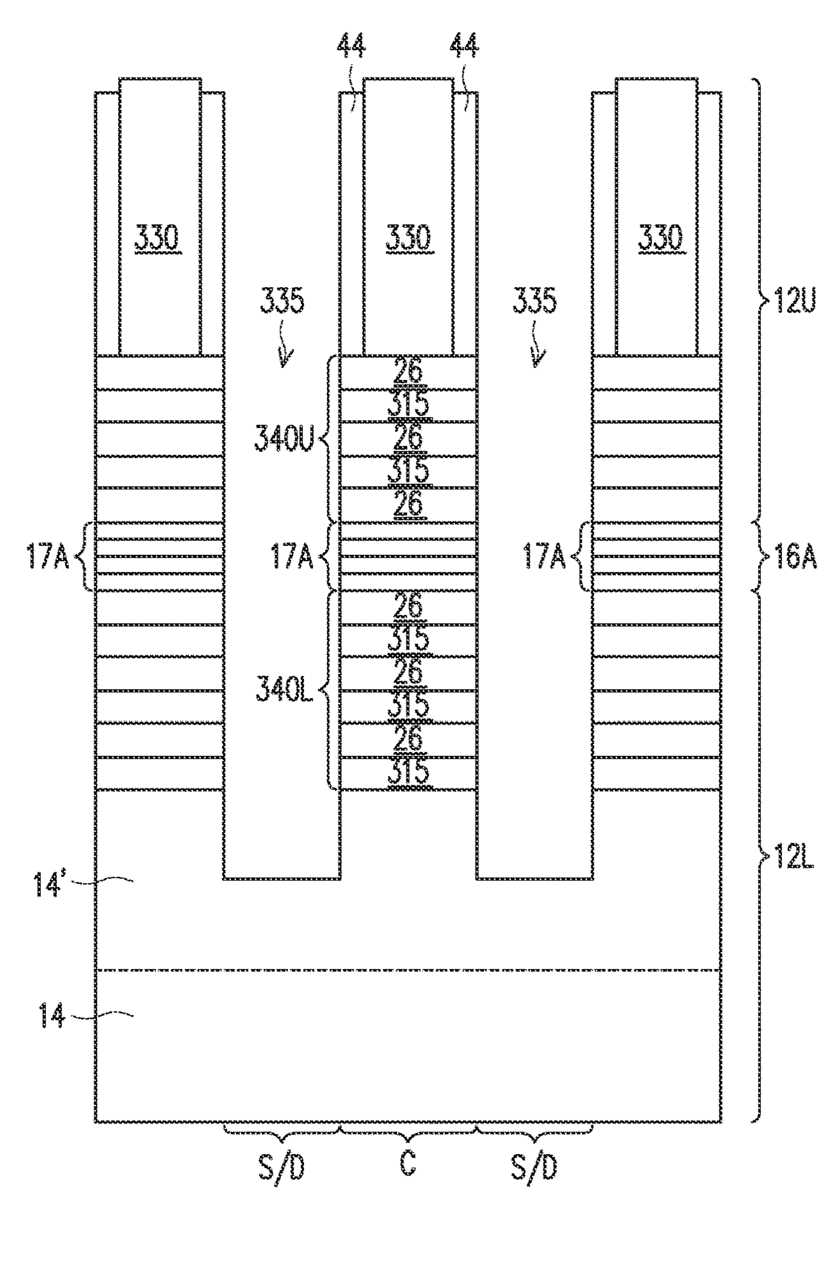

In FIG. 5H, fabricating stacked device structure 10A includes forming dummy gate stacks 330 over portions of fins 326, forming gate spacers 40 along sidewalls of dummy gate stacks 330, and forming source/drain recesses 335. Dummy gate stacks 330 extend lengthwise in a direction that is different than (e.g., orthogonal to) the lengthwise direction of fins 326. For example, dummy gate stacks 330 extend along the y-direction, having a length in the y-direction, a width in the x-direction, and a height in the z-direction. In the X-Z plane, dummy gate stacks 330 are disposed over tops of channel regions (C) of fins 326 and/or stacked device structure 10A, and dummy gate stacks 330 are disposed between source/drain regions (S/D) of fins 326 and/or stacked device structure 10A. In the Y-Z plane, dummy gate stacks 330 may be disposed on tops and sidewalls of fins 326, and dummy gate stacks 330 may wrap channel regions. Dummy gate stacks 330 may include a dummy gate dielectric, a dummy gate electrode, a hard mask, other suitable layers (e.g., a capping layer, an interface layer, a diffusion layer, a barrier layer, etc.), or a combination thereof. The dummy gate dielectric includes a dielectric material, such as silicon oxide, a high-k dielectric material, other suitable dielectric material, or a combination thereof. The dummy gate electrode includes a suitable dummy gate material, such as polysilicon. The hard mask includes suitable hard mask material, such as silicon nitride.

Source/drain recesses 335 may be formed by performing an etching process that removes semiconductor layer stack 310U, insulation layer 325, and semiconductor layer stack 310L in source/drain regions of fins 326, thereby exposing mesas 14'. The etching process further removes some, but not all, of mesas 14', such that source/drain recesses 335 extend below top surfaces of substrate isolation structures 328. Each source/drain recess 335 has respective sidewalls formed by respective remaining portions of semiconductor layer stack 310U, insulation layer 325, and semiconductor layer stack 310L in channel regions of fins 326 and a bottom formed by a respective mesa 14'. In the depicted embodiment, after forming source/drain recesses 335, each channel region includes an upper channel portion 340U (e.g., formed by a remainder of semiconductor layer stack 310U) and a lower channel portion 340L (e.g., formed by a remainder of semiconductor layer stack 310L) separated by a channel isolation structure (e.g., isolation structure 17A, which is formed by a remainder of insulation layer 325). In some embodiments, the etching process removes some, but not all, of semiconductor layer stacks 310L, and source/drain recesses 335 have bottoms formed by semiconductor layers 26 or semiconductor layers 315. In some embodiments, the etching process stops at mesas 14', and source/drain recesses 335 do not extend below substrate isolation structures 328. The etching process is a dry etch, a wet etch, other suitable etch, or a combination thereof. In some embodiments, the etching process is a multistep etch process.

Figure 5I:
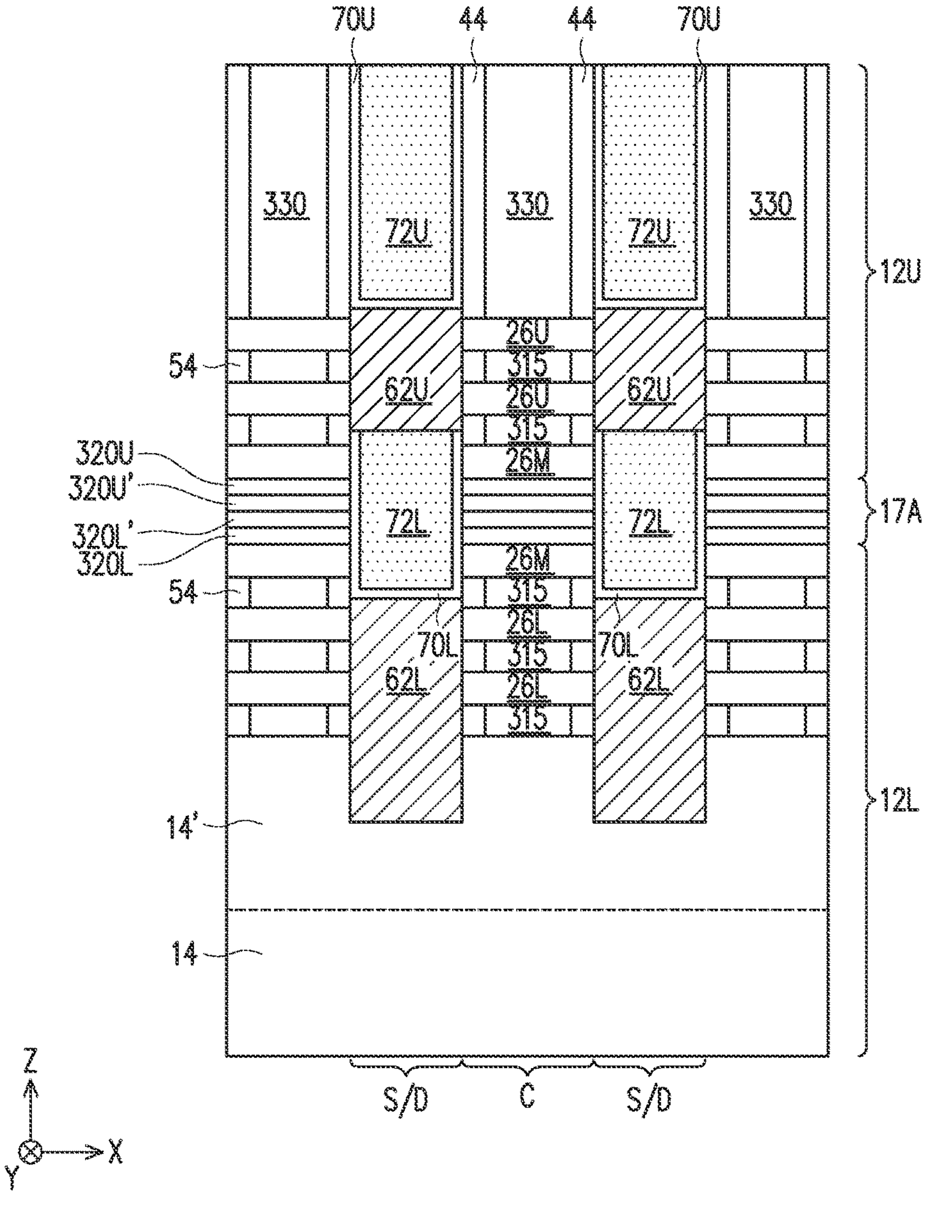

In FIG. 5I, fabricating stacked device structure 10A may include forming inner spacers 54 under gate spacers 40 along sidewalls of semiconductor layers 315. Inner spacers 54 replace portions of semiconductor layers 315 under gate spacers 40, separate semiconductor layers 26 from one another, and separate bottom semiconductor layers 26 from mesas 14'. Forming inner spacers 54 may include a first etching process, a deposition process, and a second etching process. The first etching process selectively etches semiconductor layers 315 with negligible etching of semiconductor layers 26 and mesas 14'. The first etching process is configured to laterally etch semiconductor layers 315 to reduce lengths thereof along the x-direction, thereby forming gaps between semiconductor layers 26 and between mesas 14' and semiconductor layers 26 that separate adjacent semiconductor layers 26 and separate mesas 14' and adjacent semiconductor layers 26. In some embodiments, the gaps laterally extend under dummy gate stacks 330. The deposition process forms a spacer layer that at least partially fills (and may completely fill) the gaps, and the second etching process selectively etches the spacer layer with negligible etching of semiconductor layers 26 and mesas 14', such that remainders of the spacer layer form inner spacers 54. In some embodiments, the spacer layer (and thus inner spacers 54) includes a dielectric material that includes silicon, oxygen, carbon, nitrogen, other suitable dielectric constituent, or a combination thereof. For example, the spacer layer is a silicon nitride layer, a silicon carbonitride layer, a silicon oxycarbonitride layer, a silicon oxycarbide layer, or a combination thereof. In some embodiments, fabrication of inner spacers 54 is configured to provide inner spacers 54 with a multilayer structure and/or air gaps.

In FIG. 5I, fabricating stacked device structure 10A may further include forming epitaxial source/drain stacks in source/drain recesses 335 and forming a dielectric layer (e.g., CESL 70U and ILD layer 72U) over the epitaxial source/drain stacks. Each epitaxial source/drain stack includes a respective epitaxial source/drain 62U and a respective epitaxial source/drain 62L separated by a respective source/drain isolation structure, such as isolation structure 18 (e.g., CESL 70L and ILD layer 72L). Epitaxial source/drain stacks may be formed by filling a bottom/lower portion of source/drain recesses 335 with one or more epitaxial semiconductor materials to form epitaxial source/drains 62L adjacent to semiconductor layers 26 of channel portion 340L, filling a middle portion of source/drain recesses 335 with one or more dielectric materials (e.g., CESL 70L and ILD layer 72L) to form isolation structures 18 adjacent to isolation structures 17A (i.e., channel isolation structures), and filling a top/upper portion of source/drain recesses 335 with one or more epitaxial semiconductor materials to form epitaxial source/drains 62U over adjacent to semiconductor layers 26 of channel portion 340U. Semiconductor layers 26 extending between epitaxial source/drains 62U may be referred to as upper semiconductor layers 26U, semiconductor layers 26L extending between epitaxial source/drains 62L may be referred to as lower semiconductor layers 26L, and semiconductor layers 26 extending between isolation structures 18 may be referred to as middle semiconductor layers 26M. Epitaxial source/drains 62L and epitaxial source/drains 62U are formed by any suitable epitaxial deposition and/or growth process. Isolation structures 18 may be formed by depositing a CESL over epitaxial source/drains 62L, depositing an ILD layer over the CESL, and etching back the CESL and/or the ILD layer to expose semiconductor layers 26 of channel portion 340U that will provide channels for device 12U (e.g., semiconductor layers 26U).

In the depicted embodiment, isolation structure 16A, which separates and/or electrically isolates device 12L and device 12U, is provided by isolation structures 17A (i.e., channel isolation structures and/or gate isolation structures) and isolation structures 18 (i.e., source/drain isolation structures), isolation structures 17A are formed by insulation/bonding layer 325, and insulation/bonding layer 325 has an oxygen-rich, inner portion (e.g., plasma-activated portion 320U' and plasma activated portion 320L') disposed between nitrogen-rich, outer portions (e.g., insulation layer 320U and insulation layer 320L). Isolation structures 17A are between isolation structures 18. Isolation structures 18 extend to a distance above a dummy semiconductor layer of channel portion 340U (e.g., semiconductor layer 26M thereof) and a distance below a bottom active semiconductor layer of channel portion 340U (e.g., bottom semiconductor layer 26U thereof), and isolation structures 18 extend to a distance below a dummy semiconductor layer of channel portion 340L (e.g., semiconductor layer 26M thereof) and a distance above a top active semiconductor layer of channel portion 340L (e.g., top semiconductor layer 26L thereof). The present disclosure contemplates other configurations of isolation structures 18, such as where isolation structures 18 are disposed between isolation structures 17A, but not semiconductor layers 26M (i.e., semiconductor layers 26M extend between respective epitaxial source/drains, instead of isolation structures 18).

Figure 5J:
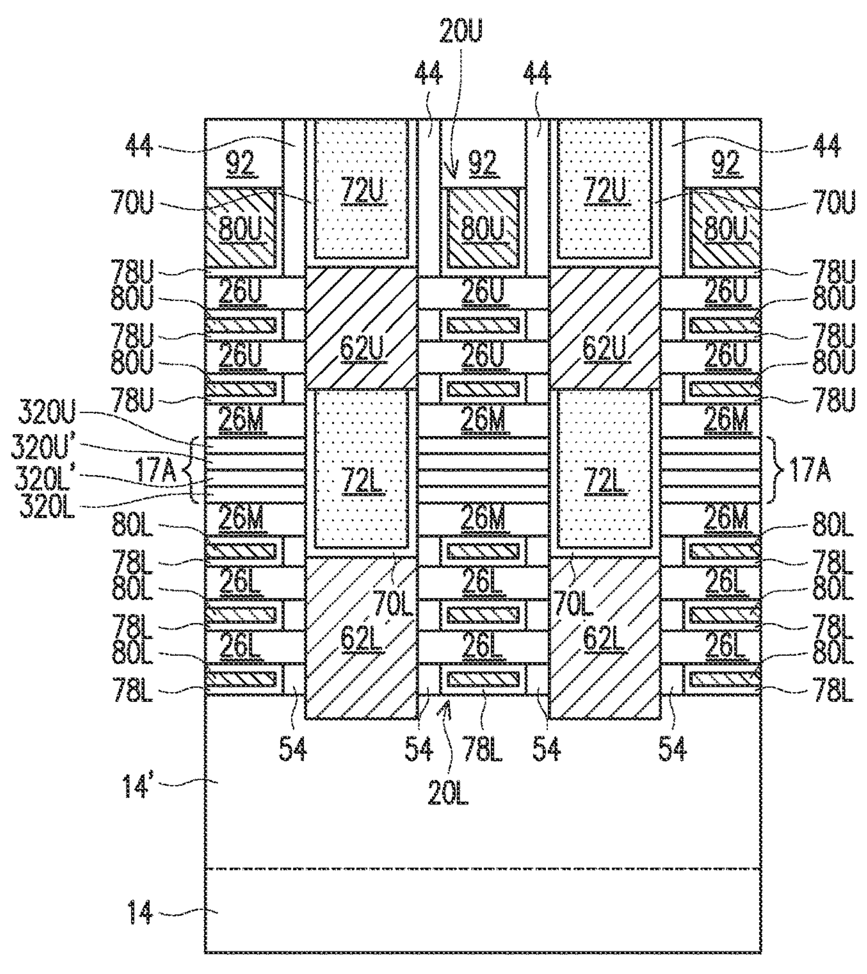
Figure 5J:
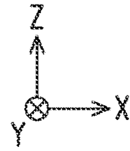

In FIG. 5J, fabricating stacked device structure 10A may include performing a gate replacement process to replace dummy gate stacks 330 with gates and performing a channel release process to form suspended channel layers in channel regions. In some embodiments, fabrication includes removing dummy gate stacks 330 to form gate openings (e.g., by a selective etching process); removing semiconductor layers 315 exposed by the gate openings to form gaps/openings between semiconductor layers 26 and between semiconductor layers 26 and mesas 14' (e.g., by a selective etching process), thereby suspending semiconductor layers 26 over mesas 14'; and forming gates 90 that fill the gate openings and the gaps. Each gate 90 includes a respective gate 90L (e.g., a respective gate dielectric 78L and a respective gate electrode 80L) and a respective gate 90U (e.g., a respective gate dielectric 78U and a respective gate electrode 80U). Gate 90L is separated from gate 90U by middle, dummy semiconductor layers 26M and isolation structure 17A. In some embodiments, gate 90L is separated from gate 90U by isolation structure 17A only. In the depicted embodiment, each channel region has two upper semiconductor layers 26U, which may be referred to as channel layers 26U, and two lower semiconductor layers, which may be referred to as lower channel layers 26L. Channel layers 26U are vertically stacked along the z-direction and provide two channels for transistor 20U through which current may flow between epitaxial source/drains 62U. Channel layers 26L are vertically stacked along the z-direction and provide two channels for transistor 20L through which current may flow between epitaxial source/drains 62L.

In some embodiments, gates 90U are recessed and/or etched back, such that top surfaces of gates 90U are lower than top surface of ILD layer 72U, and hard masks 92 (which may be referred to as self-aligned contact (SAC) features/structures) are formed over gates 90U. Hard masks 92 include a material that is different than ILD layer 72U and/or subsequently formed ILD layers to achieve etch selectivity during subsequent etching processes. In some embodiments, hard masks 92 include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or a combination thereof. In some embodiments, hard masks 92 include metal and oxygen and/or nitrogen, such as aluminum oxide (e.g., AlO or $Al_2O_3$), aluminum nitride (e.g., AlN), aluminum oxynitride (e.g., AlON), zirconium oxide, zirconium nitride, hafnium oxide (e.g., HfO or $HFO_2$), zirconium aluminum oxide (e.g., ZrAlO), other metal oxide, other metal nitride, or a combination thereof. In some embodiments, hard masks 92 include an amorphous semiconductor material, such as amorphous silicon. In some embodiments, hard masks 92 are formed by depositing a hard mask material that fills recesses formed over gates 90U (e.g., recesses having sidewalls formed by gate spacers 44 and bottoms formed by recessed gates 90U) and planarizing the hard mask material.

In some embodiments, fabricating stacked device structure 10A may further include forming interconnects, such as gate contacts and/or source/drain contacts. For example, upper source/drain contacts may be formed in the dielectric layer (e.g., ILD layer 72U and/or CESL 70U) on epitaxial source/drains 62U and lower source/drain contacts may be formed on epitaxial source/drains 62L. In some embodiments, a source/drain via may be formed that electrically connects a respective epitaxial source/drain 62U and a respective epitaxial source/drain 62U. In such embodiments, the source/drain via may be physically and/or electrically connected to an upper source/drain contact formed on the respective epitaxial source/drain 62U and a lower source/drain contact formed on the respective epitaxial source/drain 62L. Forming the source/drain contacts may include forming source/drain contact openings in the dielectric layer (or substrate 14) that expose epitaxial source/drains 62U (or epitaxial source/drains 62L) and forming at least one electrically conductive layer in the source/drain contact openings. In some embodiments, forming the source/drain contact openings includes forming a patterned mask layer (e.g., an etch mask) over the dielectric layer (or substrate) and etching exposed portions of the dielectric layer (or substrate). In some embodiments, forming at least one electrically conductive layer in the source/drain contact openings includes forming metal silicide layers over the epitaxial source/drains, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of the dielectric layer and/or the gate structures. A source/drain contact may thus include a metal silicide layer, a barrier/liner layer, and a bulk metal layer, where the barrier/liner layer is between the bulk metal layer and the dielectric layer (or substrate) and the bulk metal layer and the metal silicide layer. In some embodiments, one or more insulation layers may be formed in the source/drain contact openings and processed to form contact spacers, such as dielectric layers and/or air gaps, along sidewalls of electrically conductive portions of the source/drain contacts.

FIGS. 6A-6I are cross-sectional views of stacked device structure 10A, in portion or entirety, at various monolithic fabrication stages, such as those associated with method 200 of FIG. 4 when implementing a heterogeneous bonding technique (e.g., block 212 of method 200), such as that described with reference to FIG. 3A and FIG. 3B, according to various aspects of the present disclosure. FIGS. 6A-6I have been simplified for the sake of clarity to better understand the inventive concepts of the present disclosure. Additional steps may be provided before, during, and after the monolithic fabrication steps of FIGS. 6A-6I, and some of the steps described may be moved, replaced, or eliminated for additional embodiments of the monolithic fabrication steps of FIGS. 6A-6I. Additional features may be added in stacked device structure 10A of FIGS. 6A-6I, and some of the features described below may be replaced, modified, or eliminated in other embodiments of stacked device structure 10A of FIGS. 6A-6I.

Figure 6A:
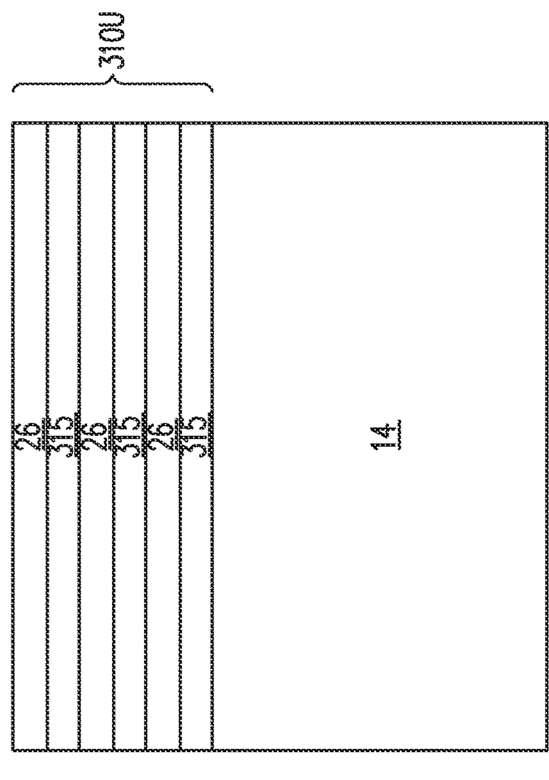
FIGS. 6A-6I are cross-sectional views of a stacked device structure, in portion or entirety, at various fabrication stages, such as those associated with the methods of FIG. 4, FIG. 3A, and FIG. 3B, according to various aspects of the present disclosure.
Figure 6A:
Figure 6A:
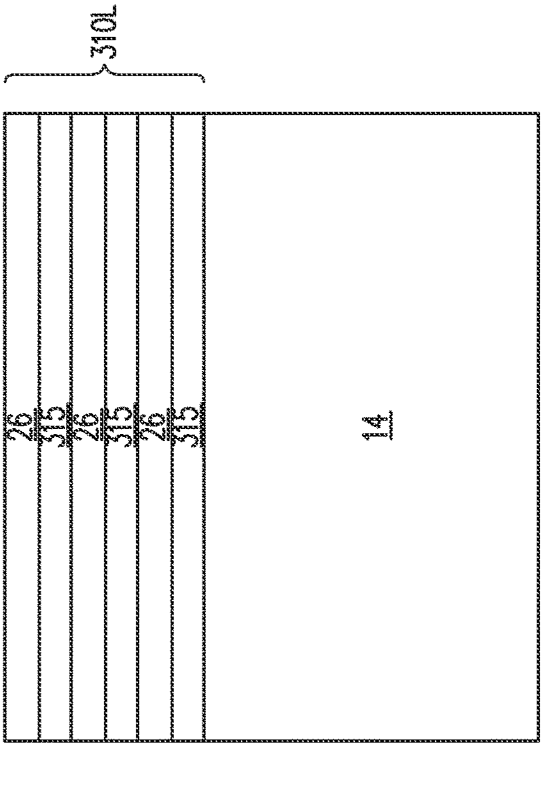
Figure 6A:
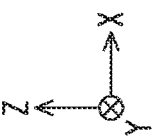
Figure 6B:
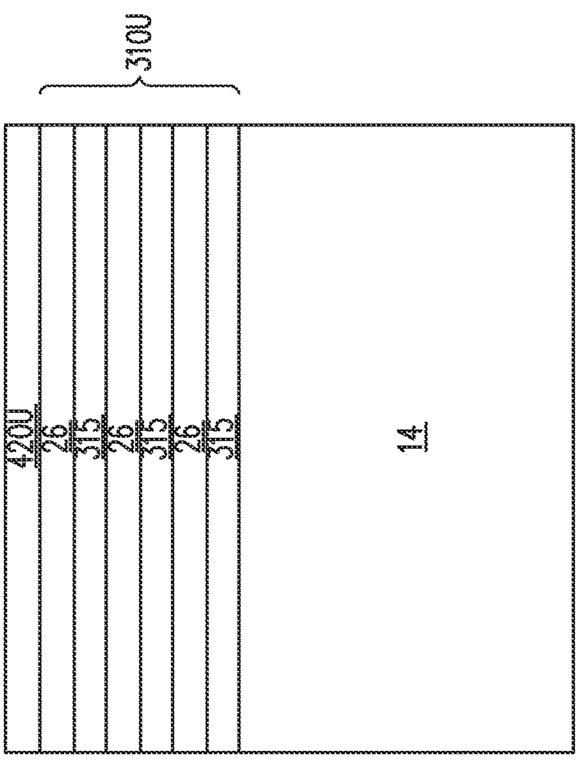
Figure 6B:
Figure 6B:
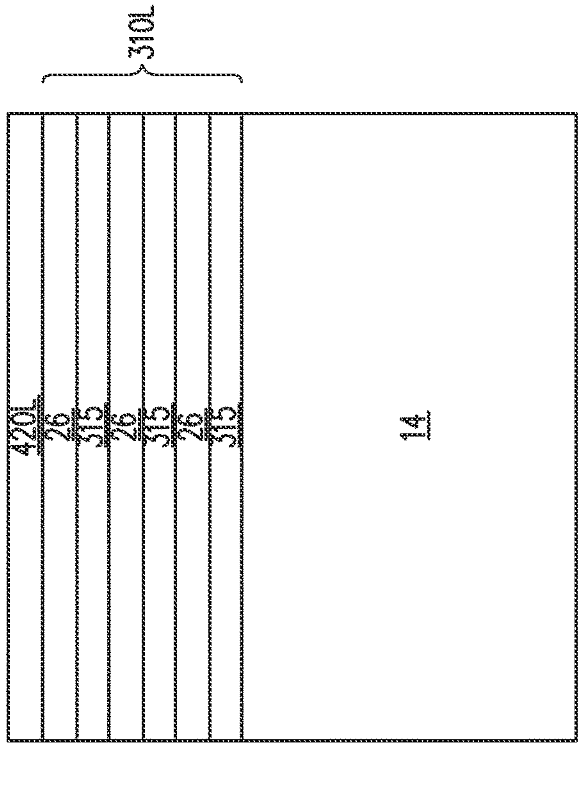
Figure 6B:
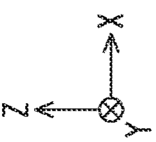
Figure 6C:
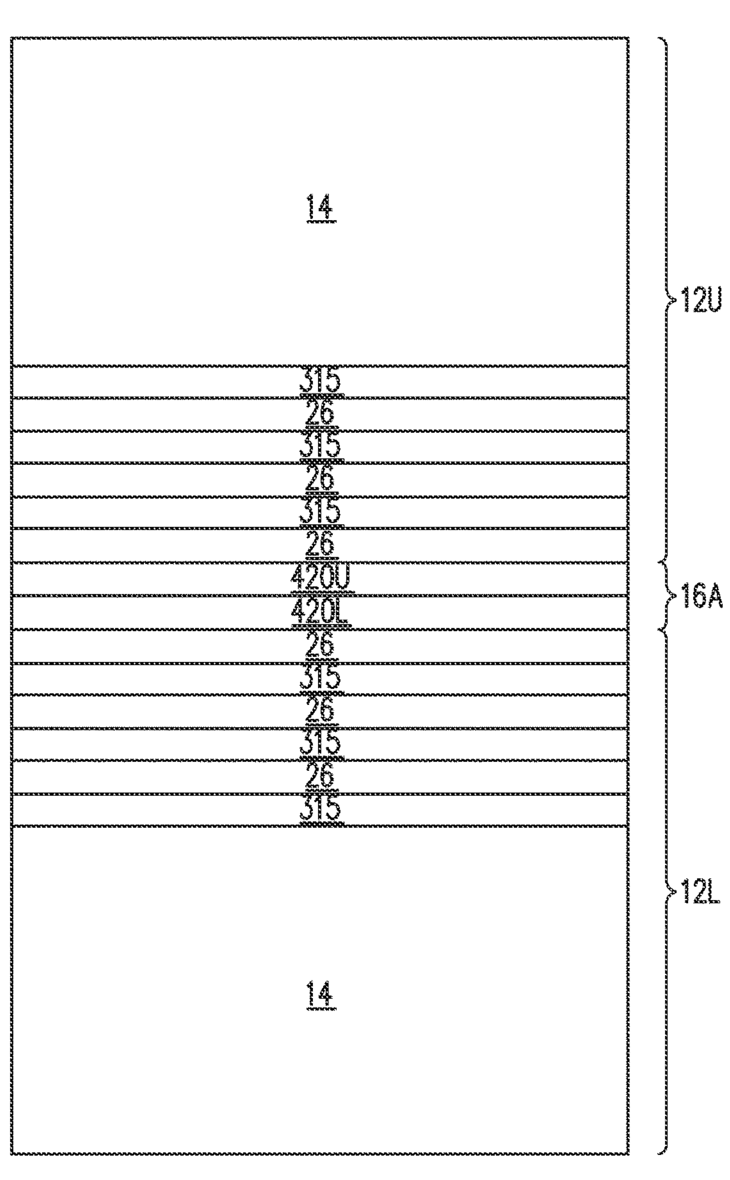

Referring to FIG. 6A, fabricating stacked device structure 10A includes receiving a device precursor for device 12L (e.g., semiconductor layer stack 310L disposed over respective substrate 14) and a device precursor for device 12U (e.g., semiconductor layer stack 310U disposed over respective substrate 14), such as described with reference to FIG. 5A. Referring to FIG. 6B and FIG. 6C, fabricating stacked device structure 10A includes heterogeneously bonding, instead of homogenously bonding, the device precursor for device 12L and the device precursor for device 12U. In FIG. 6B, an insulation/bonding layer 420L is formed over semiconductor layer stack 310L, and an insulation/bonding layer 420U is formed over semiconductor layer stack 310U. Insulation layer 420L and insulation layer 420U include different materials. Insulation layer 420L and insulation layer 420U may be similar to insulation layer 13 and insulation layer 14, respectively, which are described above with reference to FIG. 3A and FIG. 3B. For example, insulation layer 420L may be an oxygen-containing layer (e.g., an oxide layer, such as a silicon oxide layer), and insulation layer 420U may be a silicon-and-nitrogen containing layer (e.g., an SiN layer, an SiON layer, or an SiCN layer). In some embodiments, insulation layer 420U may be a boron-and-nitrogen containing layer (e.g., a BN layer or a BCN layer). Insulation layer 420L and insulation layer 420U may have a thickness that is about 5 nm to about 25 nm. Insulation layer 420L and insulation layer 420U are formed by CVD, PECVD, ALD, PEALD, other suitable process, or a combination thereof.

In FIG. 6C, the device precursor of device 12U (e.g., a backside thereof) is attached and/or bonded to the device precursor of device 12L (e.g., a frontside thereof). The attaching/bonding may include flipping over the device precursor of device 12U, aligning the device precursor of device 12U with the device precursor of device 12L, and attaching the device precursor of device 12U to the device precursor of device 12L. For example, insulation layer 420U is brought into contact with insulation layer 420L (or vice versa) under a temperature, a pressure, an atmosphere, or a combination thereof for a time that effectuates bonding of insulation layer 420L and insulation layer 420U. Surface silanol groups of insulation layer 420L and/or insulation layer 420U enhance and/or improve bonding therebetween. After bonding, the device precursor of device 12L is attached to and electrically isolated from the device precursor of device 12U by an insulation/bonding layer 425. Insulation/bonding layer 425 includes insulation layer 420L and insulation layer 420U, and insulation/bonding layer 425 provides isolation structure 16A of stacked device structure 10A, which electrically isolates and separates device 12L and device 12U. In some embodiments, a thickness of insulation/bonding layer 425 is about 10 nm to about 50 nm. In some embodiments, insulation layer 420L and insulation layer 420U are bonded using dielectric-to-dielectric bonding, such as an oxide-to-oxide bonding. In some embodiments, the bonding includes performing an annealing process or other suitable process to effectuate bonding of insulation layer 420L and insulation layer 420U.

Figure 6D:
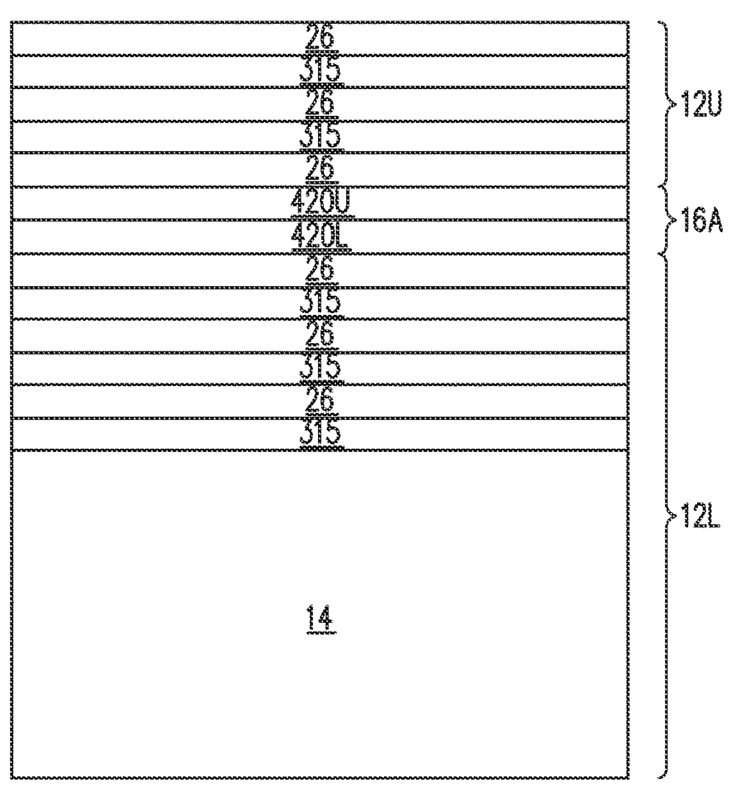
Figure 6E:
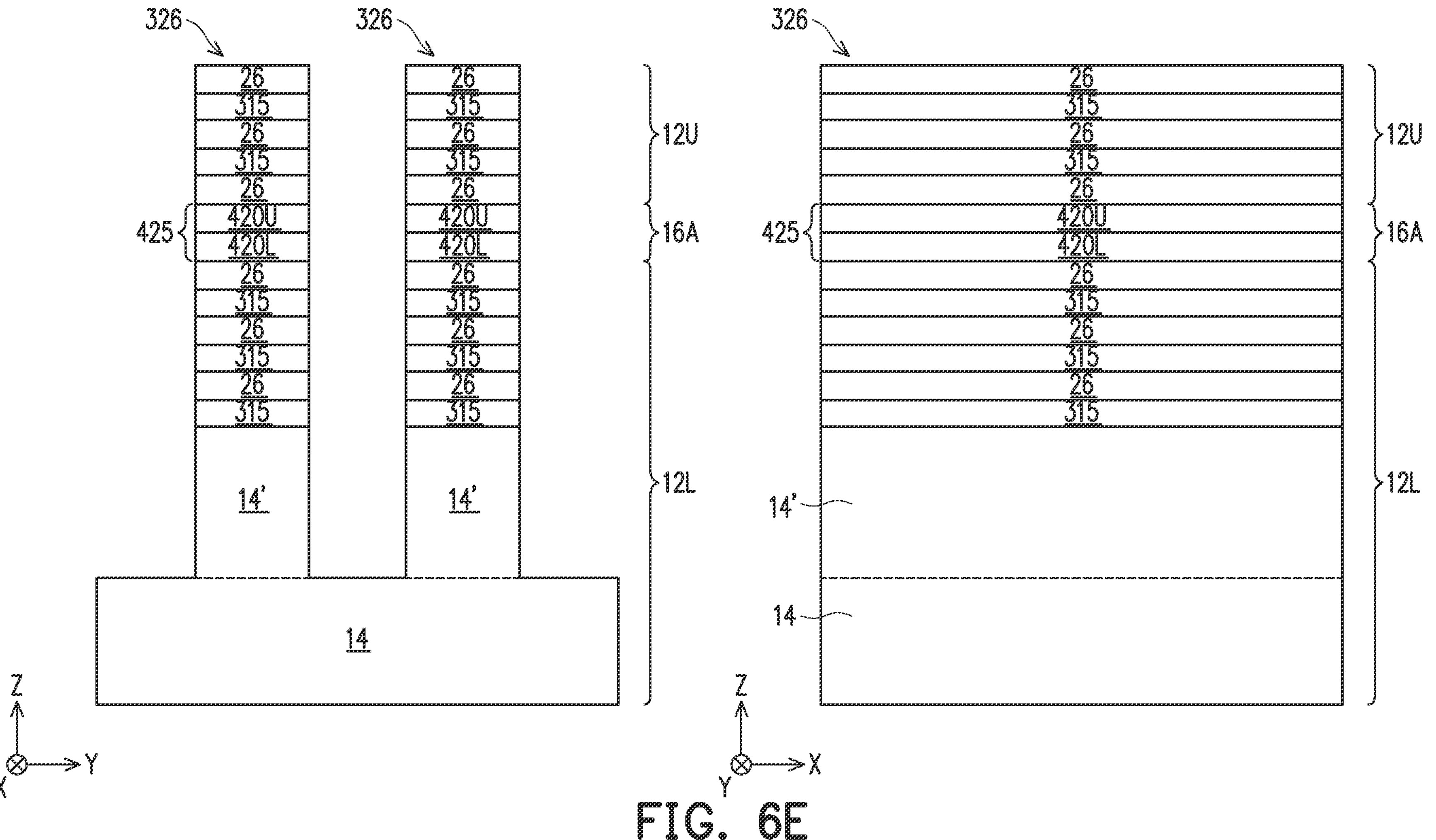
Figure 6F:
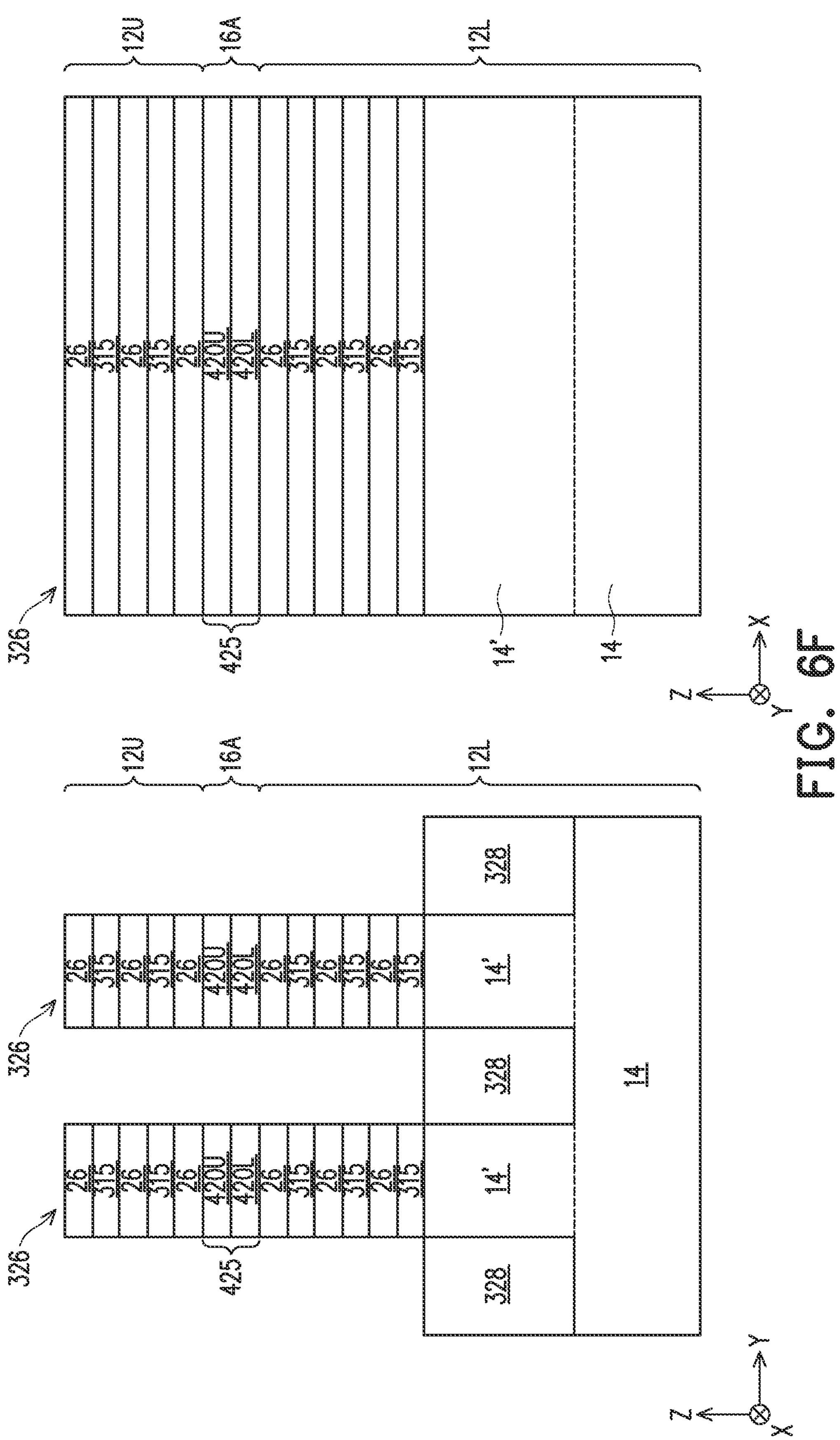
Figure 6G:
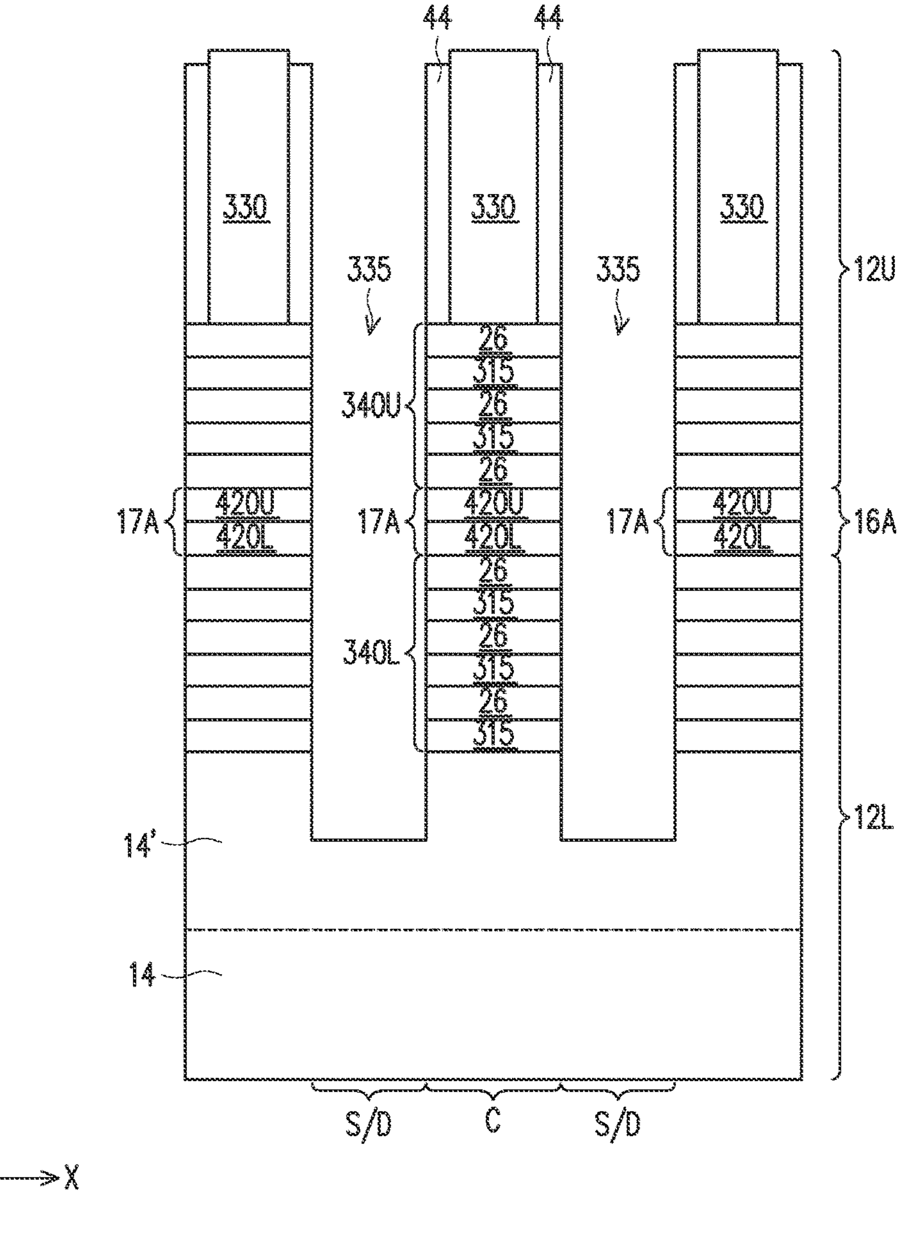
Figure 6H:
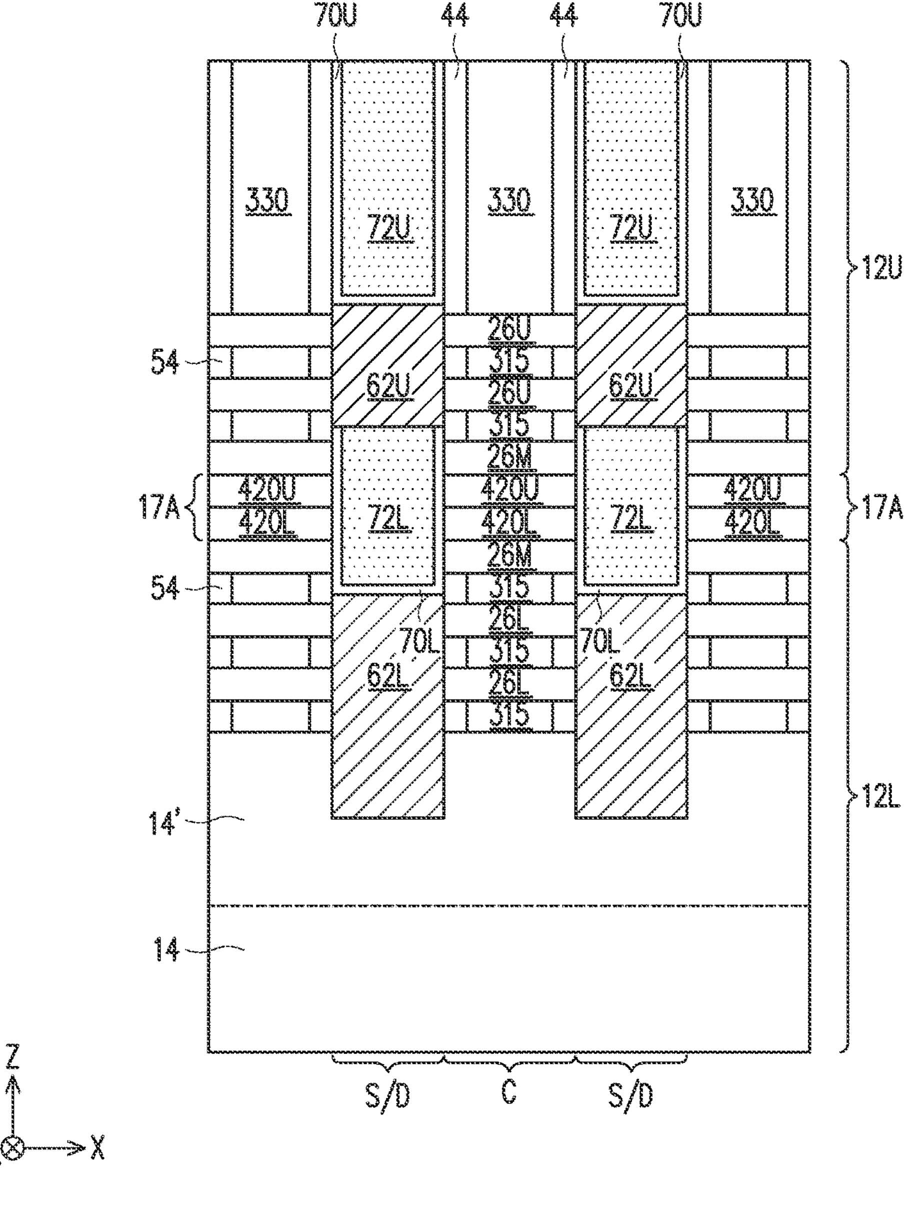
Figure 6I:
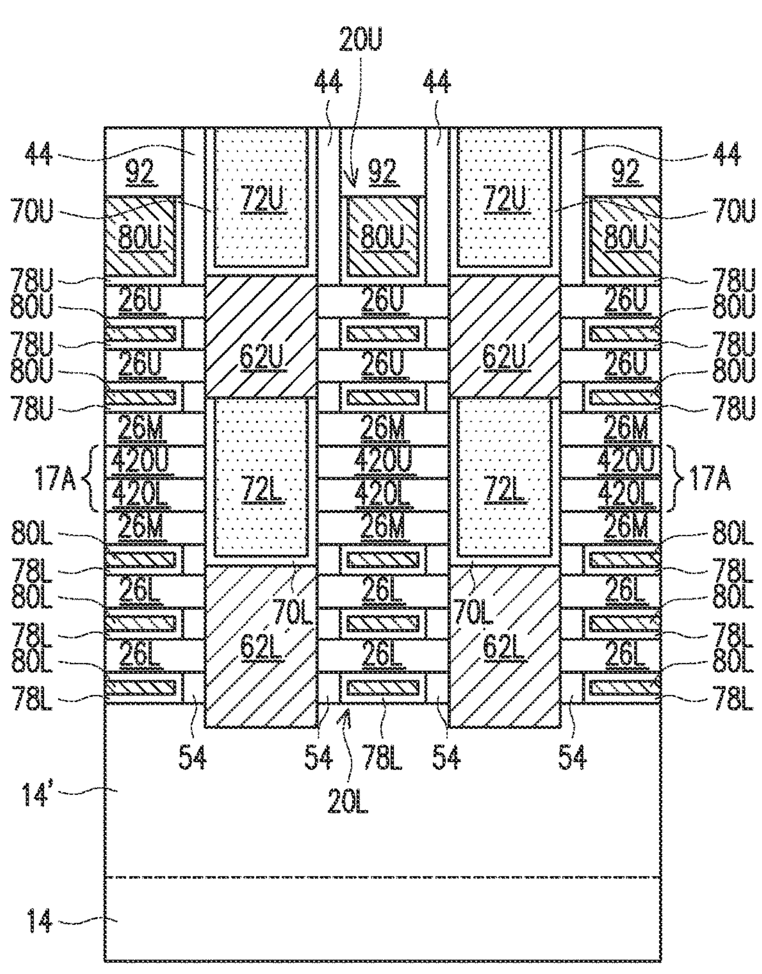
Figure 6I:
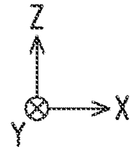

Referring to FIG. 6D, fabricating stacked device structure 10A includes removing substrate 14 (e.g., by a thinning process) and top semiconductor layer 315 from the device precursor of device 12U, such as described with reference to FIG. 5E. Referring to FIGS. 6E-6I, fabricating stacked device structure 10A includes processing the stacked device precursors to form device 12L and device 12U. For example, processing may include performing a fin fabrication process to form fins 326 extending from substrate 14 (FIG. 6E), such as described with reference to FIG. 5F. In the depicted embodiment, each of fins 326 include a substrate portion (e.g., a respective mesa 14'), a first semiconductor layer stack portion disposed over the substrate portion (e.g., a respective portion of semiconductor layer stack 310L), an isolation portion disposed over the first semiconductor layer stack portion (e.g., a respective portion of insulation/bonding layer 425), and a second semiconductor layer stack portion (e.g., a respective portion of semiconductor layer stack 310U) disposed over the isolation portion.

Processing the stacked device precursors may further include forming substrate isolation structures 328 in trenches between fins 326 (FIG. 6F), such as described with reference to FIG. 5G; forming dummy gate stacks 330 over portions of fins 326 (FIG. 6G), such as described with reference to FIG. 5H; forming gate spacers 40 along sidewalls of dummy gate stacks 330 (FIG. 6G), such as described with reference to FIG. 5H; and forming source/drain recesses 335 (FIG. 6G), such as described with reference to FIG. 5H. In the depicted embodiment, after forming source/drain recesses 335, each channel region includes an upper channel portion 340U (e.g., formed by a remainder of semiconductor layer stack 310U) and a lower channel portion 340L (e.g., formed by a remainder of semiconductor layer stack 310L) separated by a channel isolation structure (e.g., isolation structure 17A, which is formed by a remainder of insulation layer 425 (having insulation layer 420U and insulation layer 420L)).

Processing the stacked device precursors may further include forming inner spacers 54 under gate spacers 40 along sidewalls of semiconductor layers 315 (FIG. 6H), such as described with reference to FIG. 5I; forming epitaxial source/drain stacks (e.g., epitaxial source/drains 62L and epitaxial source/drains 62U separated by isolation structures 18) in source/drain recesses 335 (FIG. 6H), such as described with reference to FIG. 5I; and forming a dielectric layer (e.g., CESL 70U and ILD layer 72U) over the epitaxial source/drain stacks (FIG. 6H), such as described with reference to FIG. 5I; performing a gate replacement process to replace dummy gate stacks 330 with gates 90 (FIG. 6I), such as described with reference to FIG. 5J; and performing a channel release process to form suspended channel layers in channel regions (e.g., removing semiconductor layers 315, such that gates 90 (e.g., gates 90U/gates 90L) may wrap and/or surround respective semiconductor layers 26) (FIG. 6J), such as described with reference to FIG. 5J. In the depicted embodiment, isolation structure 16A, which separates and/or electrically isolates device 12L and device 12U, is provided by isolation structures 17A (i.e., channel isolation structures and/or gate isolation structures) and isolation structures 18 (i.e., source/drain isolation structures), isolation structures 17A are formed by insulation/bonding layer 425, and insulation/bonding layer 425 has a nitrogen-rich portion (e.g., insulation layer 420U) and an oxygen-rich portion (e.g., insulation layer 420L). In some embodiments, insulation/bonding layer 425 is disposed between and physically contacts semiconductor layers 26M, such as depicted. In some embodiments, where stacked device structure 10A does not include dummy semiconductor layers (e.g., semiconductor layers 26M), insulation/bonding layer 425 may be disposed between and physically contact gate 90U and gate 90L.

Figure 7:
FIG. 7 is a flow chart of a method for sequentially fabricating a stacked device structure, such as the stacked device structure of FIG. 1B, that implements the bonding methods of FIG. 2A and FIG. 3A, according to various aspects of the present disclosure.
Figure 7:
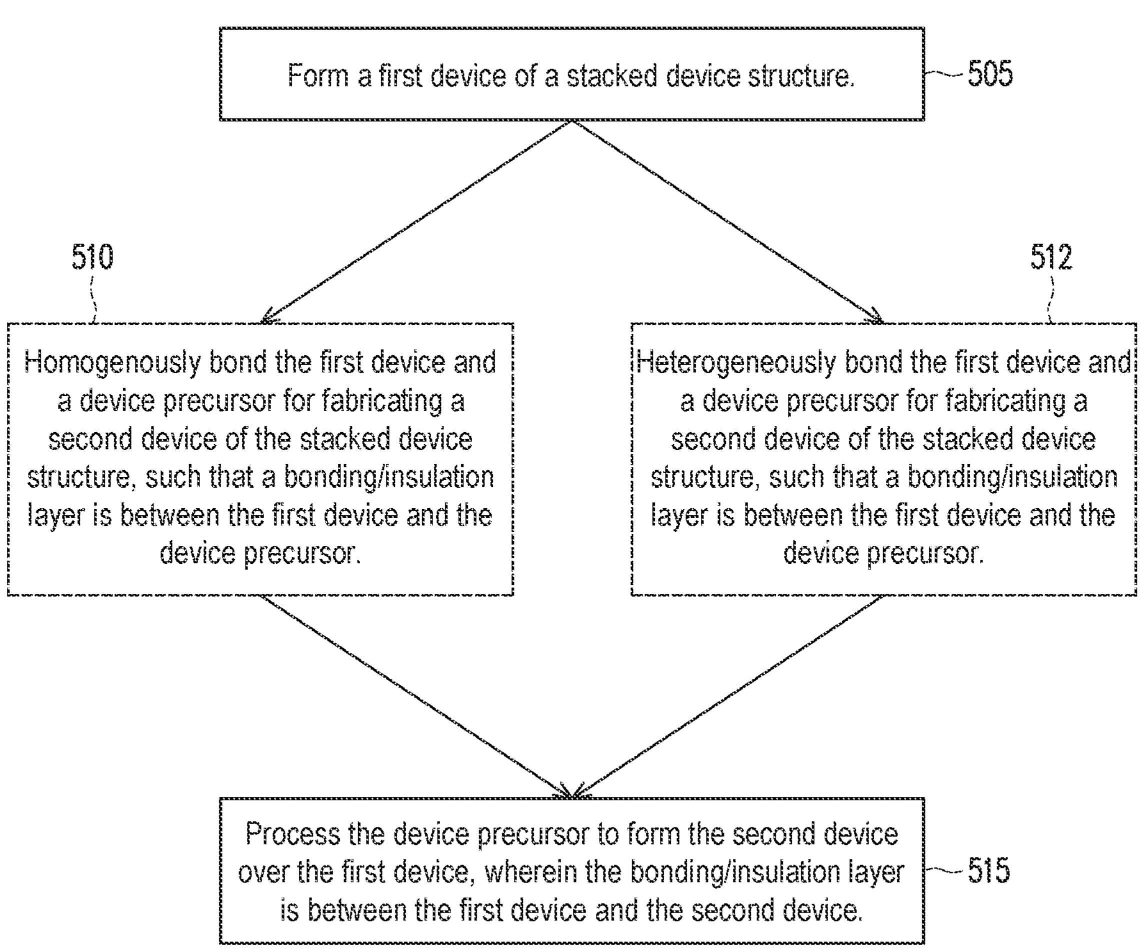

FIG. 7 is a flow chart of a method 500 for sequentially fabricating a stacked device structure, such as stacked device structure 10B of FIG. 1B, that implements the bonding methods of FIG. 2A and FIG. 3A, according to various aspects of the present disclosure. In FIG. 7, method 500 at block 505 includes forming a first device (e.g., device 12L) of a stacked device structure. Method 500 may proceed to block 510 or block 512. At block 510, method 500 includes homogenously bonding the first device and a device precursor for fabricating a second device (e.g., device 12U) of the stacked device structure. For example, method 100A of FIG. 2A is implemented at block 510 to homogenously bond the first device and the device precursor. At block 512, method 500 includes heterogeneously bonding the first device and the device precursor for fabricating the second device of the stacked device structure. For example, method 100B of FIG. 3A is implemented at block 512 to heterogeneously bond the first device and the device precursor. After bonding at block 510 and block 512, a bonding/insulation layer is between the first device and the device precursor. A configuration and/or a composition of the bonding/insulation layer provided at block 512 is different than a configuration and/or a composition of the bonding/insulation layer provided at block 510. From block 510 or block 512, method 500 may then proceed to processing the device precursor to form the second device over the first device. After processing, the bonding/insulation layer is between the first device and the second device and may provide isolation structure 17A or isolation structure 17B therebetween depending on which bonding technique (e.g., block 510 or block 512) is implemented when fabricating the stacked device structure. FIG. 7 has been simplified for the sake of clarity to better understand the inventive concepts of the present disclosure. Additional steps may be provided before, during, and after method 500, and some of the steps described may be moved, replaced, or eliminated for additional embodiments of method 500.

FIGS. 8A-8H are cross-sectional views of stacked device structure 10B, in portion or entirety, at various sequential fabrication stages, such as those associated with method 500 of FIG. 7 when implementing a homogenous bonding technique (e.g., block 510 of method 500), such as that described with reference to FIG. 2A and FIG. 2B, according to various aspects of the present disclosure. FIGS. 8A-8H have been simplified for the sake of clarity to better understand the inventive concepts of the present disclosure. Additional steps may be provided before, during, and after the sequential fabrication steps of FIGS. 8A-8H, and some of the steps described may be moved, replaced, or eliminated for additional embodiments of the sequential fabrication steps of FIGS. 8A-8H. Additional features may be added in stacked device structure 10B of FIGS. 8A-8H, and some of the features described below may be replaced, modified, or eliminated in other embodiments of stacked device structure 10B of FIGS. 8A-8H.

Figure 8A:
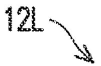
FIGS. 8A-8H are cross-sectional views of a stacked device structure, in portion or entirety, at various fabrication stages, such as those associated with the methods of FIG. 7, FIG. 2A, and FIG. 2B, according to various aspects of the present disclosure.
Figure 8A:
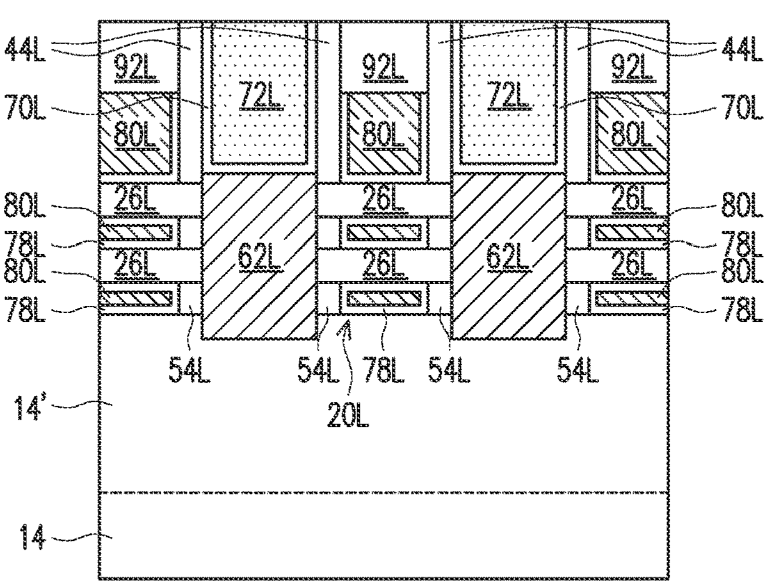
Figure 8A:
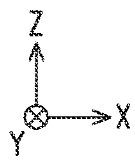

Referring to FIG. 8A, fabricating stacked device structure 10B includes forming device 12L. Forming device 12L may include forming a semiconductor layer stack over a respective substrate 14 and patterning the semiconductor layer stack (and, in some embodiments, substrate 14) to form a fin extending from substrate 14. The semiconductor layer stack may be similar to semiconductor layer stack 310L. For example, the semiconductor layer stack may include first semiconductor layers (e.g., semiconductor layers 26) and second semiconductor layers stacked vertically (e.g., along the z-direction) in an interleaving and/or alternating configuration from a top surface of substrate 14. The second semiconductor layers (e.g., silicon germanium layers) may be similar to semiconductor layers 315 described above with reference to FIG. 5A. The fin may be similar to fin 326. For example, the fin may include a patterned portion of semiconductor layer stack and a patterned portion of substrate 14 (i.e., mesa 14'), such as described above with reference to FIG. 5F (e.g., semiconductor layer stack 310L over mesa 14', respectively). In some embodiments, forming device 12L may include forming substrate isolation structures, such as substrate isolation structures 328, adjacent to and/or surrounding a lower portion of the fin, such as described above with reference to FIG. 5G.

Forming device 12L may further include forming gate structures over channel regions of the fin, forming source/drain recesses in source/drain regions of the fin, and forming inner spacers 54L. In some embodiments, forming the gate structures includes forming at least one dummy gate layer (e.g., a dummy gate dielectric, a dummy gate electrode, and a hard mask layer) over the fin, patterning the at least one dummy gate layer to form dummy gate stacks, and forming gate spacers 44L along sidewalls of the dummy gate stacks. The dummy gate stacks and gate spacers 44L may be similar to dummy gate stacks 330 and gate spacers 44, respectively, described above with reference to FIG. 5H. In some embodiments, forming the source/drain recesses may include performing an etching process that selectively removes the first semiconductor layers and the semiconductor layers relative to the gate structures. Remainders of the first semiconductor layers (e.g., semiconductor layers 26) of the fin form channel layers 26L in the channel regions, such as described below and above with reference to FIG. 5H. In some embodiments, forming inner spacers 54L includes laterally etching the second semiconductor layers to form gaps between the first semiconductor layers and between the first semiconductor layers and mesas 14' and at least partially filling the gaps with a dielectric material (e.g., deposit and etch a dielectric layer(s)), such as described above with reference to FIG. 5H.

Forming device 12L may further include forming epitaxial source/drains 62L in the source/drain recesses and forming a dielectric layer (e.g., CESL 70L and ILD layer 72L) over epitaxial source/drains 62L, such as described above with reference to FIG. 5I. Forming device 12L may further include performing a gate replacement process (i.e., replacing dummy gate stacks with gates 90L (e.g., having gate dielectric 78L and gate electrode 80L)) and performing a channel release process, such as described above with reference to FIG. 5J. In some embodiments, the gate replacement process includes removing the dummy gate stacks to form gate openings in the gate structures, depositing gate dielectric layers that partially fill the gate openings, depositing gate electrode layers that fill remainders of the gate openings, and performing a planarization process to remove portions of the gate dielectric layers and/or portions of the gate electrode layers over the dielectric layer. In some embodiments, the channel release process is performed before depositing the gate dielectric layers. The channel release process may include selectively removing the second semiconductor layers, thereby suspending the first semiconductor layers (e.g., semiconductor layers 26) over substrate 14 to provide channel/semiconductor layers 26L and forming gaps in the gate openings between semiconductor layers 26L and between semiconductor layers 26L and mesa 14'. The gate dielectric layers and/or the gate electrode layers fill the gaps, such that the gate dielectric layers and/or the gate electrode layers may form around semiconductor layers 26L. In some embodiments, forming device 12L may further include forming hard masks 92L (e.g., SAC structures) over gates 90L, such as described above with reference to FIG. 5J.

In some embodiments, fabrication of device 12L may further include forming interconnects, such as gate contacts and/or source/drain contacts, of device 12L. For example, source/drain contacts may be formed in the dielectric layer (e.g., ILD layer 72L and/or CESL 70L) on epitaxial source/drains 62L. Forming the source/drain contacts may include forming source/drain contact openings in the dielectric layer that expose epitaxial source/drains 62L and forming at least one electrically conductive layer (e.g., metal) in the source/drain contact openings. In some embodiments, forming the source/drain contact openings includes forming a patterned mask layer (e.g., an etch mask) over the dielectric layer and etching exposed portions of the dielectric layer. In some embodiments, forming at least one electrically conductive layer in the source/drain contact openings includes forming metal silicide layers over epitaxial source/drains 62L, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of the dielectric layer and/or the gate structures. A source/drain contact may thus include a metal silicide layer, a barrier/liner layer, and a bulk metal layer, where the barrier/liner layer is between the bulk metal layer and the dielectric layer (e.g., CESL 70L) and the bulk metal layer and the metal silicide layer. In some embodiments, one or more insulation layers may be formed in the source/drain contact openings and processed to form contact spacers, such as dielectric layers and/or air gaps, along sidewalls of electrically conductive portions of the source/drain contacts.

Figure 8B:
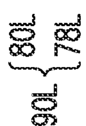
Figure 8B:
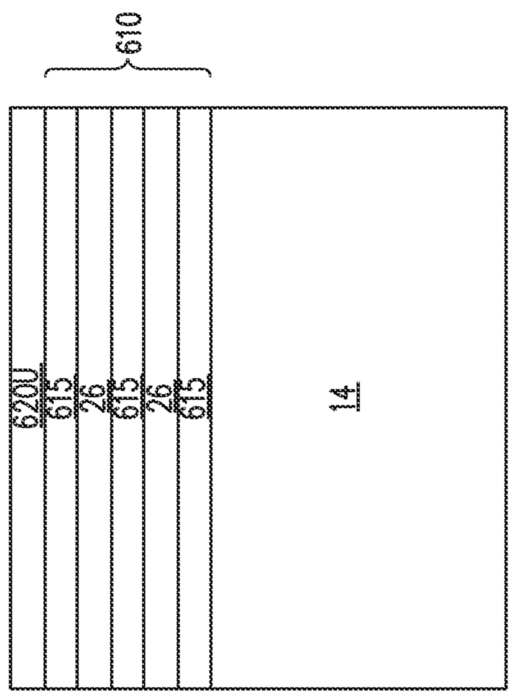
Figure 8B:
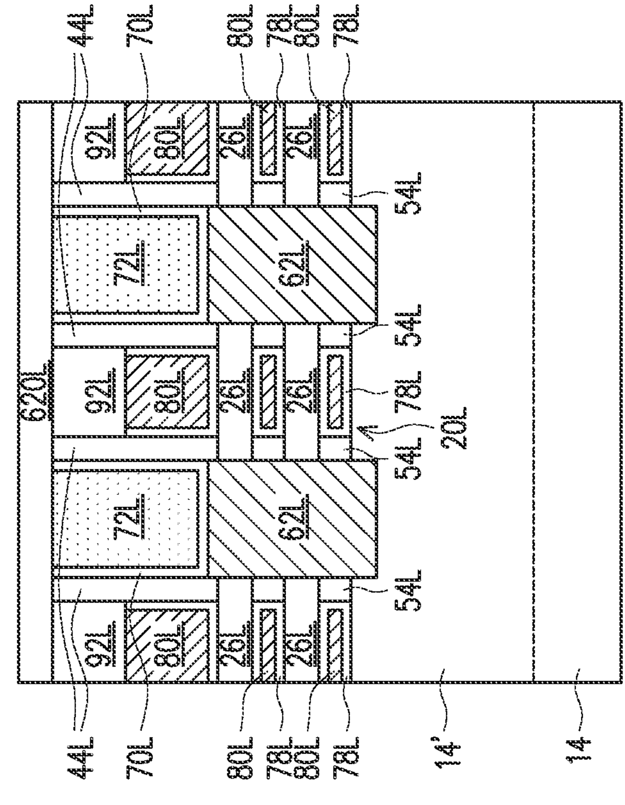
Figure 8B:
Figure 8B:
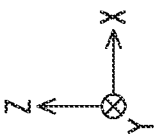
Figure 8C:
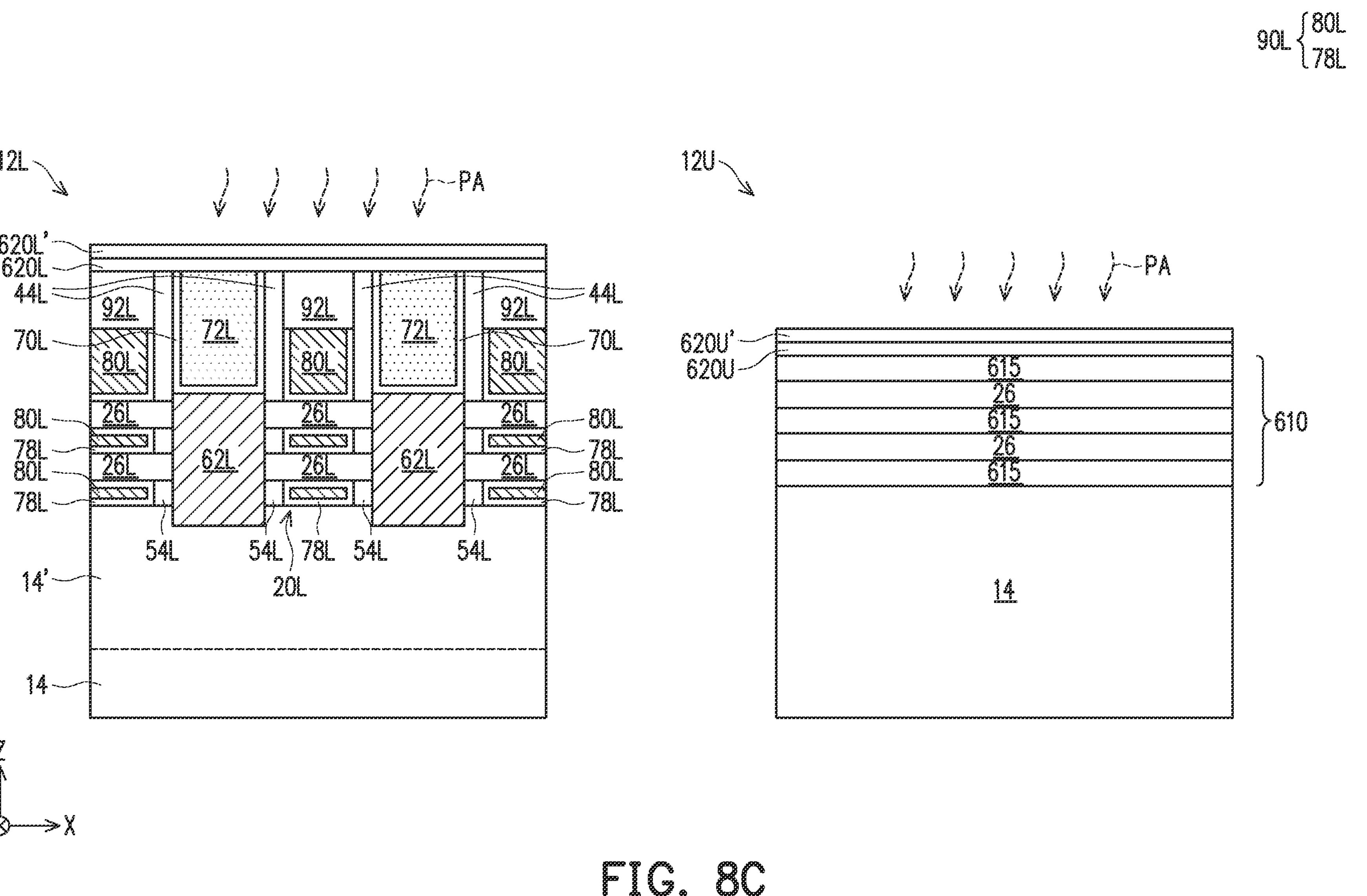
Figure 8D:
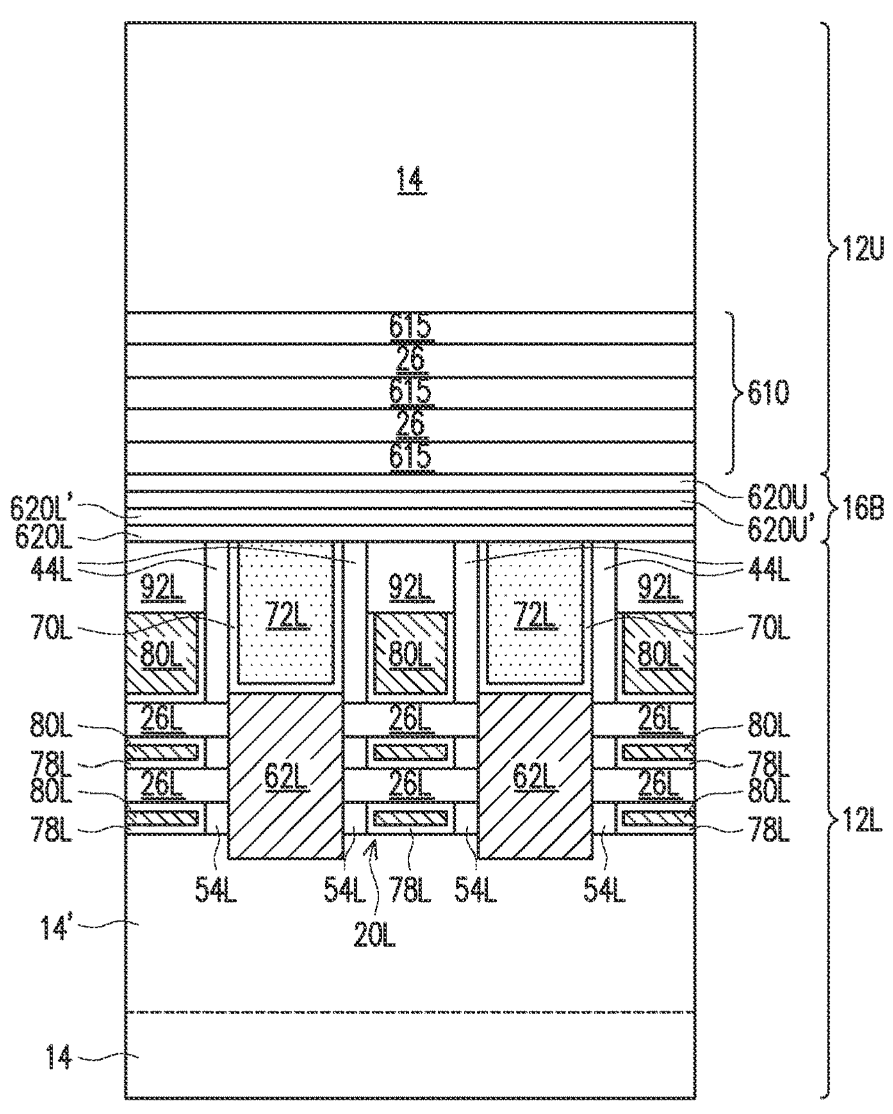
Figure 8D:
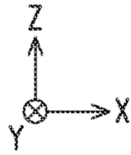

Referring to FIGS. 8B-8D, fabricating stacked device structure 10B includes homogenously bonding device 12L and a device precursor for device 12U. The device precursor for device 12U includes a semiconductor layer stack 610 disposed over a respective substrate 14. Semiconductor layer stack 610 includes semiconductor layers 26 and semiconductor layers 615 stacked vertically (e.g., along the z-direction) in an interleaving and/or alternating configuration from a top surface of substrate 14. Semiconductor layers 615 (e.g., silicon germanium layers) may be similar to semiconductor layers 315 described above with reference to FIG. 5A.

In FIG. 8B, an insulation/bonding layer 620L is formed over device 12L (e.g., over a top surface and/or a frontside thereof formed by hard masks 92L, CESL 70L, ILD layer 72L, and gate spacers 44), and an insulation/bonding layer 620U is formed over semiconductor layer stack 610 (e.g., over a top semiconductor layer 615 thereof, which forms a backside of device 12U). Insulation layer 620L and insulation layer 620U include a same material. Insulation layer 620L and insulation layer 620U may be similar to insulation layer I1 and insulation layer I2, respectively, described above with reference to FIG. 2A and FIG. 2B. For example, insulation layer 620L and insulation layer 620U may be silicon-and-nitrogen containing layers (e.g., SiN layers, SiON layers, SiCN layers, or SiOCN layers) or boron-and-nitrogen containing layers (e.g., BN layers or BCN layers). Insulation layer 620L and insulation layer 620U may have a thickness that is about 5 nm to about 25 nm. Insulation layer 620L and insulation layer 620U are formed by CVD, PECVD, ALD, PEALD, other suitable process, or a combination thereof.

In FIG. 8C, a shallow plasma activation process (PA) is performed on insulation layer 620L and insulation layer 620U. The shallow plasma activation process is similar to the plasma activation process described above with reference to FIG. 2A and FIG. 2B. For example, the shallow plasma activation process may modify characteristics of portions of insulation layer 620L and insulation layer 620U, thereby providing a plasma activated portion 620L' and a plasma activated portion 620U', respectively, each of which may have a thickness that is less than about 5 nm. Parameters of the shallow plasma activation process may be tuned to promote and/or enhance bonding between insulation layer 620L and insulation layer 620U by causing silanol groups to form on top, bonding surfaces thereof. The shallow plasma activation process may thus be a silanization process. In some embodiments, the shallow plasma activation process increases a concentration and/or a density of silanol groups at top, bonding surfaces of insulation layer 620L and insulation layer 620U. In some embodiments, the shallow plasma activation process is an oxygen plasma treatment that oxidizes portions of insulation layer 620L and insulation layer 620U, and plasma activated portion 620L' and plasma activated portion 620U' are oxidized portions thereof. In some embodiments, an atomic concentration of oxygen of plasma activated portion 620L' and plasma activated portion 620U' is greater than an atomic concentration of oxygen of insulation layer 620L and insulation layer 620U. In some embodiments, insulation layer 620L and insulation layer 620U include silicon and nitrogen, and plasma activated portion 620L' and plasma activated portion 620U' include silicon, nitrogen, oxygen, and hydrogen. In such embodiments, insulation layer 620L and insulation layer 620U may further include carbon and/or oxygen, plasma activated portion 620L' and plasma activated portion 620U' may further include carbon, and an amount of oxygen in insulation layer 620L and insulation layer 620U is less than an amount of oxygen in plasma activated portion 620L' and plasma activated portion 620U', respectively. In some embodiments, insulation layer 620L and insulation layer 620U include boron and nitrogen, and plasma activated portion 620L' and plasma activated portion 620U' include boron, nitrogen, oxygen, and hydrogen. In such embodiments, insulation layer 620L and insulation layer 620U may further include carbon and/or oxygen, and plasma activated portion 620L' and plasma activated portion 620U' may further include carbon. In some embodiments, a cleaning process (e.g., a DI rinse) is applied to plasma activated portion 620L' and/or plasma activated portion 620U'. In some embodiments, to improve silanization, the top, bonding surfaces may be pre-treated by a suitable process before the shallow plasma activation process. In some embodiments, a pre-treatment process may include increasing and/or forming hydroxyl (—OH) groups at the top, bonding surfaces.

In FIG. 8D, the device precursor of device 12U (e.g., a backside thereof) is attached and/or bonded to device 12L (e.g., a frontside thereof). The attaching/bonding may include flipping over the device precursor of device 12U, aligning the device precursor of device 12U with device 12L, and attaching the device precursor of device 12U to device 12L. For example, plasma activated portion 620U' is brought into contact with plasma activated portion 620L' (or vice versa) under a temperature, a pressure, an atmosphere, or a combination thereof for a time that effectuates bonding of plasma activated portion 620U' and plasma activated portion 620L'. Surface silanol groups of plasma activated portion 620U' and plasma activated portion 620L' enhance and/or improve bonding therebetween. After bonding, device 12L is attached to and electrically isolated from the device precursor of device 12U by an insulation/bonding layer 625, which includes insulation layer 620L, plasma activated portion 620L', insulation layer 620U, and plasma activated portion 620U'. Accordingly, at this stage of processing, insulation/bonding layer 625 provides isolation structure 16B of stacked device structure 10B, which electrically isolates and separates device 12L and device 12U. In some embodiments, a thickness of insulation/bonding layer 625 is about 10 nm to about 50 nm. In some embodiments, plasma activated portion 620U' and plasma activated portion 620L' are bonded using dielectric-to-dielectric bonding, such as an oxide-to-oxide bonding process that includes bonding an oxide portion of insulation layer 620U (e.g., plasma activated portion 620U') with an oxide portion of insulation layer 620L (e.g., plasma activated portion 620L'). In some embodiments, the bonding includes performing an annealing process or other suitable process to effectuate bonding of plasma activated portion 620U' and plasma activated portion 620L'.

Figure 8E:
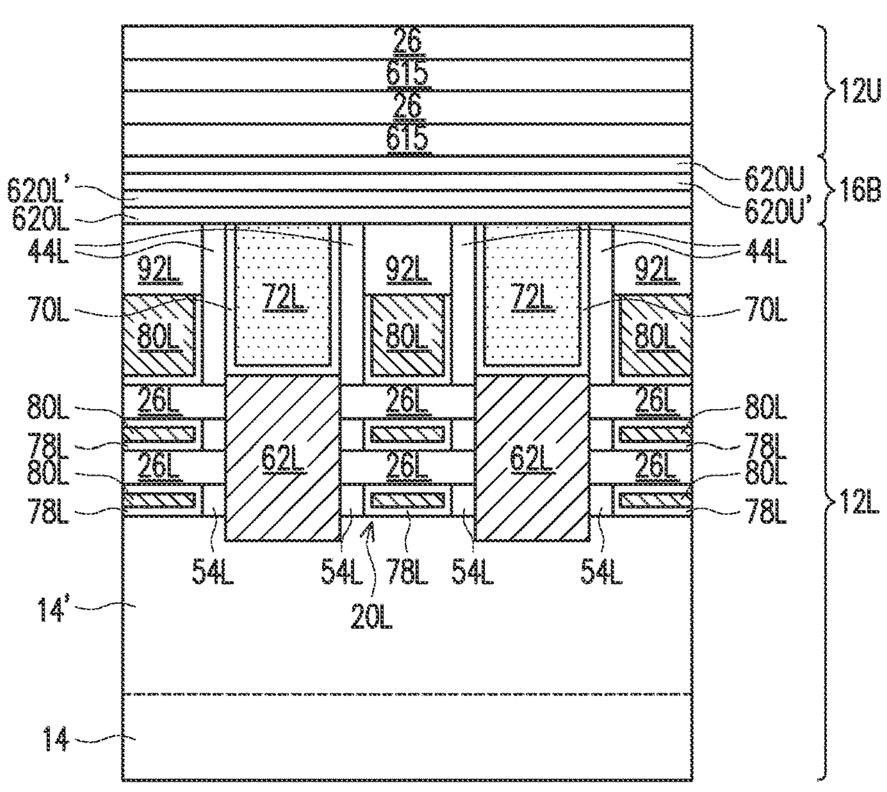
Figure 8E:
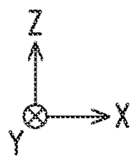
Figure 8F:
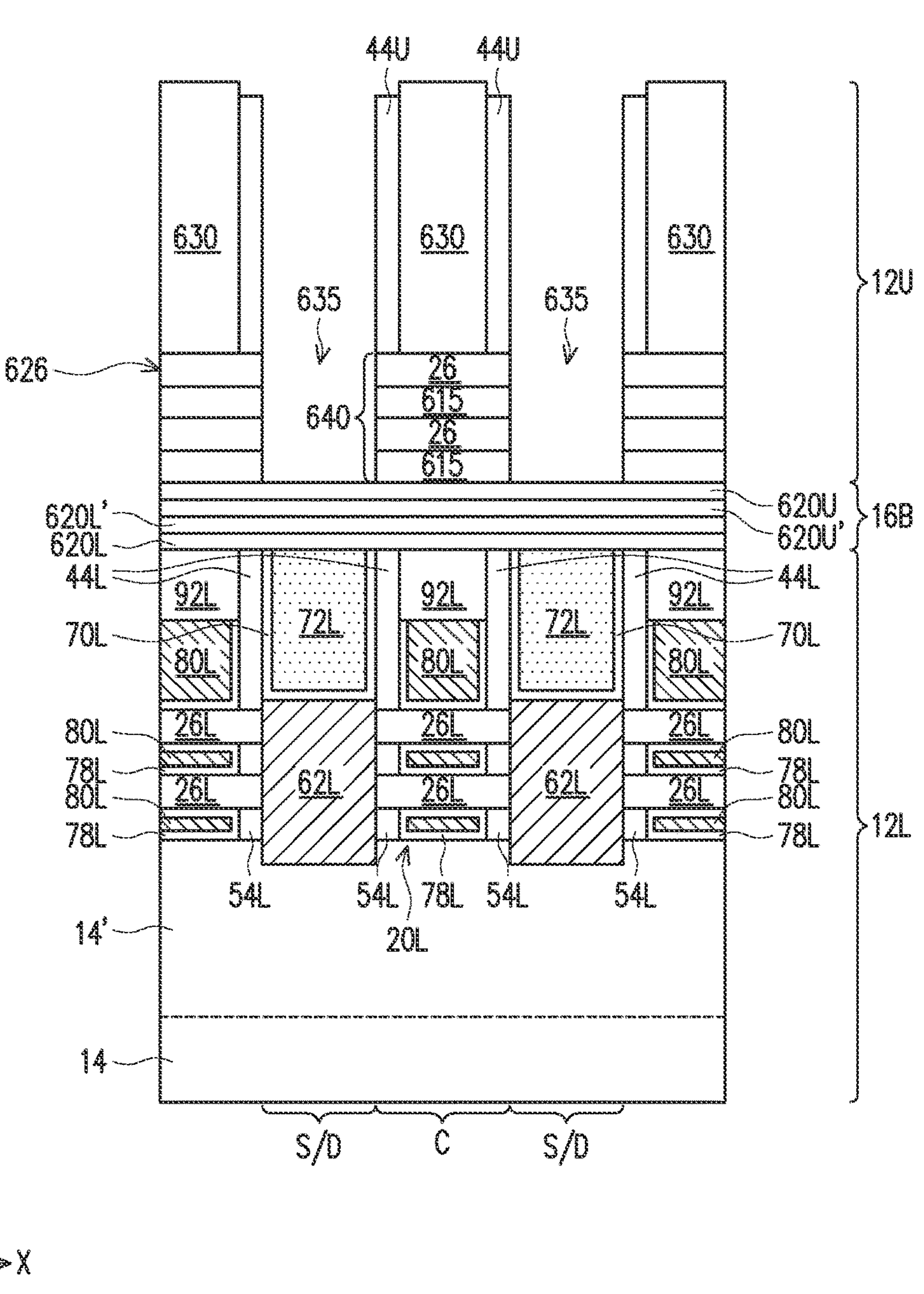
Figure 8G:
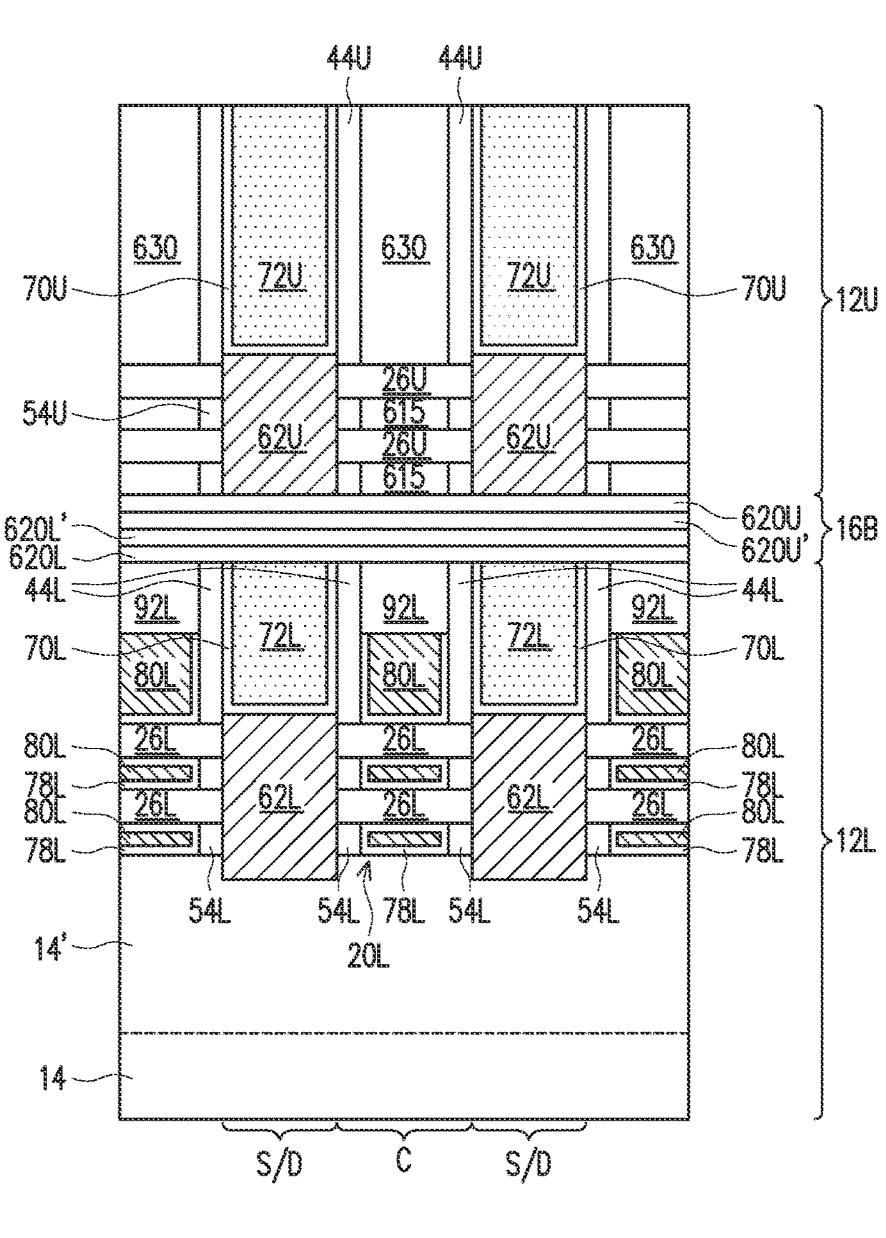
Figure 8G:
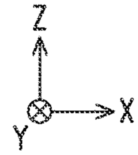
Figure 8H:
Figure 8H:
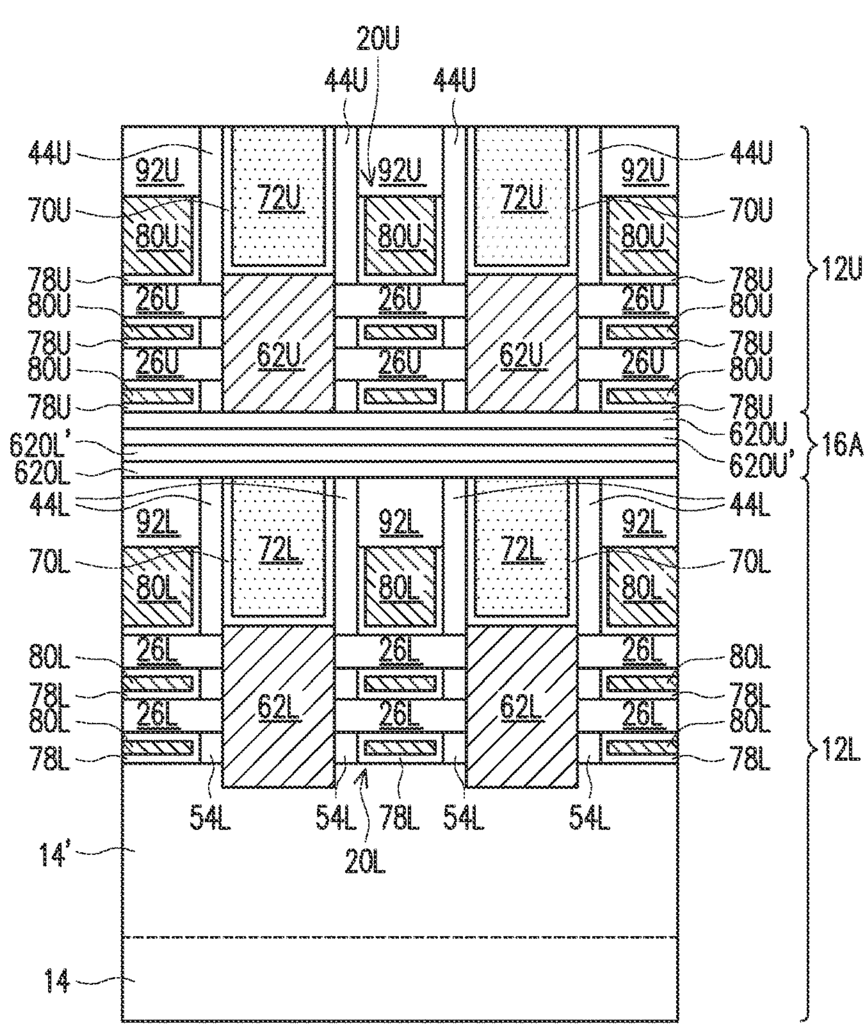
Figure 8H:
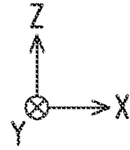

Referring to FIG. 8E, fabricating stacked device structure 10B includes removing substrate 14 and top semiconductor layer 615 from the device precursor of device 12U, such as described above with reference to FIG. 5E. Referring to FIGS. 8F-8H, fabricating stacked device structure 10B includes processing the device precursor to form device 12U. In FIG. 8F, processing the device precursor may include patterning semiconductor layer stack 610 to form fins 626 extending from isolation structure 16B, forming dummy gate stacks 630 over portions of fins 626, forming gate spacers 40 along sidewalls of dummy gate stacks 630, and forming source/drain recesses 635. Dummy gate stacks 630 extend lengthwise in a direction that is different than (e.g., orthogonal to) the lengthwise direction of fins 626. For example, dummy gate stacks 630 extend along the y-direction, having a length in the y-direction, a width in the x-direction, and a height in the z-direction. In the X-Z plane, dummy gate stacks 630 are disposed over tops of channel regions (C) of fins 626 and/or stacked device structure 10B, and dummy gate stacks 630 are disposed between source/drain regions (S/D) of fins 626 and/or stacked device structure 10B. In the Y-Z plane, dummy gate stacks 630 may be disposed on tops and sidewalls of fins 626, and dummy gate stacks 630 may wrap channel regions. Dummy gate stacks 630 may be similar to dummy gate stacks 330, such as described above with reference to FIG. 5H. For example, dummy gate stacks 630 may include a dummy gate dielectric, a dummy gate electrode, a hard mask, other suitable layers, or a combination thereof.

Source/drain recesses 635 may be formed by performing an etching process that removes semiconductor layer stack 610 in source/drain regions of fins 626, thereby exposing insulation/bonding layer 625 (e.g., insulation layer 620U thereof). Each source/drain recess 635 has respective sidewalls formed by respective remaining portions of semiconductor layer stack 610 in channel regions of fins 626 and a bottom formed by insulation layer 625. In the depicted embodiment, after forming source/drain recesses 635, each channel region has a channel portion 640 formed by a remainder of semiconductor layer stack 610. Channel portion 640 is separated from a channel portion/gate portion of device 12L by bonding/isolation layer 625. The etching process is a dry etch, a wet etch, other suitable etch, or a combination thereof. In some embodiments, the etching process is a multistep etch process.

In FIG. 8G, fabricating stacked device structure 10B may include forming inner spacers 54U under gate spacers 40 along sidewalls of semiconductor layers 615, such as described above with reference to FIG. 5I; forming epitaxial source/drains 62U in source/drain recesses 635, such as described above with reference to FIG. 5I; and forming a dielectric layer (e.g., CESL 70U and ILD layer 72U) over epitaxial source/drains 62U, such as described above with reference to FIG. 5I. Epitaxial source/drains 62U are disposed vertically over epitaxial source/drains 62L, and epitaxial source/drains 62U may be electrically isolated from epitaxial source/drains 62L and/or source/drain contacts thereto (such as source/drain contacts disposed in ILD layer 72L and/or CESL 70L, which may extend from bonding/isolation layer 625 to epitaxial source/drains 62L)) by bonding/insulation layer 625. Semiconductor layers 26 extending between epitaxial source/drains 62U may be referred to as upper semiconductor layers 26U. The dielectric layer may be formed by depositing CESL 70U over epitaxial source/ drains 62U, depositing ILD layer 72L over CESL 70L, and performing a planarization process, which may stop upon reaching the gate structures (e.g., dummy gate stacks 630).

In FIG. 8H, fabricating stacked device structure 10B may include performing a gate replacement process (i.e., replacing dummy gate stacks 630 with gates 90U (e.g., having gate dielectric 78U and gate electrode 80U)) and performing a channel release process, such as described above with reference to FIG. 5J. In some embodiments, the gate replacement process includes removing the dummy gate stacks to form gate openings in gate structures, depositing gate dielectric layers that partially fill the gate openings, depositing gate electrode layers that fill remainders of the gate openings, and performing a planarization process to remove portions of the gate dielectric layers and/or portions of the gate electrode layers over the dielectric layer. In some embodiments, the channel release process is performed before depositing the gate dielectric layers. The channel release process may include selectively removing semiconductor layers 615, thereby suspending semiconductor layers 26 over substrate 14 to provide channels for device 12U (which are designated as semiconductor layers 26U) and forming gaps in the gate openings between semiconductor layers 26U and between semiconductor layers 26U and isolation structure 16B. The gate dielectric layers and/or the gate electrode layers fill the gaps, such that the gate dielectric layers and/or the gate electrode layers may form around semiconductor layers 26U. In some embodiments, forming device 12U may further include forming hard masks 92U (e.g., SAC structures) over gates 90U, such as described above with reference to FIG. 5J. In some embodiments, fabricating stacked device structure 10B may further include forming interconnects, such as gate contacts and/or source/drain contacts, of device 12U. For example, source/drain contacts may be formed in the dielectric layer (e.g., ILD layer 72U and/or CESL 70U) on epitaxial source/drains 62U, such as described above with reference to FIG. 8A. In some embodiments, a source/drain via may be formed that electrically connects a respective epitaxial source/drain 62U and a respective epitaxial source/drain 62U. In such embodiments, the source/drain via may be physically and/or electrically connected to a first source/drain contact formed on the respective epitaxial source/drain 62U and a second source/drain contact formed on the respective epitaxial source/drain 62L.

In the depicted embodiment, isolation structure 16B is provided by isolation structure 17B, which separates and/or electrically isolates both channel regions and source/drain regions of device 12U and device 12L. For example, each channel region has two upper semiconductor layers 26U (upper channel layers) and two lower semiconductor layers 26M (lower channel layers) surrounded and/or wrapped by gate 90U and gate 90L, respectively, and gate 90U is separated and/or electrically isolated from gate 90L by isolation structure 17B. Semiconductor layers 26U are vertically stacked along the z-direction and provide two channels for transistor 20U through which current may flow between epitaxial source/drains 62U, and semiconductor layers 26L are vertically stacked along the z-direction and provide two channels for transistor 20L through which current may flow between epitaxial source/drains 62L. Further, epitaxial source/drains 62U may be separated and/or electrically isolated from epitaxial source/drains 62L and/or source/drain contacts thereto (such as source/drain contacts disposed in ILD layer 72L and/or CESL 70L, which may extend from bonding/isolation layer 625 to epitaxial source/drains 62L)) by isolation structure 17B. Isolation structure 17B is formed by insulation/bonding layer 625, which in the depicted embodiment, has an oxygen-rich, inner portion (e.g., plasma-activated portion 620U' and plasma activated portion 620L') disposed between nitrogen-rich, outer portions (e.g., insulation layer 620U and insulation layer 620L).

FIGS. 9A-9G are cross-sectional views of stacked device structure 10B, in portion or entirety, at various sequential fabrication stages, such as those associated with method 500 of FIG. 7 when implementing a heterogeneous bonding technique (e.g., block 512 of method 500), such as that described with reference to FIG. 3A and FIG. 3B, according to various aspects of the present disclosure. FIGS. 9A-9G have been simplified for the sake of clarity to better understand the inventive concepts of the present disclosure. Additional steps may be provided before, during, and after the sequential fabrication steps of FIGS. 9A-9G, and some of the steps described may be moved, replaced, or eliminated for additional embodiments of the sequential fabrication steps of FIGS. 9A-9G. Additional features may be added in stacked device structure 10B of FIGS. 9A-9G, and some of the features described below may be replaced, modified, or eliminated in other embodiments of stacked device structure 10B of FIGS. 9A-9G.

Figure 9A:
FIGS. 9A-9G are cross-sectional views of a stacked device structure, in portion or entirety, at various fabrication stages, such as those associated with the methods of FIG. 7, FIG. 3A, and FIG. 3B, according to various aspects of the present disclosure.
Figure 9A:
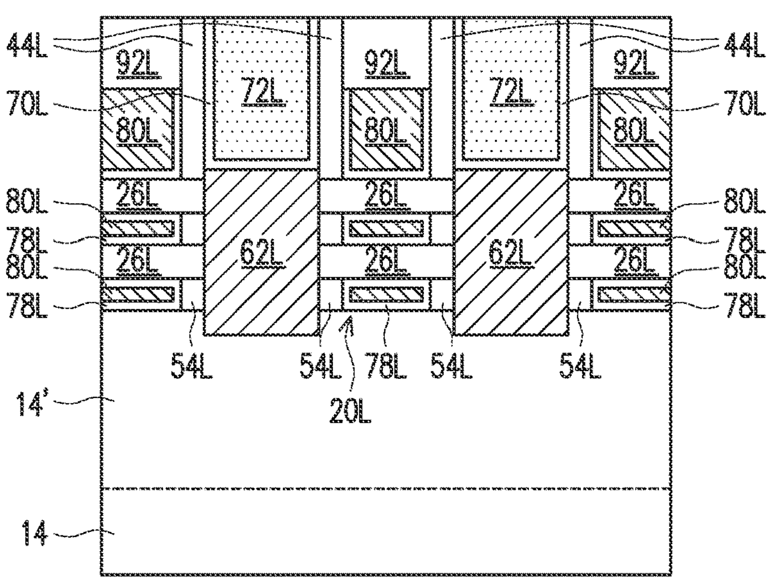
Figure 9A:
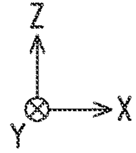
Figure 9B:
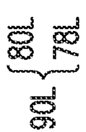
Figure 9B:
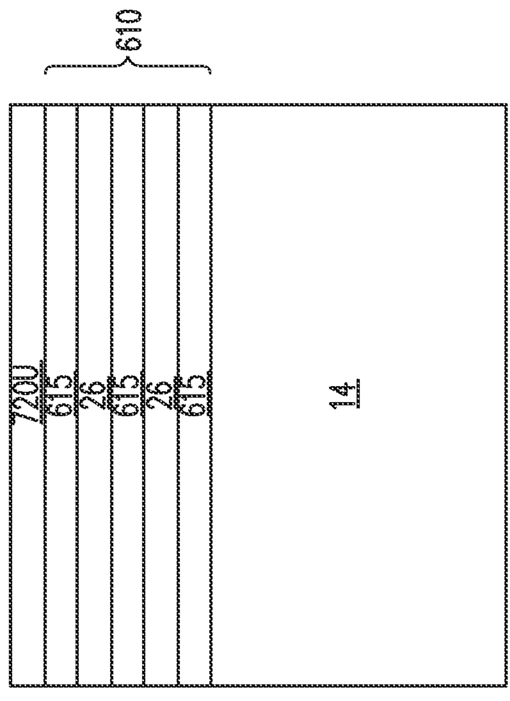
Figure 9B:
Figure 9B:
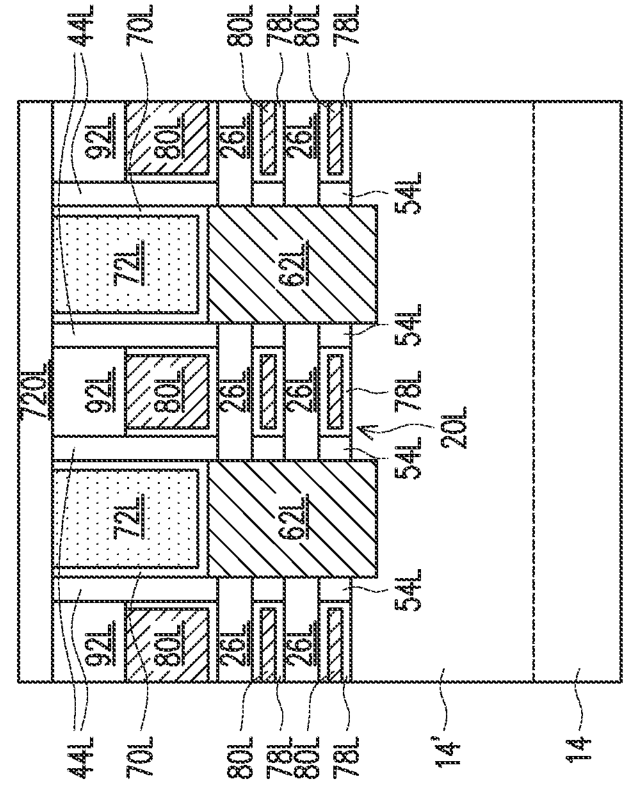
Figure 9B:
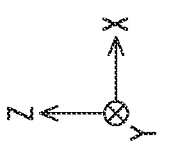
Figure 9C:
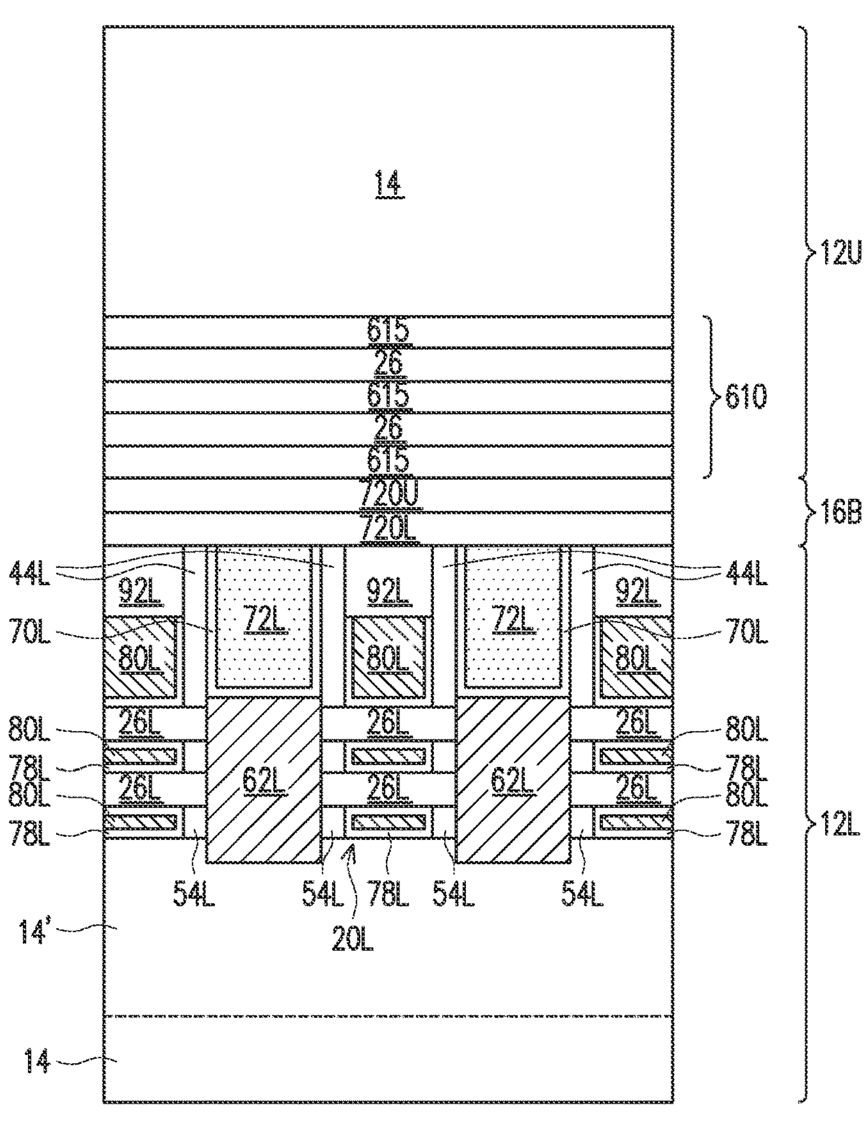
Figure 9C:
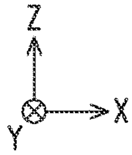

Referring to FIG. 9A, fabricating stacked device structure 10B includes forming device 12L, such as described above with reference to FIG. 8A. Referring to FIG. 9B and FIG. 9C, fabricating stacked device structure 10B further includes heterogeneously bonding, instead of homogenously bonding, device 12L and a device precursor for device 12U, which may include semiconductor layer stack 610 disposed over respective substrate 14, such as described above with reference to FIG. 8B. In FIG. 9B, an insulation/bonding layer 720L is formed over device 12L, and an insulation/bonding layer 720U is formed over semiconductor layer stack 610. Insulation layer 720L and insulation layer 720U include different materials. Insulation layer 720L and insulation layer 720U may be similar to insulation layer 13 and insulation layer 14, respectively, which are described above with reference to FIG. 3A and FIG. 3B. For example, insulation layer 720L may be an oxygen-containing layer (e.g., an oxide layer, such as a silicon oxide layer), and insulation layer 720U may be a silicon-and-nitrogen containing layer (e.g., an SiN layer, an SiON layer, or an SiCN layer). In some embodiments, insulation layer 720U may be a boron-and-nitrogen containing layer (e.g., a BN layer or a BCN layer). Insulation layer 720L and insulation layer 720U may have a thickness that is about 5 nm to about 25 nm. Insulation layer 720L and insulation layer 720U are formed by CVD, PECVD, ALD, PEALD, other suitable process, or a combination thereof.

In FIG. 9C, the device precursor of device 12U (e.g., a backside thereof) is attached and/or bonded to the device precursor of device 12L (e.g., a frontside thereof). The attaching/bonding may include flipping over the device precursor of device 12U, aligning the device precursor of device 12U with the device precursor of device 12L, and attaching the device precursor of device 12U to the device precursor of device 12L. For example, insulation layer 720U is brought into contact with insulation layer 720L (or vice versa) under a temperature, a pressure, an atmosphere, or a combination thereof for a time that effectuates bonding of insulation layer 720L and insulation layer 720U. Surface silanol groups of insulation layer 720L and/or insulation layer 720U enhance and/or improve bonding therebetween. After bonding, the device precursor of device 12L is attached to and electrically isolated from the device precursor of device 12U by an insulation/bonding layer 725.

Insulation/bonding layer 725 includes insulation layer 720L and insulation layer 720U, and insulation/bonding layer 725 provides isolation structure 16B of stacked device structure 10B, which electrically isolates and separates device 12L and device 12U. In some embodiments, a thickness of insulation/bonding layer 725 is about 10 nm to about 50 nm. In some embodiments, insulation layer 720L and insulation layer 720U are bonded using dielectric-to-dielectric bonding, such as an oxide-to-oxide bonding. In some embodiments, the bonding includes performing an annealing process or other suitable process to effectuate bonding of insulation layer 720L and insulation layer 720U.

Figure 9D:
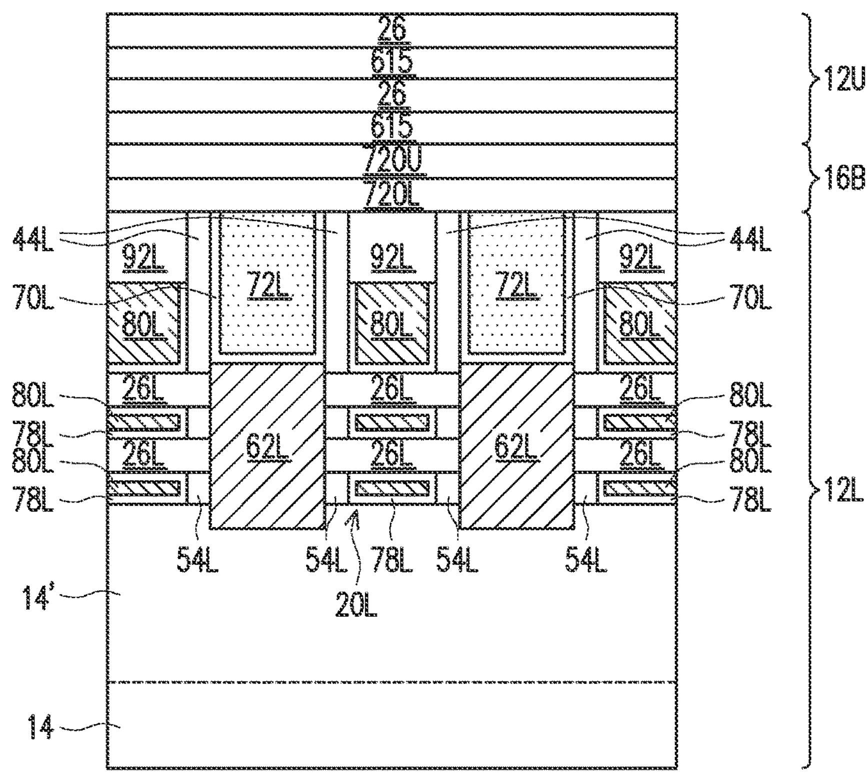
Figure 9D:
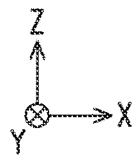
Figure 9E:
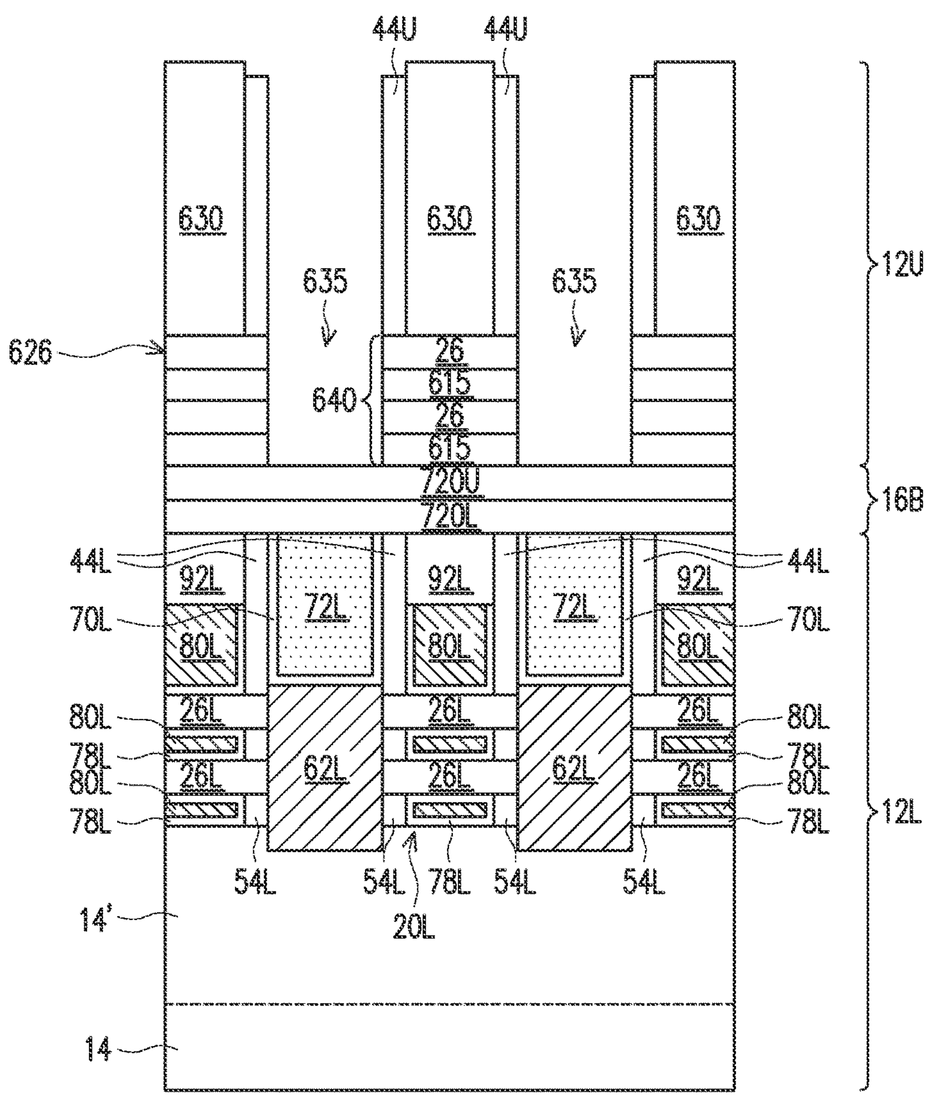
Figure 9E:
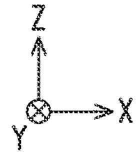
Figure 9F:
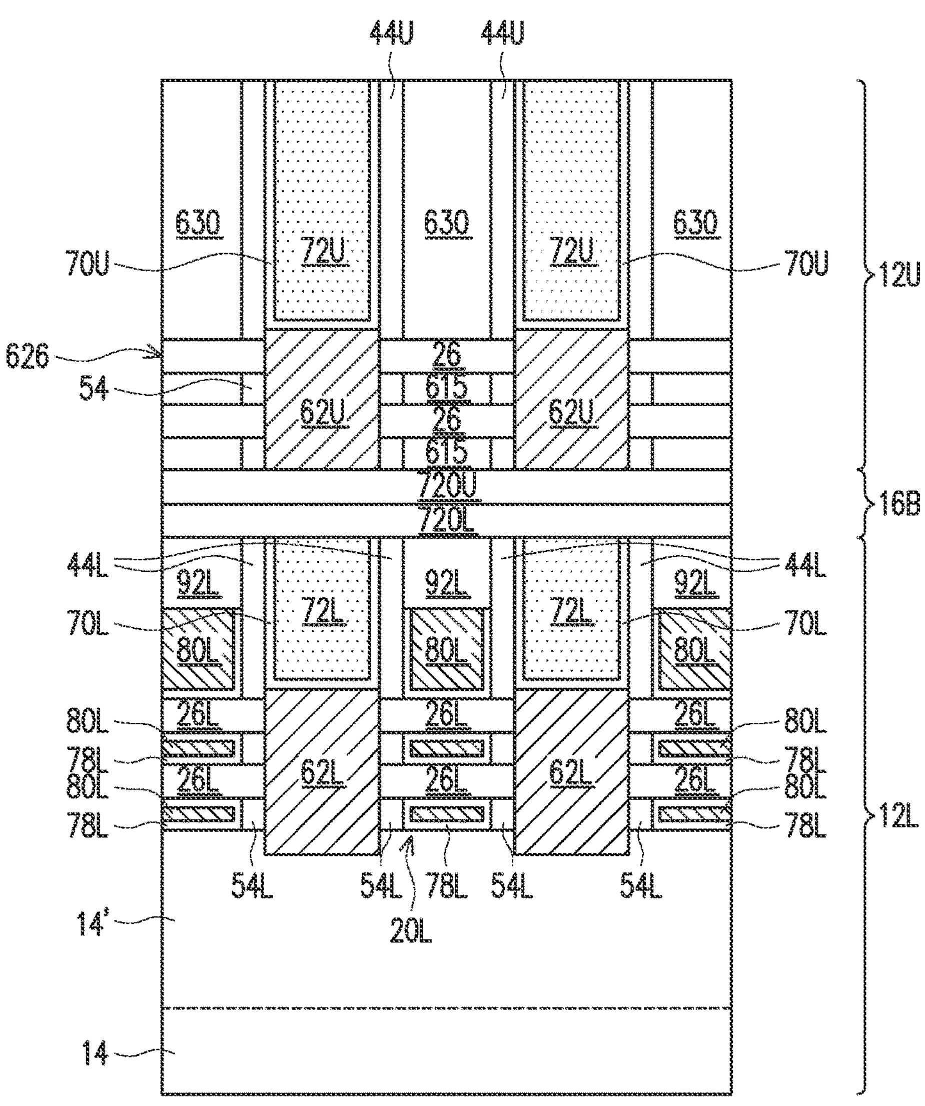
Figure 9F:
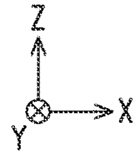
Figure 9G:
Figure 9G:
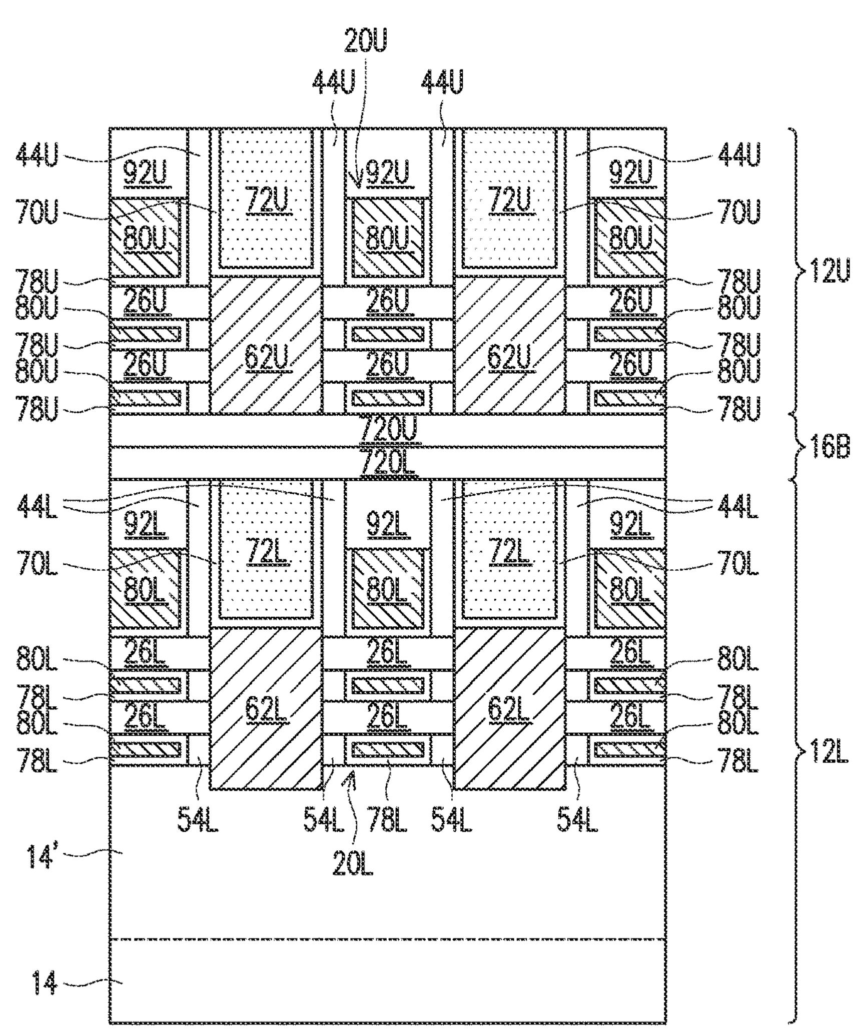
Figure 9G:
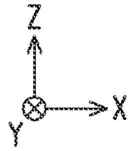

Referring to FIG. 9D, fabricating stacked device structure 10B includes removing substrate 14 (e.g., by a thinning process) and top semiconductor layer 615 from the device precursor of device 12U, such as described with reference to FIG. 5E. Referring to FIGS. 9E-9G, fabricating stacked device structure 10B includes processing the device precursor to form device 12U, such as described above with reference to FIGS. 8F-8H. In FIG. 9E, processing the device precursor may include patterning semiconductor layer stack 610 to form fins 626 extending from isolation structure 16B, forming dummy gate stacks 630 over portions of fins 626, forming gate spacers 40U along sidewalls of dummy gate stacks 630, and forming source/drain recesses 635, such as described above with reference to FIG. 8F. In FIG. 9F, processing the device precursor may include forming inner spacers 54U under gate spacers 40U along sidewalls of semiconductor layers 615, forming epitaxial source/drains 62U in source/drain recesses 635, and forming a dielectric layer (e.g., CESL 70U and ILD layer 72U) over epitaxial source/drains 62U, such as described above with reference to FIG. 8G. In FIG. 9G, processing the device precursor may include performing a gate replacement process (i.e., replacing dummy gate stacks 630 with gates 90U), performing a channel release process, forming hard masks 92U, and forming interconnects (e.g., source/drain contacts, gate contacts, source/drain vias, etc.), such as described above with reference to FIG. 8H.

Devices and/or structures described herein, such as stacked device structure 10A, stacked device structure 10B, device 12L, device 12U, transistor 20L, transistor 20U, etc. may be included in a microprocessor, a memory, other IC device, or a combination thereof. In some embodiments, devices and/or structures described herein, such as stacked device structure 10A, stacked device structure 10B, device 12L, device 12U, transistor 20L, transistor 20U, etc. described herein are a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other devices, or a combination thereof.

The present disclosure provides for many different embodiments. An exemplary method includes forming a first insulation layer of a first material on a first device component and forming a second insulation layer of a second material on a second device component. The second material is the same as the first material. The method further includes performing a plasma activation process on the first insulation layer and the second insulation layer to provide the first insulation layer with a first plasma-activated surface and the second insulation layer with a second plasma-activated surface. The method further includes bonding the first plasma-activated surface of the first insulation layer and the second plasma-activated surface of the second insulation layer to form a stacked structure that includes the first device component over the second device component. The first insulation layer bonded to the second insulation layer forms an isolation structure between the first device component and the second device component. The method further includes processing the stacked structure to form a first device disposed over a second device. The isolation structure separates the first device and the second device. In some embodiments, the method further includes cleaning the first plasma-activated surface of the first insulation layer and the second plasma-activated surface of the second insulation layer with a deionized water rinse before the bonding.

In some embodiments, the first material and the second material include silicon and nitrogen, and the plasma activation process is an oxygen plasma treatment. In some embodiments, the first material and the second material include boron and nitrogen, and the plasma activation process is an oxygen plasma treatment. In some embodiments, a thickness of the isolation structure is less than about 10 nm. In some embodiments, a thickness of the first insulation layer is less than about 5 nm. In some embodiments, a thickness of the second insulation layer is less than about 5 nm. In some embodiments, the first plasma-activated surface of the first insulation layer and the second plasma-activated surface of the second insulation layer are a first silanol surface and a second silanol surface, respectively. In some embodiments, the bonding the first plasma-activated surface of the first insulation layer to the second plasma-activated surface of the second insulation layer to form the stacked structure includes bringing the first plasma-activated surface of the first insulation layer and the second plasma-activated surface of the second insulation layer into contact and performing an anneal process.

In some embodiments, the first device component is a device precursor for fabricating the first device, the second device component is the second device, and the processing the stacked structure includes processing the device precursor to form the first device over the second device. In such embodiments, processing the device precursor includes forming source/drain recesses that expose the isolation structure, the isolation structure is between a first channel region of the first device and a second channel region of the second device, and the isolation structure is between first source/drain regions of the first device and second source/drain regions of the second device. In some embodiments, the first device component is a first device precursor for fabricating the first device and the second device component is a second device precursor for fabricating the second device, and processing the stacked structure includes processing the first device precursor and the second device precursor to form the first device over the second device, respectively. In such embodiments, processing the first device precursor and the second device precursor includes forming source/drain recesses that extend through the isolation structure, and the isolation structure is between a first channel region of the first device and a second channel region of the second device.

Another exemplary method includes forming a first insulation layer of a first material on a first device component and forming a second insulation layer of a second material on a second device component. The second material is different than the first material. The method further includes bonding the first insulation layer and the second insulation layer to form a stacked structure that includes the first device component over the second device component. The first insulation layer bonded to the second insulation layer forms an isolation structure between the first device component and the second device component. The method further includes processing the stacked structure to form a first device disposed over a second device. The isolation structure separates the first device and the second device.

In some embodiments, the first material includes silicon and nitrogen, and the second material includes oxygen. In some embodiments, a thickness of the isolation structure is less than about 10 nm. In some embodiments, a thickness of the first insulation layer is less than about 5 nm. In some embodiments, a thickness of the second insulation layer is less than about 5 nm. In some embodiments, the bonding the first insulation layer and the second insulation layer to form the stacked structure includes bringing the first insulation layer and the second insulation layer into contact and performing an anneal process.

In some embodiments, the first device component is a device precursor for fabricating the first device, the second device component is the second device, and the processing the stacked structure includes processing the device precursor to form the first device over the second device. In such embodiments, processing the device precursor includes forming source/drain recesses that expose the isolation structure, the isolation structure is between a first channel region of the first device and a second channel region of the second device, and the isolation structure is between first source/drain regions of the first device and second source/drain regions of the second device. In some embodiments, the first device component is a first device precursor for fabricating the first device and the second device component is a second device precursor for fabricating the second device, and processing the stacked structure includes processing the first device precursor and the second device precursor to form the first device over the second device, respectively. In such embodiments, processing the first device precursor and the second device precursor includes forming source/drain recesses that extend through the isolation structure, and the isolation structure is between a first channel region of the first device and a second channel region of the second device.

An exemplary stacked device structure includes a transistor stack having a first transistor disposed over a second transistor. The first transistor has first semiconductor layers, a first gate stack, and first source/drains. The first semiconductor layers are disposed between the first source/drains, the first gate stack is disposed between the first source/drains, and the first gate stack wraps the first semiconductor layers. The second transistor has second semiconductor layers, a second gate stack, and second source/drains. The second semiconductor layers are disposed between the second source/drains, the second gate stack is disposed between the second source/drains, and the second gate stack wraps the second semiconductor layers. The first source/drains are disposed over the second source/drains, and the first gate stack is disposed over the second gate stack. The stacked device structure further includes a bonding layer disposed between the first gate stack and the second gate stack. The bonding layer has a first portion having a first composition and a second portion having a second composition. The second composition is different than the first composition. In some embodiments, the first semiconductor layers and the second semiconductor layers include a same material (e.g., both silicon). In some embodiments, the first semiconductor layers and the second semiconductor layers include different semiconductor materials (e.g., silicon and silicon germanium, respectively, or silicon and germanium, respectively).

In some embodiments, the first portion of the bonding layer is a first silicon-and-nitrogen-containing layer and a second silicon-and-nitrogen-containing layer, and the second portion of the bonding layer is an oxygen-containing layer. In such embodiments, the oxygen-containing layer may be disposed between the first silicon-and-nitrogen-containing layer and the second silicon-and-nitrogen-containing layer. In some embodiments, the first portion of the bonding layer is a first boron-and-nitrogen-containing layer and a second boron-and-nitrogen-containing layer, and the second portion of the bonding layer is an oxygen-containing layer. In such embodiments, the oxygen-containing layer may be disposed between the first boron-and-nitrogen-containing layer and the second boron-and-nitrogen-containing layer. In some embodiments, the first portion is a nitrogen-containing layer, and the second portion is an oxygen-containing layer. In some embodiments, a thickness of the bonding layer is less than about 10 nm. In some embodiments, a thickness of the first portion is less than about 5 nm. In some embodiments, a thickness of the second portion is less than about 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked device structure, comprising:

a transistor stack having a first transistor disposed over a second transistor, wherein:

the first transistor has first semiconductor layers, a first gate stack, and first source/drains, wherein the first semiconductor layers are disposed between the first source/drains, the first gate stack is disposed between the first source/drains, and the first gate stack wraps the first semiconductor layers, the second transistor has second semiconductor layers, a second gate stack, and second source/drains, wherein the second semiconductor layers are disposed between the second source/drains, the second gate stack is disposed between the second source/drains, and the second gate stack wraps the second semiconductor layers, and the first source/drains are disposed over the second source/drains and the first gate stack is disposed over the second gate stack; and a bonding layer disposed between the first gate stack and the second gate stack, wherein the bonding layer has a first portion having a first composition and a second portion having a second composition that is different than the first composition.

2. The stacked device structure of claim 1, wherein:

the first portion of the bonding layer is a first silicon-and-nitrogen-containing layer and a second silicon-and-nitrogen-containing layer; and the second portion of the bonding layer is an oxygen-containing layer, wherein the oxygen-containing layer is disposed between the first silicon-and-nitrogen-containing layer and the second silicon-and-nitrogen-containing layer.

3. The stacked device structure of claim 1, wherein:

the first portion of the bonding layer is a first boron-and-nitrogen-containing layer and a second boron-and-nitrogen-containing layer; and the second portion of the bonding layer is an oxygen-containing layer, wherein the oxygen-containing layer is disposed between the first boron-and-nitrogen-containing layer and the second boron-and-nitrogen-containing layer.

4. The stacked device structure of claim 1, wherein:

the first portion is a nitrogen-containing layer; and the second portion is an oxygen-containing layer.

5. The stacked device structure of claim 1, wherein a thickness of the bonding layer is less than about 10 nm, a thickness of the first portion is less than about 5 nm, and a thickness of the second portion is less than about 5 nm.

6. The stacked device structure of claim 2, wherein:

the first silicon-and-nitrogen-containing layer includes carbon; and the second silicon-and-nitrogen-containing layer includes carbon.

7. The stacked device structure of claim 3, wherein:

the first boron-and-nitrogen-containing layer includes carbon; and the second boron-and-nitrogen-containing layer includes carbon.

8. A stacked device structure comprising:

a gate stack that includes a first gate disposed over a second gate, wherein the first gate engages a first channel layer and the second gate engages a second channel layer;

a first source/drain stack and a second source/drain stack, wherein the gate stack is disposed between the first source/drain stack and the second source/drain stack, the first source/drain stack includes a first source/drain disposed over a second source/drain, the second source/drain stack includes a third source/drain disposed over a fourth source/drain, the first channel layer is disposed between the first source/drain and the third source/drain, and the second channel layer is disposed between the second source/drain and the fourth source/drain;

wherein the gate stack further includes a gate isolation structure disposed between the first gate and the second gate, wherein the gate isolation structure includes a first insulation layer having a first composition and a second insulation layer having a second composition, wherein the second composition is different than the first composition; and wherein the first source/drain stack further includes a first source/drain isolation structure disposed between the first source/drain and the second source/drain and the second source/drain stack further includes a second source/drain isolation structure disposed between the third source/drain and the fourth source/drain, and the gate isolation structure is disposed between the first source/drain isolation structure and the second source/drain isolation structure.

9. The stacked device structure of claim 8, wherein the first insulation layer is a nitride layer, and the second insulation layer is an oxide layer.

10. The stacked device structure of claim 9, wherein the nitride layer includes a first silicon nitride layer and a second silicon nitride layer, and the oxide layer is disposed between the first silicon nitride layer and the second silicon nitride layer.

11. The stacked device structure of claim 9, wherein the nitride layer includes a first boron nitride layer and a second boron nitride layer, and the oxide layer is disposed between the first boron nitride layer and the second boron nitride layer.

12. The stacked device structure of claim 8, wherein a first semiconductor layer is disposed between the first gate and the gate isolation structure, and a second semiconductor layer is disposed between the second gate and the gate isolation structure.

13. The stacked device structure of claim 8, wherein a thickness of the gate isolation structure is less than about 10 nm, a thickness of the first insulation layer is less than about 5 nm, and a thickness of the second insulation layer is less than about 5 nm.

14. The stacked device structure of claim 8, wherein each of the first source/drain isolation structure and the second source/drain isolation structure include a contact etch stop layer and an interlayer dielectric layer.

15. A stacked device structure comprising:

a first transistor having a first semiconductor layer and a first gate, wherein the first gate is disposed over a top and a bottom of the first semiconductor layer;

a second transistor having a second semiconductor layer and a second gate, wherein the second gate is disposed over a top and a bottom of the second semiconductor layer, wherein the first gate is disposed over the second gate; and a gate isolation structure disposed between the first gate and the second gate, wherein the gate isolation structure includes a nitride portion and an oxide portion.

16. The stacked device structure of claim 15, wherein the nitride portion includes a first silicon nitride layer and a second silicon nitride layer, and the oxide portion is disposed between the first silicon nitride layer and the second silicon nitride layer.

17. The stacked device structure of claim 15, wherein the nitride portion includes a first boron nitride layer and a second boron nitride layer, and the oxide portion is disposed between the first boron nitride layer and the second boron nitride layer.

18. The stacked device structure of claim 15, wherein:

the nitride portion is a silicon nitride layer;

the oxide portion is an oxide layer; and the silicon nitride layer and the oxide layer extend between a first source/drain isolation structure and a second source/drain isolation structure.

19. The stacked device structure of claim 18, wherein the first source/drain isolation structure includes a first interlayer dielectric layer, and the second source/drain isolation structure includes a second interlayer dielectric layer.

20. The stacked device structure of claim 15, wherein:

the first transistor further has a third semiconductor layer, wherein the third semiconductor layer is disposed between the first gate and the gate isolation structure; and the second transistor further has a fourth semiconductor layer, wherein the fourth semiconductor layer is disposed between the second gate and the gate isolation structure.

* * * * *